United States Patent
Kouzuma

(10) Patent No.: US 7,019,559 B2
(45) Date of Patent: Mar. 28, 2006

(54) LEVEL SHIFT CIRCUIT

(75) Inventor: Shinichi Kouzuma, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/792,087

(22) Filed: Mar. 4, 2004

(65) Prior Publication Data

US 2004/0169542 A1 Sep. 2, 2004

Related U.S. Application Data

(62) Division of application No. 10/073,022, filed on Feb. 12, 2002, now abandoned.

(30) Foreign Application Priority Data

May 23, 2001 (JP) .............................. 2001-153666

(51) Int. Cl.
*A03K 19/0175* (2006.01)
(52) U.S. Cl. .............................. 326/87; 326/80; 326/68
(58) Field of Classification Search .................. 326/68, 326/80, 81; 327/333
See application file for complete search history.

(56) References Cited

U.S. PATENT DOCUMENTS

| 5,781,026 A | 7/1998 | Chow |
| 6,020,762 A | 2/2000 | Wilford |
| 6,542,144 B1* | 4/2003 | Kogure et al. ................ 345/98 |

* cited by examiner

*Primary Examiner*—Anh Q. Tran
(74) *Attorney, Agent, or Firm*—Volentine Francos & Whitt, PLLC

(57) ABSTRACT

A level shift circuit including a first transistor circuit connected between a power supply line and a first node, a second transistor circuit connected between the power supply line and a second node, a first transistor connected between the ground line and the first node, and a second transistor connected between the ground line and the second node. A gate of the first transistor circuit is connected to the second node, and a gate of the second transistor circuit is connected to the first node. An input signal is supplied to a gate of the first transistor and an inverted value of the input signal is supplied to a gate of the second transistor. Additionally, control transistors switch a ratio of inflow current and emission current of the first node or the second node according to a control signal.

1 Claim, 12 Drawing Sheets

LEVEL SHIFT CIRCUIT

CROSS REFERENCE TO RELATED APPLICATIONS

This is a divisional application of application Ser. No. 10/073,022, filed Feb. 12, 2002 is now abandoned, which is hereby incorporated by reference in its entirety for all purposes.

BACKGROUND OF THE INVENTION

1. Field of the Invention

The present invention relates to a level shift circuit used for a semiconductor integrated circuit for example, and more particularly to a technology to increase the speed of operation of the level shift circuit.

2. Description of Related Art

In some cases a plurality of types of circuits are installed on one electronic equipment or on one circuit board. In such a case, signals are transmitted/received between each circuit. In the case of digital signals, two types of values, that is, low level or high level, are transmitted/received. The value of low level is often zero volts. And the value of high level is for example 1.5 volts, 3 volts and 5 volts. In some cases circuits with different high level values coexist on one electronic equipment or on one circuit board. Given such cases, a circuit at the transmission side or a circuit at the reception side must convert the high level values. If the high levels are not converted, the circuit at the reception side may recognize a high level as a low level in error.

A level shift circuit is a circuit for converting the high level voltage of digital signals. For example, signals where the high level is 1.5 volts and the low level is zero volts can be converted into signals where the high level is 3 volts and the low level is zero volts by the level shift circuit.

The level shift circuit is required to have a sufficient voltage shift amount. For example, 1.5 volt input signals must be converted to 3 volts, 5 volts or a higher voltage.

Recently the demand for high-speed operation of a circuit is strong. Therefore it is also demanded that the level shift circuit be designed so as to operate at high-speed.

Also recently the demand for the low power consumption of circuits is strong. Therefore it is also demanded that the level shift circuit be configured so as to decrease power consumption.

SUMMARY OF THE INVENTION

It is an object of the present invention to provide a level shift circuit which has a large voltage shift amount, fast operation speed, and low power consumption.

To achieve this, a level shift circuit according to the present invention comprises: a first transistor circuit which connects a first node and a first power supply line when a second node is at a second power supply potential, and does not connect these when the second node is at the first power supply potential; a second transistor circuit which connects the second node and the first power supply line when the first node is at a second power supply potential, and does not connect these when the first node is at the first power supply potential; a third transistor circuit which connects the first node and the second power supply line when an input signal is at a first input potential, and does not connect these when the input signal is at a second input potential; a fourth transistor circuit which connects the second node and the second power supply line when the input signal is at the second input potential, and does not connect these when the input signal is at the first input potential; and a fifth transistor circuit which switches the ratio of the inflow current or the emission current of the first node or the second node according to the control signal when the second node or the first node is connected to both the first power supply line and the second power supply line.

According to the present invention, the fifth transistor circuit is installed, so the ratio of the inflow current and the emission current of the first node or the second node can be switched according to the control signal. By this, the operation speed can be increased by setting this ratio to high, and the voltage shift amount can be increased by setting this ratio to low. Additionally, according to the present invention, the operation speed can be increased without making the current capabilities of the third transistor circuit and the fourth transistor circuit extremely high, so power consumption is low.

BRIEF DESCRIPTION OF THE DRAWINGS

Other objects and advantages of the present invention will now be described with reference to the accompanying drawings.

DESCRIPTION OF THE PREFERRED EMBODIMENTS

Embodiments of the present invention will now be described with reference to the accompanying drawings. The size, shape and positional relationships of each composing element in these drawings are general enough to aide in understanding the present invention, and the numerical conditions described below are only examples.

Related Art

Figure 12A:
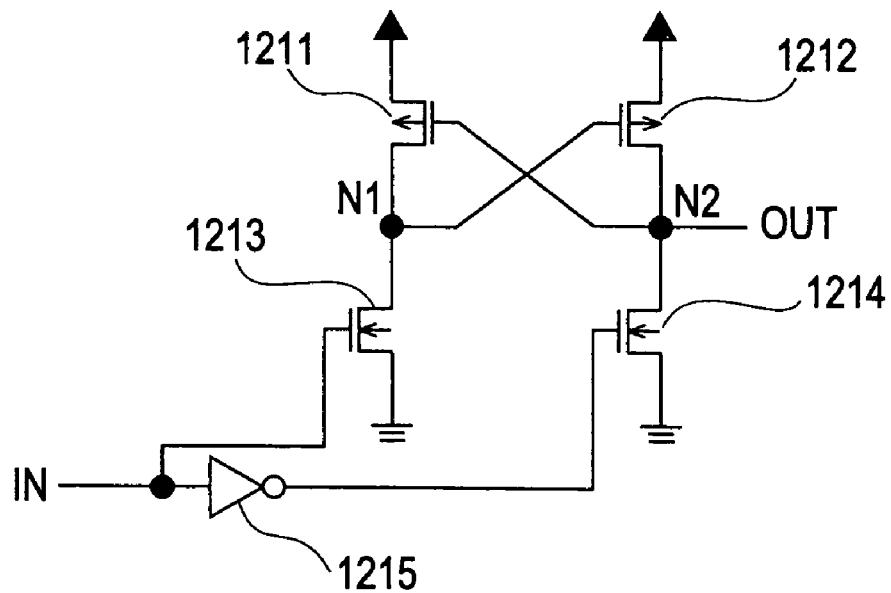
FIG. 12A and FIG. 12B are circuit diagrams depicting the configuration of the level shift circuit as reference examples.
Figure 12B:
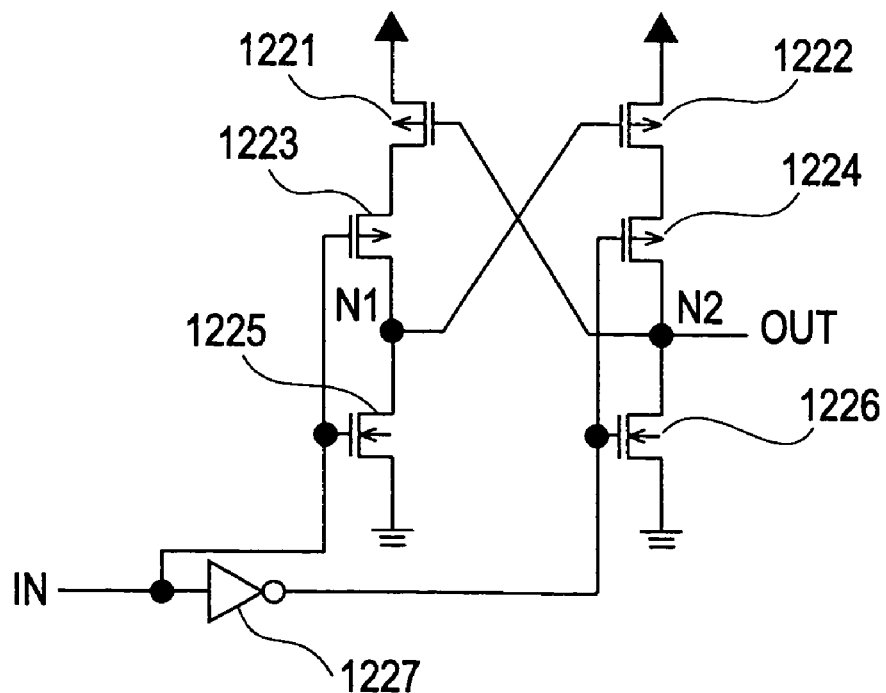

FIG. 12A and FIG. 12B are diagrams depicting the level shift circuit to be the basis of the present invention. The circuits shown in FIG. 12A and FIG. 12B are not included in the level shift circuits in accordance with the present invention.

In the level shift circuit in FIG. 12A, the power supply potential to be supplied to the sources of the pMOS transistors 1211 and 1212 is 3 volts. The high level of the input signal IN is 1.5 volts, and the low level of the input signal is zero volts. The high level potential of the inverter 1215 is 1.5 volts.

In this level shift circuit, the output of the inverter 1215 is at high level when the input signal IN is at low level. Therefore the nMOS transistor 1213 is OFF, and the nMOS transistor 1214 is ON. Since the nMOS transistor 1214 is ON, the potential of the node N2, that is, the signal level of the output signal OUT, is at low level. As a result, the pMOS transistor 1211 is ON, therefore the potential of the node N1 is at high level. This means that the pMOS transistor 1212 is OFF.

Now the case when the input signal IN is changed to high level (1.5 volts) will be described. In this case, the output of the inverter 1215 becomes to be at low level. Therefore the nMOS transistor 1213 turns ON, and the nMOS transistor 1214 turns OFF. At this time, the potential of the node N2 remains at zero volts. As a result, both the pMOS transistor 1211 and the nMOS transistor 1213 are in ON state. And when the potential of the node N1 drops to lower level than the ON/OFF threshold level of the pMOS transistor 1212, the pMOS transistor 1212 turns ON, which raises the potential level of the node N2, that is, the signal level of the output signal OUT, raises to high level (3 volts). When the potential of the node N2 becomes high level, the pMOS transistor 1211 turns OFF, therefore the potential of the node N1 drops to low level.

Now the case when the input signal IN returns to low level will be described. In this case, the output of the inverter 1215 becomes to be at high level. Therefore the nMOS transistor 1213 turns OFF, and the nMOS transistor 1214 turns ON. At this time, the potential of the node N1 remains at low level. As a result, both the pMOS transistor 1212 and the nMOS transistor 1214 are in ON state. And when the potential of the node N2 drops to lower level than the ON/OFF threshold level of the pMOS transistor 1211, the pMOS transistor 1211 turns ON. By this, the potential of the node N1 becomes high level, therefore the pMOS transistor 1212 turns OFF. As a result, the potential of the node N2, that is, the signal level of the output signal OUT, drops to low level.

In the level shift circuit in FIG. 12B, the power supply potential supplied to the sources of the pMOS transistors 1221 and 1222 is 3 volts. The high level of the input signal IN is 1.5 volts, and the low level is zero volts. The high level potential of the inverter 1227 is 1.5 volts.

This level shift circuit has the pMOS transistors 1223 and 1224. These pMOS transistors 1223 and 1224 strongly turn ON when the gate potential is zero volts, and weakly turn ON when the gate potential is 1.5 volts. Here "strongly turn (s) ON" refers to becoming the ON state where the current capability is high, and "weakly turn (s) ON" refers to becoming the ON state where the current capability is low.

In this level shift circuit, the output of the inverter 1227 is at high level when the input signal IN is at low level. Therefore the nMOS transistor 1225 is OFF, and the nMOS transistor 1226 is ON. The pMOS transistor 1223 strongly turns ON, and the pMOS transistor 1224 weakly turns ON. Since the nMOS transistor 1226 is ON, the potential of the node N2, that is, the signal level of the output signal OUT, is at low level, so the pMOS transistor 1221 is ON. Therefore the potential of the node N1 is at high level. This means that the pMOS transistor 1222 is OFF.

Now the case when the input signal IN changes to high level (1.5 volts) will be described. In this case, the output of the inverter 1227 becomes to be at low level. Therefore the nMOS transistor 1225 turns ON, the nMOS transistor 1226 turns OFF, the pMOS transistor 1223 weakly turns ON, and the pMOS transistor 1224 strongly turns ON. And when the potential of the node N1 drops to lower level than the ON/OFF threshold level of the pMOS transistor 1222, the pMOS transistor 1222 turns ON, which raises the potential of the node N2, that is, the signal level of the output signal OUT goes to high level (3 volts). Therefore the pMOS transistor 1221 turns OFF.

Now the case when the input signal IN returns to low level will be described. In this case, the output of the inverter 1227 becomes to be at high level. Therefore the nMOS transistor 1225 turns OFF, the nMOS transistor 1226 turns ON, the pMOS transistor 1223 strongly turns ON, and the pMOS transistor 1224 weakly turns ON. When the potential of the node N2 drops to lower level than the ON/OFF threshold level of the pMOS transistor 1221, the pMOS transistor 1221 turns ON. By this, the potential of the node N1 becomes high level, therefore the pMOS transistor 1222 turns OFF. As a result, the potential of the node N2, that is, the signal level of the output signal OUT, drops to low level.

However, when the voltage shift amount (difference between the high level potential of the input signal IN and the high level potential of the output voltage OUT) is attempted to increase, the level shift circuit in FIG. 12A and FIG. 12B drops the operation speed. The reason thereof is described below.

As mentioned above, in the case of the level shift circuit in FIG. 12A, the potential of the node N1 must be dropped to lower level than the ON/OFF threshold level of the pMOS transistor 1212 when the input signal IN changes from low level to high level, and both the pMOS transistor 1211 and the nMOS transistor 1213 turn ON. Therefore the current which is supplied from the power supply to the node N1 via the pMOS transistor 1211 must be lower than the current which is emitted from the node N1 to the ground via the nMOS transistor 1213.

Additionally, in the case of the level shift circuit in FIG. 12A, the potential of the node N2 must be dropped to lower level than the ON/OFF threshold level of the pMOS transistor 1211 when the input signal IN changes from high level to low level, and both the pMOS transistor 1212 and the nMOS transistor 1214 turn ON. Therefore the current which is supplied from the power supply to the node N2 via the pMOS transistor 1212 must be lower than the current which is emitted from the node N2 to the ground via the nMOS transistor 1214.

As a consequence, the level shift circuit in FIG. 12A is designed such that the current capability of the pMOS transistors 1211 and 1212 become lower than the current capability of the nMOS transistors 1213 and 1214. Here the current capability of the MOS transistor depends on the gate potential. The pMOS transistors 1211 and 1212 strongly turn ON when the gate potential is zero volts. On the other hand, the signal IN (e.g. 1.5 volts), not the power supply potential (e.g. 3 volts), is applied to the gates of the nMOS transistors 1213 and 1214, so the nMOS transistors 1213 and 1214 do not strongly turn ON. Therefore, the pMOS transistors 1211 and 1212 must be designed such that the current capability becomes low enough even if the pMOS transistors strongly turns ON.

When the current capability of the pMOS transistors 1211 and 1212 is too high, either the voltage between the gate and source of the pMOS transistors 1211 and 1212 must be decreased, or the voltage between the gate and source of the nMOS transistors 1213 and 1214 must be increased in order to operate the level shift circuit normally. For this, the power supply potential of the level shift circuit must be decreased, or the high level potential of the input signal IN must be increased. Therefore as the current capability of the pMOS transistors 1211 and 1212 increases, the potential difference which can be shifted in the level shift circuit is decreased.

Whereas, when the potential of the node N1 drops to lower level than the ON/OFF threshold level, the pMOS transistor 1212 must recharge the node N2 to a high level. So if the current capability of the pMOS transistor 1212 is low, it takes more time to raise the potential of the node N2 to a high level. In the same way, when the potential of the node N2 drops to lower level than the ON/OFF threshold level, the pMOS transistor 1211 must recharge the node N1 to a high level. So if the current capability of the pMOS transistor 1211 is low, it takes more time to raise the potential of the node N1 to a high level.

In this way, in the case of the level shift circuit in FIG. 12A, the voltage shift amount decreases if the current capability of the pMOS transistors 1211 and 1212 is increased, and the operation speed decreases if the current capability of the pMOS transistors 1211 and 1212 is decreased.

Whereas in the case of the level shift circuit in FIG. 12B, such a shortcoming is minimized by disposing the pMOS transistors 1223 and 1224. The pMOS transistors 1223 and 1224 weakly turn ON when the potential of the nodes N1 and N2 is decreased, and strongly turn ON when the nodes N1 and N2 are recharged. However, even with the level shift circuit in FIG. 12B, a sufficient voltage shift amount and operation speed cannot be obtained.

A method of implementing a level shift circuit where the voltage shift amount is high and operation speed is high is achieved by increasing the current capability of the pMOS transistors 1211 and 1212, and further increasing the current capability of the nMOS transistors 1213 and 1214. If the current capability of these MOS transistors 1211–1214 is too high, however, the through current generated when both MOS transistors 1211 and 1213 turn ON or when both MOS transistors 1212 and 1214 turn ON becomes extremely high, so power consumption increases, which is another problem.

According to each embodiment of the present invention, transistors to solve the above problems are added to the circuits in FIG. 12A and FIG. 12B.

First Embodiment

Figure 1A:
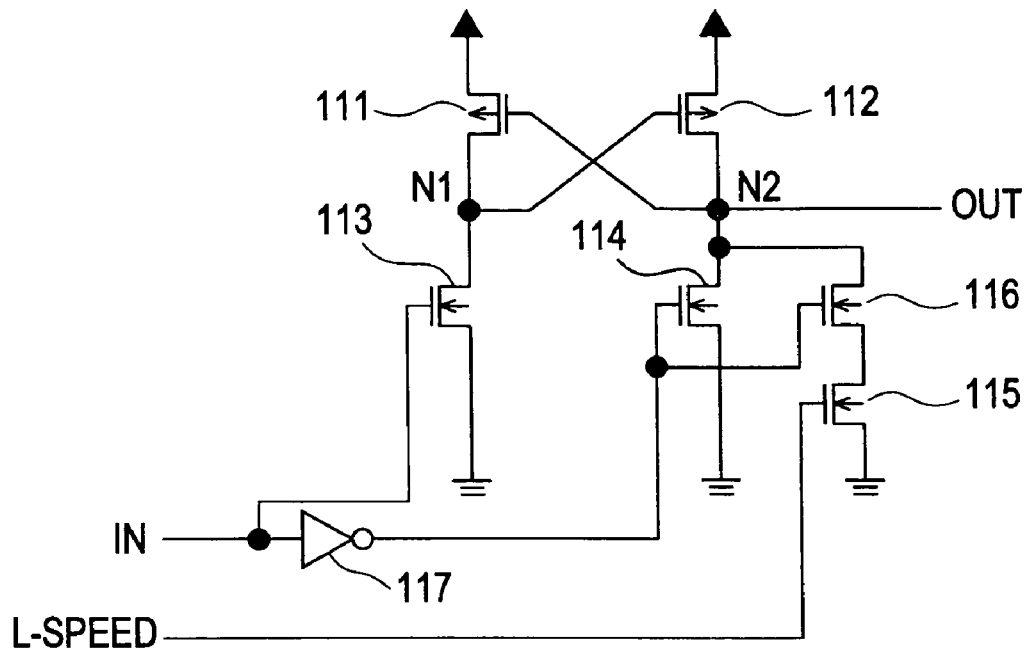
FIG. 1A and FIG. 1B are circuit diagrams depicting the configuration of the level shift circuit according to the first embodiment.

FIG. 1A is a circuit diagram depicting the configuration of key components of the level shift circuit according to the present embodiment. As shown in FIG. 1A, this level shift circuit is comprised of the pMOS transistors 111 and 112, the nMOS transistors 113, 114, 115 and 116, and the inverter 117.

In the pMOS transistor 111, the source is connected to the power supply line (not illustrated), the drain is connected to the node N1, and the gate is connected to the node N2.

In the pMOS transistor 112, the source is connected to the power supply line, the drain is connected to the node N2, and the gate is connected to the node N1. Here, in order to recharge the node N2 at high-speed, it is preferable that the current capability of the pMOS transistor 112 is sufficiently high.

In the nMOS transistor 113, the source is connected to the ground line (not illustrated), the drain is connected to the node N1, and the input signal IN is input from the gate.

In the nMOS transistor 114, the source is connected to the ground line, the drain is connected to the node N2, and the gate is connected to the output terminal of the inverter 117.

In the nMOS transistor 115, the source is connected to the ground line, and the control signal L-SPEED is input from the gate.

In the nMOS transistor 116, the source is connected to the drain of the nMOS transistor 115, the drain is connected to the node N2, and the gate is connected to the output terminal of the inverter 117.

The inverter 117 inputs the input signal IN from the input terminal, inverts this signal IN, and outputs it.

In the present embodiment, the potential to be supplied from the power supply line, that is, the power supply potential, is 3 volts. Therefore the high level potential of the output signal OUT, that is, the high level potential of the node N2, is 3 volts. The high level potential of the input signal IN and the high level potential of the output of the inverter 117, is 1.5 volts or 3 volts.

Operation of the level shift circuit shown in FIG. 1A will now be described.

Initially the operation of this level shift circuit when the high level potential of the input signal IN and the inverter 117 is 1.5 volts will be described. In this case, the control signal L-SPEED is set to high level. By this, the nMOS transistor 115 turns ON.

In this level shift circuit, the output of the inverter 117 is maintained at high level (1.5 volts) when the input signal IN is at low level (zero volts). Therefore, the nMOS transistor 113 is OFF and the nMOS transistors 114 and 116 are ON. Since the nMOS transistors 114 and 116 are ON, the potential of the node N2 (that is, the signal level of the output signal OUT) is maintained at low level. This means that the pMOS transistor 111 is ON, so the potential of the node N1 is at high level. Therefore the pMOS transistor 112 is OFF.

Then the input signal IN changes to high level (1.5 volts), which changes the output of the inverter 117 to low level. Therefore, the nMOS transistor 113 turns ON, and the nMOS transistors 114 and 116 turn OFF. At this time, the potential of the node N2 is maintained at zero volts. This means that the pMOS transistor 111 is maintained at ON state. In other words, both the pMOS transistor 111 and the nMOS transistor 113 are in ON state. And when the potential of the node N1 drops to lower level than the ON/OFF threshold level of the pMOS transistor 112, the pMOS transistor 112 turns ON, and the potential of the node N2 raises to high level (3 volts). If the current capability of the pMOS transistor 112 is sufficiently high, this recharging can be executed at high-speed. When the potential of the node N2 becomes high level, the pMOS transistor 111 turns OFF, so the potential of the node N1 drops to low level.

Then the input signal IN changes to low level, which changes the output of the inverter 117 to high level. Therefore the nMOS transistor 113 turns OFF, and the nMOS transistors 114 and 116 turn ON. At this time, the potential of the node N1 is maintained at low level, therefore the pMOS transistor 112 is maintained in the ON state. This means that both the pMOS transistor 112 and the nMOS transistors 114 and 116 are in ON state. In this level shift circuit, the nMOS transistors 115 and 116 are disposed in parallel with the nMOS transistor 114, so the capability of emitting the charges stored in the node N2 to the ground line is very high. Therefore, even if a pMOS transistor 112 with high current capability is in use, the potential of the node N2 drops to lower level than the ON/OFF threshold level of the pMOS transistor 111. As a result, the pMOS transistor 111 turns ON, and the potential of the node N1 becomes high level. By this, the pMOS transistor 112 turns OFF, and the potential of the node N2 drops to low level.

When the control signal L-SPEED is set to high level in this way, the potential of the node N2 can be dropped to lower level than the ON/OFF threshold level of the pMOS transistor 111, even if a pMOS transistor 112 with high current capability is in use. Therefore, the level shift circuit can execute a rise operation of the output signal OUT at high-speed, and can operate normally even if the voltage shift amount is high. Power consumption, however, is high since the through current increases when the pMOS transistor 112 and the nMOS transistors 114 and 116 are ON.

Now operation of the level shift circuit when the high level potential of the input signal IN and the inverter 117 is 3 volts will be described. In this case, the control signal L-SPEED is set to low level, so the nMOS transistor 115 turns OFF.

When the input signal IN is at low level, the output of the inverter 117 is maintained at high level (3 volts). Therefore the nMOS transistor 113 is OFF, and the nMOS transistor 114 is ON. Since the nMOS transistor 114 is ON, the potential of the node N2 is maintained at low level. This means that the pMOS transistor 111 is ON, so the potential of the node N1 is at high level. Therefore the pMOS transistor 112 is OFF. Since the nMOS transistor 115 is OFF, the ON/OFF of the nMOS transistor 116 has no influence on the general operation of the level shift circuit.

Then the input signal IN changes to high level (3 volts), which changes the output of the inverter 117 to low level. Therefore the nMOS transistor 113 turns ON, and the nMOS transistor 114 turns OFF. At this time, the potential of the node N2 is maintained at zero volts. This means that the pMOS transistor 111 is maintained in ON state. In other words, the pMOS transistor 111 and the nMOS transistor 113 are both in ON state. And when the potential of the node N1 drops to lower level than the ON/OFF threshold level of the pMOS transistor 112, the pMOS transistor 112 turns ON, and the potential of the node N2 rises to high level. If the current capability of the pMOS transistor 112 is sufficiently high, this recharging can be executed at high-speed. When the potential of the node N2 becomes high level, the pMOS transistor 111 turns OFF, so the potential of the node N1 drops to low level.

Then the input signal IN changes to low level, which changes the output of the inverter 117 to high level. Therefore the nMOS transistor 113 turns OFF, and the nMOS transistor 114 turns ON. At this time, the potential of the node N1 is maintained at low level, so the pMOS transistor 112 is maintained in the ON state. This means that both the pMOS transistor 112 and the nMOS transistor 114 are in ON state. Since the nMOS transistor 115 is OFF here, the pMOS transistors 115 and 116 do not contribute to emitting the charges stored in the node N2. However, the gate potential of the nMOS transistor 114 is 3 volts, so the current capability of the nMOS transistor 114 is sufficiently high. Therefore the potential of the node N2 drops to lower level than the ON/OFF threshold level of the pMOS transistor 111. As a result, the pMOS transistor 111 turns ON, and the potential of the node N1 becomes high level. By this, the pMOS transistor 112 turns OFF, and the potential of the node N2 drops to low level.

When the level shift amount is low or zero in this way, the potential of the node N2 can be dropped to lower level than the ON/OFF threshold level of the pMOS transistor 111, even if the nMOS transistors 115 and 116 are not used. In other words, the level shift circuit can increase the speed of the rise operation of the output signal OUT even without using the nMOS transistors 115 and 116, and can operate accurately. By turning OFF the nMOS transistor 115, the through current can be decreased when both the pMOS transistor 112 and the nMOS transistor 114 are ON, therefore power consumption can be decreased.

Now a variant form of the level shift circuit in accordance with the present embodiment will be described with reference to FIG. 1B.

Figure 1B:
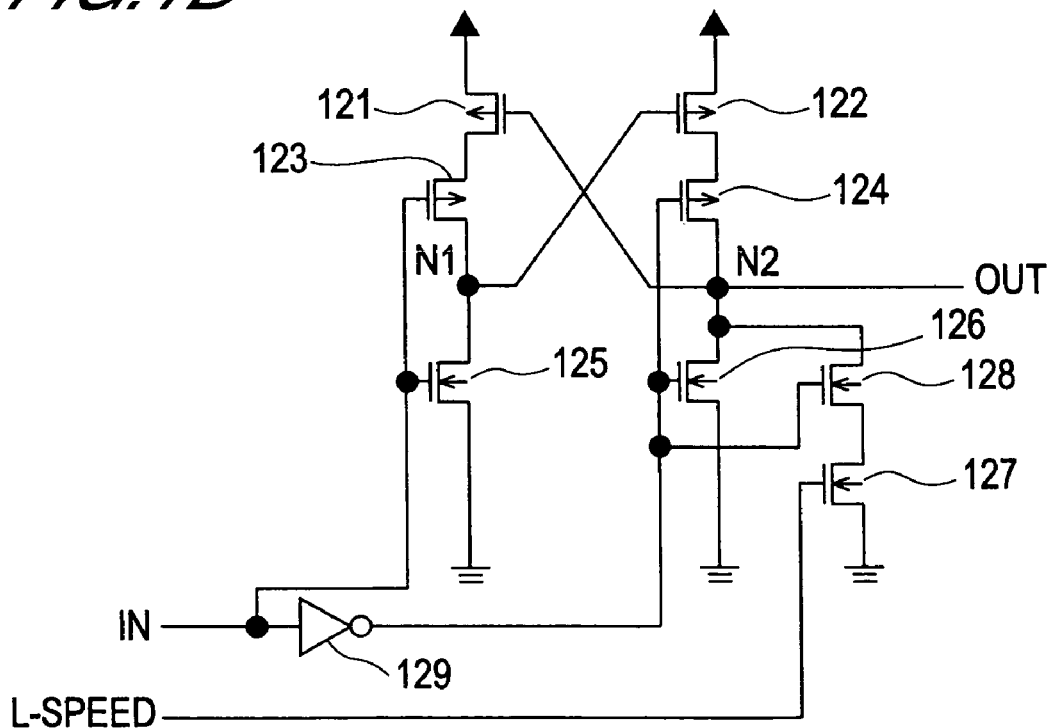

The level shift circuit in FIG. 1B is comprised of the pMOS transistors 121–124, nMOS transistors 125–128, and the inverter 129.

In the pMOS transistor 121, the source is connected to the power supply line, and the gate is connected to the node N2.

In the pMOS transistor 122, the source is connected to the power supply line, and the gate is connected to the node N1. Here, it is preferable that the current capability of the pMOS transistor 122 is sufficiently high to recharge the node N2 at high-speed.

In the pMOS transistor 123, the source is connected to the drain of the pMOS transistor 121, the drain is connected to the node N1, and the input signal IN is input from the gate. This pMOS transistor 123 strongly turns ON when the gate potential is zero volts, weekly turns ON when the gate potential is 1.5 volts, and turns OFF when the gate potential is 3 volts.

In the pMOS transistor 124, the source is connected to the drain of the pMOS transistor 122, the drain is connected to the node N2, and the gate is connected to the output terminal of the inverter 129. This pMOS transistor 124 strongly turns ON when the gate potential is zero volts, weekly turns ON when the gate potential is 1.5 volts, and turns OFF when the gate potential is 3 volts.

In the nMOS transistor 125, the source is connected to the ground line, the drain is connected to the node N1, and the input signal IN is input from the gate.

In the nMOS transistor 126, the source is connected to the ground line, the drain is connected to the node N2, and the gate is connected to the output terminal of the inverter 129.

In the nMOS transistor 127, the source is connected to the ground line, and the control signal L-SPEED is input from the gate.

In the nMOS transistor 128, the source is connected to the drain of the nMOS transistor 127, the drain is connected to the node N2, and the gate is connected to the output terminal of the inverter 129.

The inverter 129 inputs the input signal IN from the input terminal, inverts this signal IN, and outputs it.

In the level shift circuit in FIG. 1B as well, the power supply potential is 3 volts. The high level potential of the input signal IN and the high level potential of the output of the inverter 129 is 1.5 volts or 3 volts.

Initially operation of the level shift circuit when the high level potential of the input signal IN and the inverter 129 is 1.5 volts will be described. In this case, the control signal L-SPEED is set to high level. By this, the nMOS transistor 127 turns ON.

When the input signal IN is at low level, the output of the inverter 129 is at high level (1.5 volts). Therefore the nMOS transistor 125 is OFF, and the nMOS transistors 126 and 128 are ON. The pMOS transistor 123 strongly turns ON, and the pMOS transistor 124 weakly turns ON. Since the nMOS transistors 126 and 128 are ON, the potential of the node N2 is at low level, so the pMOS transistor 121 is ON. This means that the potential of the node N1 is at high level, and the pMOS transistor 122 is OFF.

Then the input signal IN changes to high level (1.5 volts), which changes the output of the inverter 129 to low level. Therefore the nMOS transistor 125 turns ON, the nMOS transistors 126 and 128 turn OFF, the pMOS transistor 123 weakly turns ON, and the pMOS transistor 124 strongly turns ON. And when the potential of the node N1 drops to lower level than the ON/OFF threshold level of the pMOS transistor 122, the pMOS transistor 122 turns ON, and by this, the potential of the node N2 rises to high level.

Then the input signal IN changes to low level, which changes the output of the inverter 129 to high level. Therefore the nMOS transistor 125 turns OFF, the nMOS transistors 126 and 128 turn ON, the pMOS transistor 123 strongly turns ON, and the pMOS transistor 124 weakly turns ON. By this, the pMOS transistors 122 and 124 and the nMOS transistors 126 and 128 are in ON state. In this level shift circuit, the nMOS transistors 127 and 128 are disposed in parallel with the nMOS transistor 126, so the capability of emitting the charges stored in the node N2 to the ground line is very high. Therefore, even if a pMOS transistor 122 with a high current capability is in use, the potential of the node N2 drops to lower level than the ON/OFF threshold level of the pMOS transistor 121. By this, the pMOS transistor 121 turns ON, and the potential of the node N1 becomes high level. As a result, the pMOS transistor 122 turns OFF, and the potential of the node N2 drops to low level.

When the control signal L-SPEED is set to high level in this way, the potential of the node N2 can be dropped to lower level than the ON/OFF threshold level of the pMOS transistor 121, even if a pMOS transistor 122 with high current capability is in use. Therefore the level shift circuit can execute the rise operation of the output signal OUT at high-speed, and can operate normally even if the voltage shift amount is high. Power consumption, however, is high since the through current increases when the pMOS transistors 122 and 124 and the nMOS transistors 126 and 128 are ON.

Now the operation of the level shift circuit when the high level potential of the input signal IN and the inverter 129 is 3 volts will be described. In this case, the control signal L-SPEED is set to low level, so the nMOS transistor 127 turns OFF.

When the input signal IN is at low level, the output of the inverter 129 is at high level (3 volts). Therefore the nMOS transistor 125 is OFF, and the nMOS transistor 126 is ON. The pMOS transistor 123 strongly turns ON, and the pMOS transistor 124 weakly turns ON. Since the nMOS transistor 126 is ON, the potential of the node N2 is at low level, and the pMOS transistor 121 is ON. So the potential of the node N1 is at high level, therefore the pMOS transistor 122 is OFF. Since the nMOS transistor 127 is OFF, the ON/OFF of the nMOS transistor 128 has no influence on the general operation of the level shift circuit.

Then the input signal IN changes to high level (3 volts), which changes the output of the inverter 129 to low level. Therefore the nMOS transistor 125 turns ON, the nMOS transistor 126 turns OFF, the pMOS transistor 123 turns OFF, and the pMOS transistor 124 strongly turns ON. As a result, the potential of the node N1 becomes zero volts, and the pMOS transistor 122 turns ON. By this, the potential of the node N2 rises to high level.

Then the input signal IN changes to low level, which changes the output of the inverter 129 to high level. Therefore the nMOS transistor 125 turns OFF, the nMOS transistor 126 turns ON, the pMOS transistor 123 strongly turns ON, and the pMOS transistor 124 turns OFF. By this, the potential of the node N2 becomes zero volts, and the pMOS transistor 121 turns ON. As a result, the potential of the node N1 becomes high level, and the pMOS transistor 122 turns OFF.

When the level shift amount is low or zero, the potential of the node N2 can be decreased to lower level than the ON/OFF threshold level of the pMOS transistor 121 without using the nMOS transistors 127 and 128 in this way. In other words, the level shift circuit can execute the rise operation of the output signal OUT at high-speed, and can operate accurately without using the nMOS transistors 127 and 128. The power consumption is also low since the through current does not flow through the nodes N1 and N2.

Second Embodiment

Figure 2A:
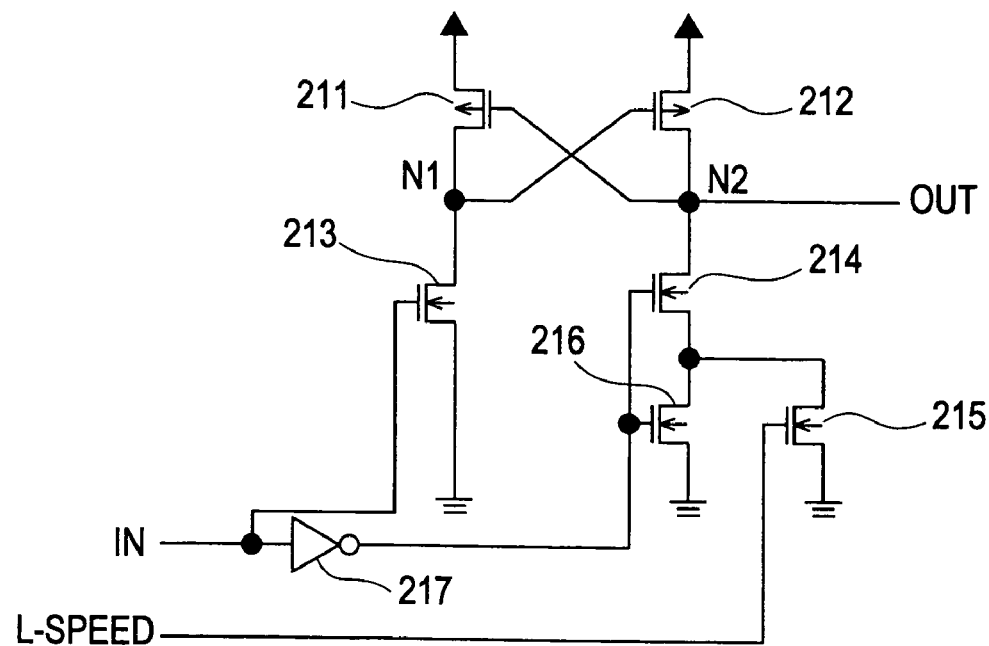
FIG. 2A and FIG. 2B are circuit diagrams depicting the configuration of the level shift circuit according to the second embodiment.

FIG. 2A is a circuit diagram depicting the configuration of key components of the level shift circuit according to the present embodiment. As shown in FIG. 2A, this level shift circuit is comprised of the pMOS transistors 211 and 212, the nMOS transistors 213–216, and the inverter 217.

In the pMOS transistor 211, the source is connected to the power supply line, the drain is connected to the node N1, and the gate is connected to the node N2.

In the pMOS transistor 212, the source is connected to the power supply line, the drain is connected to the node N2, and the gate is connected to the node N1. In order to recharge the node N2 at high-speed, it is preferable that the current capability of the pMOS transistor 212 is sufficiently high.

In the nMOS transistor 213, the source is connected to the ground line, the drain is connected to the node N1, and the input signal IN is input from the gate.

In the nMOS transistor 214, the drain is connected to the node N2, and the gate is connected to the output terminal of the inverter 217.

In the nMOS transistor 215, the source is connected to the ground line, the drain is connected to the source of the nMOS transistor 214, and the control signal L-SPEED is input from the gate.

In the nMOS transistor 216, the source is connected to the ground line, the drain is connected to the source of the nMOS transistor 214, and the gate is connected to the output terminal of the inverter 217.

The inverter 217 inputs the input signal IN from the input terminal, inverts this signal IN, and outputs it.

In the present embodiment as well, the power supply potential is 3 volts. The high level potential of the input signal IN and the high level potential of the inverter 217 is 1.5 volts or 3 volts.

Operation of the level shift circuit shown in FIG. 2A will now be described.

Initially operation of the level shift circuit when the high level potential of the input signal IN and the inverter 217 is 1.5 volts will be described. In this case, the control signal L-SPEED is set to high level. By this, the nMOS transistor 215 turns ON.

In this level shift circuit, the output of the inverter 217 is maintained at high level (1.5 volts) when the input signal IN is at low level. Therefore the nMOS transistor 213 is OFF, and the nMOS transistors 214 and 216 are ON. Since the nMOS transistors 214, 215 and 216 are ON, the potential of the node N2 is maintained at low level. This means that the pMOS transistor 211 is ON, so the potential of the node N1 is high level. Therefore the pMOS transistor 212 is OFF.

Then the input signal IN changes to high level (1.5 volts), which changes the output of the inverter 217 to low level. Therefore the nMOS transistor 213 turns ON, and the nMOS transistors 214 and 216 turn OFF. At this time, the potential of the node N2 is maintained at zero volts. This means that the pMOS transistor 211 is maintained in ON state. In other words, both the pMOS transistor 211 and the nMOS transistor 213 are in ON state. Then the potential of the node N1 drops to lower level than the ON/OFF threshold level of the pMOS transistor 212. By this, the pMOS transistor 212 turns ON, and the potential of the node N2 rises to high level. If the current capability of the pMOS transistor 212 is sufficiently high, this recharging can be executed at high-speed. When the potential of the node N2 becomes high level, the pMOS transistor 211 turns OFF, so the potential of the node N1 drops down to low level.

Then the input signal IN changes to low level, which changes the output of the inverter 217 to high level. Therefore the nMOS transistor 213 turns OFF, and the nMOS transistors 214 and 216 turn ON. At this time, the potential of the node N1 is maintained at low level, therefore the pMOS transistor 212 is maintained in the ON state. This means that the pMOS transistor 212 and the nMOS transistors 214, 215 and 216 are in ON state. In this level shift circuit, the nMOS transistors 215 and 216 are disposed in parallel with the source of the nMOS transistor 214, so the capability of emitting the charges stored in the node N2 to the ground line is very high. Therefore even if a pMOS transistor 212 with high current capability is in use, the potential of the node N2 drops to lower level than the ON/OFF threshold level of the pMOS transistor 211. As a result, the pMOS transistor 211 turns ON, and the potential of the node N1 becomes high level. By this, the pMOS transistor 212 turns OFF, and the potential of the node N2 drops to low level.

When the control signal L-SPEED is set to high level in this way, the potential of the node N2 can be dropped to lower level than the ON/OFF threshold level of the pMOS transistor 211, even if a pMOS transistor 212 with high current capability is in use. Therefore the level shift circuit can execute the rise operation of the output signal OUT at high-speed, and can operate normally even if the voltage shift amount is high. Power consumption, however, is high since the through current increases when the pMOS transistor 212 and the nMOS transistors 214 and 216 are ON.

Now the operation of the level shift circuit when the high level potential of the input signal IN and the inverter 217 is 3 volts will be described. In this case, the control signal L-SPEED is set to low level, so the nMOS transistor 215 turns OFF.

When the input signal IN is at low level, the output of the inverter 217 is maintained at high level (3 volts). Therefore the nMOS transistor 213 is OFF, and the nMOS transistors 214 and 216 are ON. Since the nMOS transistors 214 and 216 are ON, the potential of the node N2 is maintained at low level. This means that the pMOS transistor 211 is ON, so the potential of the node N1 is at high level. Therefore the pMOS transistor 212 is OFF. Since the nMOS transistors 215 is OFF, this has no influence on the general operation of the level shift circuit.

Then the input signal IN changes to high level (3 volts), which changes the output of the inverter 217 to low level. Therefore the nMOS transistor 213 turns ON, and the nMOS transistor 214 turns OFF. At this time, the potential of the node N2 is maintained at zero volts. Therefore the pMOS transistor 211 is maintained in the ON state. This means that the pMOS transistor 211 and the nMOS transistor 213 are both in ON state. Then the potential of the node N1 drops to lower level than the ON/OFF threshold level of the pMOS transistor 212, and the pMOS transistor 212 turns ON. By this, the potential of the node N2 rises to high level (3 volts). If the current capability of the pMOS transistor 212 is sufficiently high, this recharging can be executed at high-speed. When the potential of the node N2 becomes high level, the pMOS transistor 211 turns OFF, so the potential of the node N1 drops to low level.

Then the input signal IN changes to low level, which changes the output of the inverter 217 to high level. Therefore the nMOS transistor 213 turns OFF, and the nMOS transistor 214 turns ON. At this time, the potential of the node N1 is maintained at low level, therefore the pMOS transistor 212 is maintained in ON state. By this, both the pMOS transistor 212 and the nMOS transistor 214 become ON state. Here, in this level shift circuit, the nMOS transistor 215 does not contribute to emitting the charges stored in the node N2, because the control signal L=SPEED is set to low level. However, the gate potential is 3 volts, so the current capability of the nMOS transistors 214 and 216 are sufficiently high. Therefore the potential of the node N2 drops to lower level than the ON/OFF threshold level of the pMOS transistor 211. As a result, the pMOS transistor 211 turns ON, and the potential of the node N1 becomes high level. By this, the pMOS transistor 212 turns OFF, and the potential of the node N2 drops to low level.

When the level shift amount is low or zero in this way, the potential of the node N2 can be dropped to lower level than the ON/OFF threshold level of the pMOS transistor 211, even without using the nMOS transistor 215. In other words, the level shift circuit can increase the speed of the rise operation of the output signal OUT and can operate correctly even without using the nMOS transistor 215. By not using the nMOS transistor 215, the through current can be decreased when both the pMOS transistor 212 and the nMOS transistor 214 are ON, therefore power consumption can be decreased.

Now a variant form of the level shift current in accordance with the present embodiment will be described with reference to FIG. 2B.

Figure 2B:
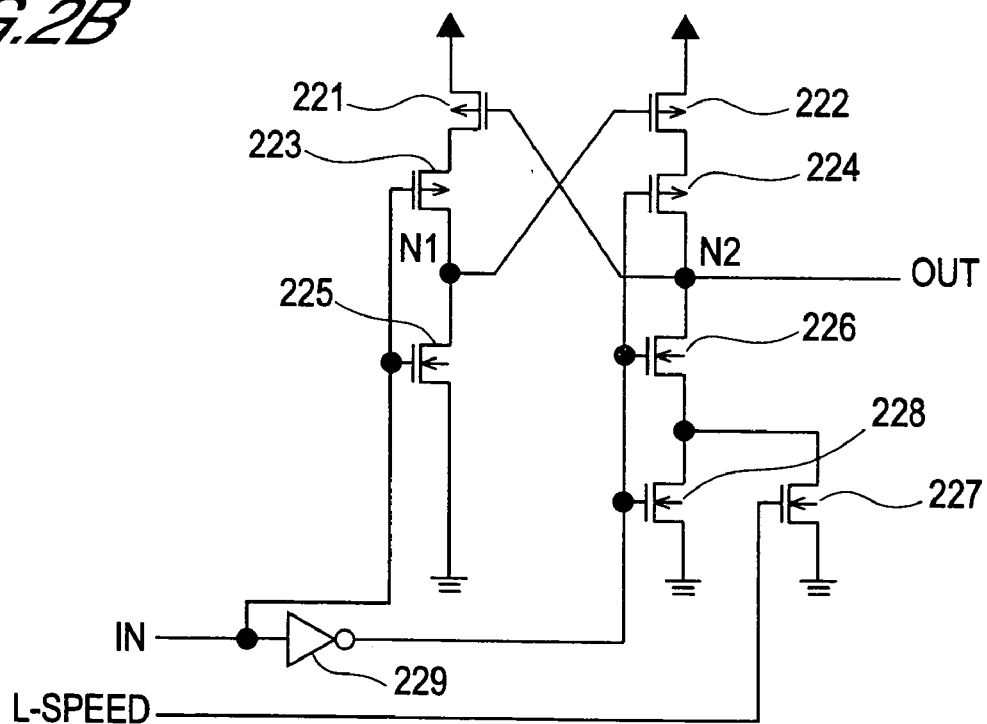

The level shift circuit in FIG. 2B is comprised of the pMOS transistors 221–224, the nMOS transistors 225–228, and the inverter 229.

In the pMOS transistor 221, the source is connected to the power supply line, and the gate is connected to the node N2.

In the pMOS transistor 222, the source is connected to the power supply line, and the gate is connected to the node N1. In order to recharge the node N2 at high-speed, it is preferable that the current capability of the pMOS transistor 222 is sufficiently high.

In the pMOS transistor 223, the source is connected to the drain of the pMOS transistor 221, the drain is connected to the node N1, and the input signal IN is input from the gate. This pMOS transistor 223 strongly turns ON when the gate potential is zero volts, weakly turns ON when the gate potential is 1.5 volts, and turns OFF when the gate potential is 3 volts.

In the pMOS transistor 224, the source is connected to the drain of the pMOS transistor 222, the drain is connected to the node N2, and the gate is connected to the output terminal of the inverter 229. This pMOS transistor 224 strongly turns ON when the gate potential is zero volts, weakly turns ON when the gate potential is 1.5 volts, and turns OFF when the gate potential is 3 volts.

In the nMOS transistor 225, the source is connected to the ground line, the drain is connected to the node N1, and the input signal IN is input from the gate.

In the nMOS transistor 226, the drain is connected to the node N2, and the gate is connected to the output terminal of the inverter 229.

In the nMOS transistor 227, the source is connected to the ground line, the drain is connected to the source of the nMOS transistor 226, and the control signal L-SPEED is input from the gate.

In the nMOS transistor 228, the source is connected to the ground line, the drain is connected to the source of the nMOS transistor 226, and the gate is connected to the output terminal of the inverter 229.

The inverter 229 inputs the input signal IN from the input terminal, inverts this signal IN, and outputs it.

In the level shift circuit in FIG. 2B as well, the power supply potential is 3 volts. The high level potential of the input signal IN and the high level potential of the output of the inverter 217 is 1.5 volts or 3 volts.

Initially operation of the level shift circuit when the high level potential of the input signal IN and the inverter 229 is 1.5 volts will be described. In this case, the control signal L-SPEED is set to high level. By this, the nMOS transistor 227 turns ON.

When the input signal IN is at low level, the output of the inverter 229 is at high level (1.5 volts). Therefore the nMOS transistor 225 is OFF, and the nMOS transistors 226 and 228 are ON. The pMOS transistor 223 strongly turns ON, and the pMOS transistor 224 weakly turns ON. Since the nMOS transistors 226, 227 and 228 are ON, the potential of the node N2 is at low level, so the pMOS transistor 221 is ON. This means that the potential of the node N1 is at high level, and the pMOS transistor 222 is OFF.

Then the input signal IN changes to high level (1.5 volts), which changes the output of the inverter 229 to low level. Therefore the nMOS transistor 225 turns ON. The nMOS transistors 226 and 228 turn OFF, the pMOS transistor 223 weakly turns ON, and the pMOS transistor 224 strongly turns ON. Then the potential of the node N1 drops to lower level than the ON/OFF threshold level of the pMOS transistor 222, and the pMOS transistor 222 turns ON. As a result, the potential of the node N2 rises to high level.

Then the input signal IN changes to low level, which changes the output of the inverter 229 to high level. Therefore the nMOS transistor 225 turns OFF, the nMOS transistors 226 and 228 turn ON, the pMOS transistor 223 strongly turns ON, and the pMOS transistor 224 weakly turns ON. By this, the pMOS transistors 222 and 224 and the nMOS transistors 226, 227 and 228 turn ON. In this level shift circuit, the nMOS transistors 227 and 228 are disposed in parallel with the source of the nMOS transistor 226, so the capability of emitting the charges stored in the node N2 to the ground line is very high. Therefore, even if a pMOS transistor 222 with a high current capability is in use, the potential of the node N2 drops to lower level than the ON/OFF threshold level of the pMOS transistor 221. As a result, the pMOS transistor 221 turns ON, and the potential of the node N1 becomes high level. By this, the pMOS transistor 222 turns OFF, and the potential of the node N2 drops to low level.

When the control signal L-SPEED is set to high level in this way, the potential of the node N2 can be dropped to lower level than the ON/OFF threshold level of the pMOS transistor 221, even if the pMOS transistor 222 with a high current capacity is in use. Therefore the level shift circuit can operate at high-speed, and can operate normally even if the voltage shift amount is high. Power consumption, however, is high, since the through current increases when the pMOS transistors 222 and 224 and the nMOS transistors 226, 227 and 228 are ON.

Now operation of the level shift circuit with the high level potential of the input signal IN and the inverter 229 is 3 volts will be described. In this case, the control signal L-SPEED is set to low level, so the nMOS transistor 227 turns OFF.

When the input signal IN is at low level, the output of the inverter 229 is at high level (3 volts). Therefore the nMOS transistor 225 is OFF, and the nMOS transistors 226 and 228 are ON. The pMOS transistor 223 strongly turns ON, and the pMOS transistor 224 weakly turns ON. Since the nMOS transistor 226 and 228 are ON, the potential of the node N2 is at low level. Therefore the pMOS transistor 221 is ON, and the potential of the node N1 is at high level. As a result, the pMOS transistor 222 is OFF. Since the nMOS transistor 227 is OFF, this has no influence on the general operation of the level shift circuit.

Then the input signal IN changes to high level (3 volts), which changes the output of the inverter 229 to low level. Therefore the nMOS transistor 225 turns ON, the nMOS transistors 226 and 228 turn OFF, the pMOS transistor 223 turns OFF, and the pMOS transistor 224 strongly turns ON. As a result, the potential of the node N1 becomes zero volts, and the pMOS transistor 222 turns ON. By this, the potential of the node N2 rises to high level.

Then the input signal IN changes to low level, which changes the output of the inverter 229 to high level. Therefore the nMOS transistor 225 turns OFF, the nMOS transistors 226 and 228 turn ON, the pMOS transistor 223 strongly turns ON, and the pMOS transistor 224 turns OFF. By this, the potential of the node N2 becomes zero volts. Therefore the pMOS transistor 221 turns ON. By this, the potential of the node N1 becomes high level, and the pMOS transistor 222 turns OFF.

When the level shift amount is low or zero, the potential of the node N2 can be decreased to zero volts without using the nMOS transistor 227 in this way. As a result, the level shift circuit can accurately operate at high-speed, and power consumption is also low.

Third Embodiment

Figure 3A:
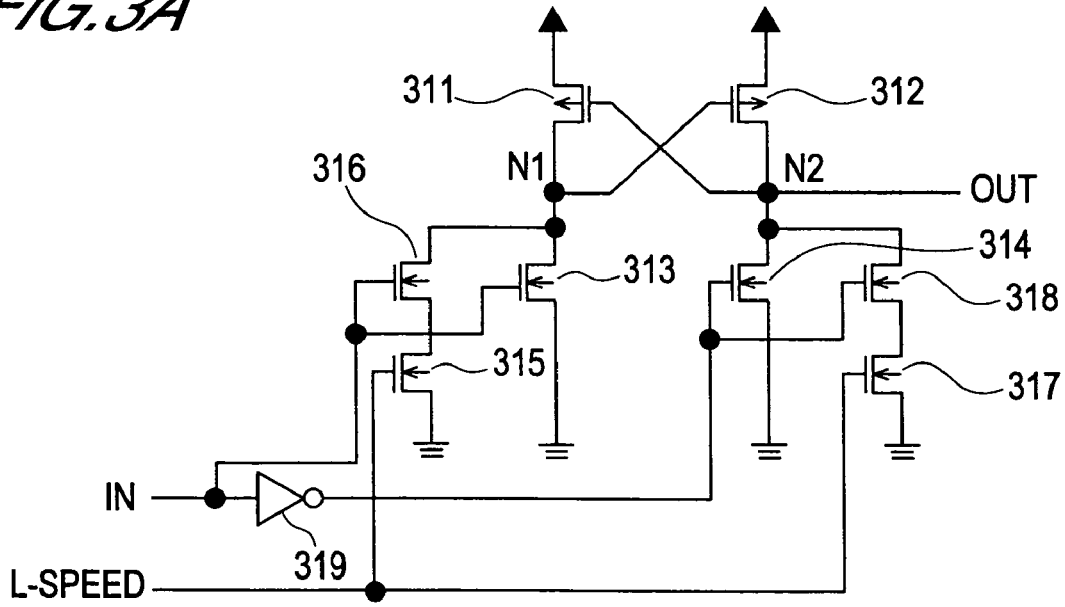
FIG. 3A and FIG. 3B are circuit diagrams depicting the configuration of the level shift circuit according to the third embodiment.

FIG. 3A is a circuit diagram depicting the configuration of key components of the level shift circuit according to the present embodiment. As shown in FIG. 3A, this level shift circuit is comprised of the pMOS transistors 311 and 312, the nMOS transistors 313–318, and the inverter 319.

In the pMOS transistor 311, the source is connected to the power supply line, the drain is connected to the node N1, and the gate is connected to the node N2. In order to recharge the node N1 at high-speed, it is preferable that the current capability of the pMOS transistor 311 is sufficiently high.

In the pMOS transistor 312, the source is connected to the power supply line, the drain is connected to the node N2, and the gate is connected to the node N1. In order to recharge the node N2 at high-speed, it is preferable that the current capability of the pMOS transistor 312 is sufficiently high.

In the nMOS transistor 313, the source is connected to the ground line, the drain is connected to the node N1, and the input signal IN is input from the gate.

In the nMOS transistor 314, the source is connected to the ground line, the drain is connected to the node N2, and the gate is connected to the output terminal of the inverter 319.

In the nMOS transistor 315, the source is connected to the ground line, and the control signal L-SPEED is input from the gate.

In the nMOS transistor 316, the source is connected to the drain of the nMOS transistor 315, the drain is connected to the node N1, and the input signal IN is input from the gate.

In the nMOS transistor 317, the source is connected to the ground line, and the control signal L-SPEED is input from the gate.

In the nMOS transistor 318, the source is connected to the drain of the nMOS transistor 317, the drain is connected to the node N2, and the gate is connected to the output terminal of the inverter 319.

The inverter 319 inputs the input signal IN from the input terminal, inverts this signal IN, and outputs it.

In the present embodiment as well, the power supply potential is 3 volts. The high level potential of the input signal IN and the high level potential of the output of the inverter 319 is 1.5 volts or 3 volts.

Operation of the level shift circuit shown in FIG. 3A will now be described.

Initially operation of the level shift circuit when the high level potential of the input signal IN and the inverter 319 is 1.5 volts will be described. In this case, the control signal L-SPEED is set to high level. By this, the nMOS transistors 315 and 317 turn ON.

In this level shift circuit, the output of the inverter 319 is maintained at high level (1.5 volts) when the input signal IN is at low level. Therefore the nMOS transistors 313 and 316 are OFF, and the nMOS transistors 314 and 318 are ON. Since the nMOS transistors 314 and 318 are ON, the potential of the node N2 is maintained at low level. This means that the pMOS transistor 311 is ON, so the potential of the node N1 is high level. Therefore the pMOS transistor 312 is OFF.

Then the input signal IN changes to high level (1.5 volts), which changes the output of the inverter 319 to low level. By this, the nMOS transistors 313 and 316 turn ON, and the nMOS transistors 314 and 318 turn OFF. At this time, the potential of the node N2 is maintained at zero volts. This means that the pMOS transistor 311 is maintained in ON state. In other words, the pMOS transistor 311 and the nMOS transistors 313 and 316 are in ON state. In this level shift circuit, the nMOS transistors 315 and 316 are disposed in parallel with the nMOS transistor 313, so the capability of emitting the charges stored in the node N1 to the ground line is very high. Therefore even if a pMOS transistor 311 with high current capability is in use, the potential of the node N1 drops to lower level than the ON/OFF threshold level of the pMOS transistor 312. As a result, the pMOS transistor 312 turns ON, and the potential of the node N2 rises to high level (3 volts). When the current capability of the pMOS transistor 312 is sufficiently high, this recharging can be executed at high-speed. When the potential of the node N2 becomes high level, the pMOS transistor 311 turns OFF, and the potential of the node N1 drops to low level.

Then the input signal IN changes to low level, which changes the output of the inverter 319 to high level. Therefore the nMOS transistors 313 and 316 turn OFF, and the nMOS transistors 314 and 318 turn ON. At this time, the potential of the node N1 is maintained at low level, therefore the pMOS transistor 312 is maintained in the ON state. This means that the pMOS transistor 312 and the nMOS transistors 314, 317 and 318 are in ON state. In this level shift circuit, the nMOS transistors 317 and 318 are disposed in parallel with the nMOS transistor 314, so the capability of emitting the charges stored in the node N2 to the ground line is very high. Therefore even if a pMOS transistor 312 with high current capability is in use, the potential of the node N2 drops to lower level than the ON/OFF threshold level of the pMOS transistor 311. As a result, the pMOS transistor 311 turns ON, and the potential of the node N1 becomes high level. If the current capability of the pMOS transistor 311 is sufficiently high, this recharging can be executed at high-speed. When the potential of the node N1 becomes high level, the pMOS transistor 312 turns OFF. Therefore the potential of the node N2 drops to low level.

When the control signal L-SPEED is set to high level in this way, the level shift circuit operates normally even if the pMOS transistors 311 and 312 with high current capability are in use. In other words, the level shift circuit can execute the rise and fall operation of the output signal OUT at high-speed, and operate normally even if the voltage shift amount is high. Power consumption, however, is high since the through current increases when the transistors 311, 313, 316 are ON and transistors 312, 314, 318 are ON.

Now operation of the level shift circuit when the high level potential of the input signal IN and the inverter 319 is 3 volts will be described. In this case, the control signal L-SPEED is set to low level, so the nMOS transistors 315 and 317 turn OFF.

When the input signal IN is at low level, the output of the inverter 319 is maintained at high level (3 volts). Therefore the nMOS transistors 313 and 316 are OFF, and the nMOS transistors 314 and 318 are ON. Since the nMOS transistor 314 is ON, the potential of the node N2 is maintained at low level. This means that the pMOS transistor 311 is ON, so the potential of the node N1 is at high level. Therefore the pMOS transistor 312 is OFF. Since the nMOS transistor 317 is OFF, the ON/OFF state of the MOS transistor 318 has no influence on the general operation of the level shift circuit.

Then the input signal IN changes to high level (3 volts), which changes the output of the inverter 319 to low level. Therefore the nMOS transistors 313 and 316 turn ON, and the nMOS transistors 314 and 318 turn OFF. At this time, the potential of the node N2 is maintained at zero volts. This means that the pMOS transistor 311 is maintained in the ON state. In other words, both the pMOS transistor 311 and the nMOS transistor 313 are both in ON state. In this level shift circuit, the nMOS transistors 315 and 316 do not contribute of emitting the charges stored in the node N1. However, the gate potential is 3 volts, so the current capability of the nMOS transistor 313 is sufficiently high. Therefore the potential of the node N1 drops to lower level than the ON/OFF threshold level of the pMOS transistor 312, even if the current capability of the pMOS transistor 311 is high. By this, the pMOS transistor 312 turns ON, and the potential of the node N2 rises to high level (3 volts). If the current capability of the pMOS transistor 312 is sufficiently high, this recharging can be executed at high-speed. When the potential of the node N2 becomes high level, the pMOS transistor 311 turns OFF, so the potential of the node N1 drops to low level.

Then the input signal IN changes to low level, which changes the output of the inverter 319 to high level. Therefore the nMOS transistors 313 and 316 turn OFF, and the nMOS transistors 314 and 318 turn ON. At this time, the potential of the node N1 is maintained at low level, therefore the pMOS transistor 312 is maintained in the ON state. By this, both the pMOS transistor 312 and the nMOS transistor 314 become ON state. In this level shift circuit, the nMOS transistors 317 and 318 do not contribute to emitting the charges stored in the node N2. However, the gate potential is 3 volts, so the current capability of the nMOS transistor 314 is sufficiently high. Therefore the potential of the node N2 drops to lower level than the ON/OFF threshold level of the pMOS transistor 311, even if the current capability of the pMOS transistor 312 is high. By this, the pMOS transistor 311 turns ON. As a result, the potential of the node N1 rises to high level, and the pMOS transistor 312 turns OFF. Therefore the potential of the node N2 drops to low level.

When the level shift amount is low or zero in this way, the level shift circuit can be accurately operated at high-speed even if the control signal L-SPEED is set to low level. Also the nMOS transistors 315 and 317 are OFF, so power consumption is low.

Now a variant form of the level shift circuit in accordance with the present embodiment will be described with reference to FIG. 3B.

Figure 3B:
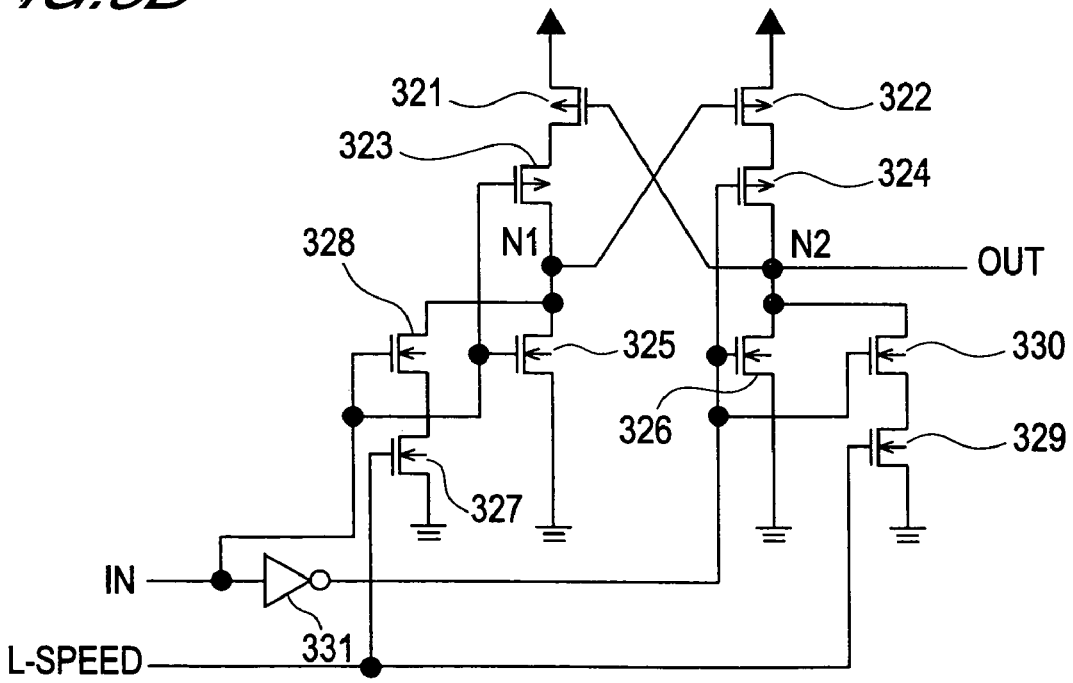

The level shift circuit in FIG. 3B is comprised of the pMOS transistors 321–324, the nMOS transistors 325–330, and the inverter 331.

In the pMOS transistor 321, the source is connected to the power supply line, and the gate is connected to the node N2. In order to recharge the node N1 at high-speed, it is preferable that the current capability of the pMOS transistor 321 is sufficiently high.

In the pMOS transistor 322, the source is connected to the power supply line, and the gate is connected to the node N1. In order to recharge the node N2 at high-speed, it is preferable that the current capability of the pMOS transistor 322 is sufficiently high.

In the pMOS transistor 323, the source is connected to the drain of the pMOS transistor 321, the drain is connected to the node N1, and the input signal IN is input from the gate. This pMOS transistor 323 strongly turns ON when the gate potential is zero volts, weakly turns ON when the gate potential is 1.5 volts, and turns OFF when the gate potential is 3 volts.

In the pMOS transistor 324, the source is connected to the drain of the pMOS transistor 322, the drain is connected to the node N2, and the gate is connected to the output terminal of the inverter 331. This pMOS transistor 324 strongly turns ON when the gate potential is zero volts, weakly turns ON when the gate potential is 1.5 volts, and turns OFF when the gate potential is 3 volts.

In the nMOS transistor 325, the source is connected to the ground line, the drain is connected to the node N1, and the input signal IN is input from the gate.

In the nMOS transistor 326, the source is connected to the ground line, the drain is connected to the node N2, and the gate is connected to the output terminal of the inverter 331.

In the nMOS transistor 327, the source is connected to the ground line, and the control signal L-SPEED is input from the gate.

In the nMOS transistor 328, the source is connected to the drain of the nMOS transistor 327, the drain is connected to the node N1, and the input signal IN is input from the gate.

In the nMOS transistor 329, the source is connected to the ground line, and the control signal L-SPEED is input from the gate.

In the nMOS transistor 330, the source is connected to the drain of the nMOS transistor 329, the drain is connected to the node N2, and the gate is connected to the output terminal of the inverter 331.

The inverter 331 inputs the input signal IN from the input terminal, inverts this signal IN, and outputs it.

In the level shift circuit in FIG. 3B as well, the potential supplied from the power supply line is 3 volts. The high level potential of the input signal IN and the high level potential of the output of the inverter 319 is 1.5 volts or 3 volts.

Initially operation of the level shift circuit when the high level potential of the input signal IN and the inverter 331 is 1.5 volts will be described. In this case, the control signal L-SPEED is set to high level. By this, the nMOS transistors 327 and 329 turn ON.

When the input signal IN is at low level, the output of the inverter 331 is at high level (1.5 volts). Therefore the nMOS transistors 325 and 328 are OFF, and the nMOS transistors 326 and 330 are ON. The pMOS transistor 323 strongly turns ON, and the pMOS transistor 324 weakly turns ON. Since the nMOS transistors 326 and 330 are ON, the potential of the node N2 is at low level, so the pMOS transistor 321 is ON, which means that the potential of the node N1 is at high level. Therefore the pMOS transistor 322 is OFF.

Then the input signal IN changes to high level (1.5 volts), which changes the output of the inverter 331 to low level. Therefore the nMOS transistors 325 and 328 turn ON, the nMOS transistors 326 and 330 turn OFF, the pMOS transistor 323 weakly turns ON, and the pMOS transistor 324 strongly turns ON. In this level shift circuit, the nMOS transistors 327 and 328 are disposed in parallel with the nMOS transistor 325, so the capability of emitting the charges stored in the node N1 to the ground line is very high. Therefore even if the pMOS transistor 323 with high current capability is in use, the potential of the node N1 drops to lower level than the ON/OFF threshold level of the pMOS transistor 322. As a result, the pMOS transistor 322 turns ON, and the potential of the node N2 rises to high level (3 volts).

Then the input signal IN changes to low level, which changes the output of the inverter 331 to high level. Therefore the nMOS transistor 325 turns OFF, the nMOS transistors 326 and 330 turn ON, the pMOS transistor 323 strongly turns ON, and the pMOS transistor 324 weakly turns ON. In this level shift circuit, the nMOS transistors 329 and 330 are disposed in parallel with the nMOS transistor 326, so the capability of emitting the charges stored in the node N2 to the ground line is very high. Therefore even if the pMOS transistor 322 with high current capability is in use, the potential of the node N2 drops to lower level than the ON/OFF threshold level of the pMOS transistor 321. By this, the pMOS transistor 321 turns ON. Then the potential of the node N1 becomes high level, and the pMOS transistor 322 turns OFF. As a result, the potential of the node N2 drops to low level.

When the control signal L-SPEED is set to high level in this way, the level shift circuit operates normally even if the pMOS transistor 321 with high current capability is in use. Therefore the speed of the rise and fall operation of the output signal OUT can be increased. Power consumption, however, is high, since the through current increases when the control signal L-SPEED is set to high level.

Now operation of the level shift circuit when the high level potential of the input signal IN and the inverter 319 is 3 volts will be described. In this case, the control signal L-SPEED is set to low level, so the nMOS transistor 327 turns OFF.

When the input signal IN is at low level, the output of the inverter 331 is at high level (3 volts). Therefore the nMOS transistor 325 is OFF, and the nMOS transistor 326 is ON. The pMOS transistor 323 strongly turns ON and the pMOS transistor 324 is OFF. Since the nMOS transistor 326 is ON, the potential of the node N2 is at low level, and the pMOS transistor 321 is ON, so the potential of the node N1 is at high level. As a result, the pMOS transistor 322 is OFF. Since the nMOS transistors 327 and 329 are OFF, the ON/OFF of the nMOS transistors 328 and 330 has no influence on the general operation of the level shift circuit.

Then the input signal IN changes to high level (3 volts), which changes the output of the inverter 331 to low level. Therefore the nMOS transistor 325 turns ON, the nMOS transistor 326 turns OFF, the pMOS transistor 323 turns OFF, and the pMOS transistor 324 strongly turns ON. As a result, the potential of the node N1 becomes zero volts, and the pMOS transistor 322 turns ON. By this, the potential of the node N2 rises to high level (3 volts).

Then the input signal IN changes to low level, which changes the output of the inverter 331 to high level. As a result, the nMOS transistor 325 turns OFF, the nMOS transistor 326 turns ON, the pMOS transistor 323 strongly turns ON, and the pMOS transistor 324 turns OFF. Therefore the potential of the node N2 becomes low level. Then the pMOS transistor 321 turns ON. As a result the potential of the node N1 becomes high level, and the pMOS transistor 322 turns OFF.

When the level shift amount is low or zero in this way, the potential of the nodes N1 and N2 can be decreased to zero volts without using the nMOS transistors 327–330 by turning the pMOS transistors 323 and 324 OFF. As a result, the level shift circuit can accurately operate at high-speed, and power consumption is also low.

Fourth Embodiment

Figure 4A:
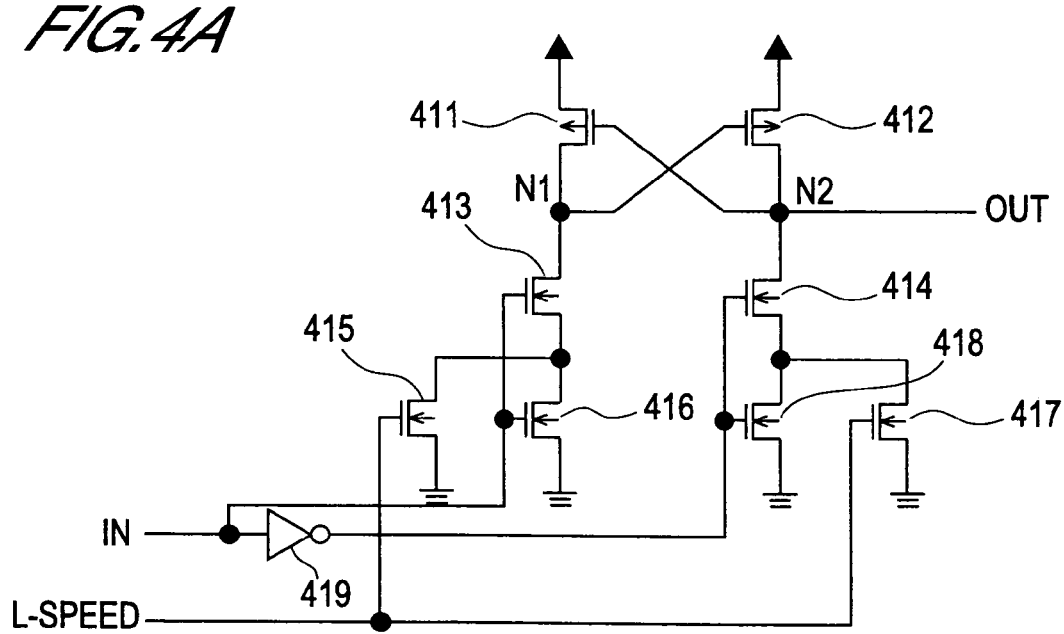
FIG. 4A and FIG. 4B are circuit diagrams depicting the configuration of the level shift circuit according to the fourth embodiment.

FIG. 4A is a circuit diagram depicting the configuration of key components of the level shift circuit according to the present embodiment. As shown in FIG. 4A, this level shift circuit is comprised of the pMOS transistors 411 and 412, the nMOS transistors 413–418, and the inverter 419.

In the pMOS transistor 411, the source is connected to the power supply line, the drain is connected to the node N1, and the gate is connected to the node N2. In order to recharge the node N1 at high-speed, it is preferable that the current capability of the pMOS transistor 411 is sufficiently high.

In the pMOS transistor 412, the source is connected to the power supply line, the drain is connected to the node N2, and the gate is connected to the node N1. In order to recharge the node N2 at high-speed, it is preferable that the current capability of the pMOS transistor 412 is sufficiently high.

In the nMOS transistor 413, the drain is connected to the node N1, and the input signal IN is input from the gate.

In the nMOS transistor 414, the drain is connected to the node N2, and the gate is connected to the output terminal of the inverter 419.

In the nMOS transistor 415, the source is connected to the ground line, the drain is connected to the source of the nMOS transistor 413, and the control signal L-SPEED is input from the gate.

In the nMOS transistor 416, the source is connected to the ground line, the drain is connected to the source of the nMOS transistor 413, and the input signal IN is input from the gate.

In the nMOS transistor 417, the source is connected to the ground line, the drain is connected to the source of the nMOS transistor 414, and the control signal L-SPEED is input from the gate.

In the nMOS transistor 418, the source is connected to the ground line, the drain is connected to the source of the nMOS transistor 414, and the gate is connected to the output terminal of the inverter 419.

The inverter 419 inputs the input signal IN from the input terminal, inverts this signal IN, and outputs it.

In the present embodiment as well, the power supply potential is 3 volts. The high level potential of the input signal IN and the high level potential of the output of the inverter 419 is 1.5 volts or 3 volts.

Operation of the level shift circuit shown in FIG. 4A will now be described.

Initially operation of the level shift circuit when the high level potential of the input signal IN and the inverter 419 is 1.5 volts will be described. In this case, the control signal L-SPEED is set to high level. By this, the nMOS transistors 415 and 417 turn ON.

In this level shift circuit, the output of the inverter 419 is maintained at high level (1.5 volts) when the input signal IN is at low level. Therefore the nMOS transistors 413 and 416 are OFF, and the nMOS transistors 414 and 418 are ON. Since the nMOS transistors 414 and 418 are ON, the potential of the node N2 is maintained at low level. This means that the pMOS transistor 411 is ON, so the potential of the node N1 is at high level. Therefore the pMOS transistor 412 is OFF.

Then the input signal IN changes to high level (1.5 volts), which changes the output of the inverter 419 to low level. By this, the nMOS transistors 413 and 416 turn ON, and the nMOS transistors 414 and 418 turn OFF. At this time, the potential of the node N2 is maintained at zero volts. This means that the pMOS transistor 411 is maintained in the ON state. In other words, the pMOS transistor 411 and the nMOS transistors 413 and 416 are in ON state. In this level shift circuit, the nMOS transistors 415 and 416 are disposed in parallel with the nMOS transistor 413, so the capability of emitting the charges stored in the node N1 to the ground line is very high. Therefore even if a pMOS transistor 411 with high current capability is in use, the potential of the node N1 drops to lower level than the ON/OFF threshold level of the pMOS transistor 412. As a result, the pMOS transistor 412 turns ON, and the potential of the node N2 rises to high level (3 volts). When the current capability of the pMOS transistor 412 is sufficiently high, this recharging can be executed at high-speed. When the potential of the node N2 becomes high level, the pMOS transistor 411 turns OFF, and the potential of the node N1 drops to low level.

Then the input signal IN changes to low level, which changes the output of the inverter 419 to high level. Therefore the nMOS transistors 413 and 416 turn OFF, and the nMOS transistors 414 and 418 turn ON. At this time, the potential of the node N1 is maintained at low level, therefore the pMOS transistor 412 is maintained in the ON state. This means that the pMOS transistor 412 and the nMOS transistors 414, 417 and 418 are in ON state. In this level shift circuit, the nMOS transistors 417 and 418 are disposed in parallel with the nMOS transistor 414, so the capability of emitting the charges stored in the node N2 to the ground line is very high. Therefore even if a pMOS transistor 412 with high current capability is in use, the potential of the node N2 drops to lower level than the ON/OFF threshold level of the pMOS transistor 411. By this, the pMOS transistor 411 turns ON. Then the potential of the node N1 becomes high level, and the pMOS transistor 412 turns OFF. As a result, the potential of the node N2 drops to low level.

When the control signal L-SPEED is set to high level in this way, the level shift circuit operates normally even if the pMOS transistors 411 and 412 with high current capability are in use. Therefore the level shift circuit can execute the rise operation and fall operation at high-speed. Power consumption, however, is high since the through current increases.

Now operation of the level shift circuit when the high level potential of the input signal IN and the inverter 419 is 3 volts will be described. In this case, the control signal L-SPEED is set to low level, so the nMOS transistors 415 and 417 turn OFF.

When the input signal IN is at low level, the output of the inverter 419 is maintained at high level (3 volts). Therefore the nMOS transistors 413 and 416 are OFF, and the nMOS transistors 414 and 418 are ON. Since the nMOS transistors 414 and 418 are ON, the potential of the node N2 is maintained at low level. This means that the pMOS transistor 411 is ON, so the potential of the node N1 is at high level. Therefore the pMOS transistor 412 is OFF. Since the nMOS transistors 415 and 417 are OFF, this has no influence on the general operation of the level shift circuit.

Then the input signal IN changes to high level (3 volts), which changes the output of the inverter 419 to low level. Therefore the nMOS transistors 413 and 416 turn ON, and the nMOS transistors 414 and 418 turn OFF. At this time, the potential of the node N2 is maintained at zero volts. This means that the pMOS transistor 411 is maintained in the ON state. In other words, the pMOS transistor 411 and the nMOS transistors 413 and 416 are in the ON state. In this level shift circuit, the nMOS transistor 415 does not contribute to emitting the charges stored in the node N1. However, the gate potential is 3 volts, so the current capability of the nMOS transistors 413 and 416 is sufficiently high. Therefore the potential of the node N2 drops to lower level than the ON/OFF threshold level of the pMOS transistor 412, even if the current capability of the pMOS transistor 411 is high. As a result, the pMOS transistor 412 turns ON, and the potential of the node N2 rises to high level (3 volts). If the current capability of the pMOS transistor 412 is sufficiently high, this recharging can be executed at high-speed. When the potential of the node N2 becomes high level, the pMOS transistor 411 turns OFF, so the potential of the node N1 drops to low level.

Then the input signal IN changes to low level, which changes the output of the inverter 419 to high level. Therefore the nMOS transistors 413 and 416 turn OFF, and the nMOS transistors 414 and 418 turn ON. At this time, the potential of the node N1 is maintained at low level, therefore the pMOS transistor 412 is maintained in the ON state. By this, the pMOS transistor 412 and the nMOS transistors 414 and 418 are in ON state. In this level shift circuit, the nMOS transistor 417 does not contribute to emitting the charges stored in the node N2. However, the gate potential is 3 volts, so the current capability of the nMOS transistors 414 and 418 is sufficiently high. Therefore the potential of the node N2 drops to lower level than the ON/OFF threshold level of the pMOS transistor 411, even if the current capability of the pMOS transistor 412 is high. By this, the pMOS transistor 411 turns ON. Then the potential of the node N1 rises to high level. If the current capability of the pMOS transistor 412 is sufficiently high, this recharging can be executed at high-speed. When the potential of the node N1 becomes high level, the pMOS transistor 412 turns OFF. As a result, the potential of the node N2 drops to low level.

When the control signal L-SPEED is set to high level in this way, the level shift circuit operates normally, even if the pMOS transistors 411 and 412 with high current capability are in use. In other words, the level shift circuit can execute the rise operation and the fall operation of the output signal OUT at high-speed. Power consumption, however, is high since the through current increases.

Now a variant form of the level shift circuit in accordance with the present invention will be described with reference to FIG. 4B.

Figure 4B:
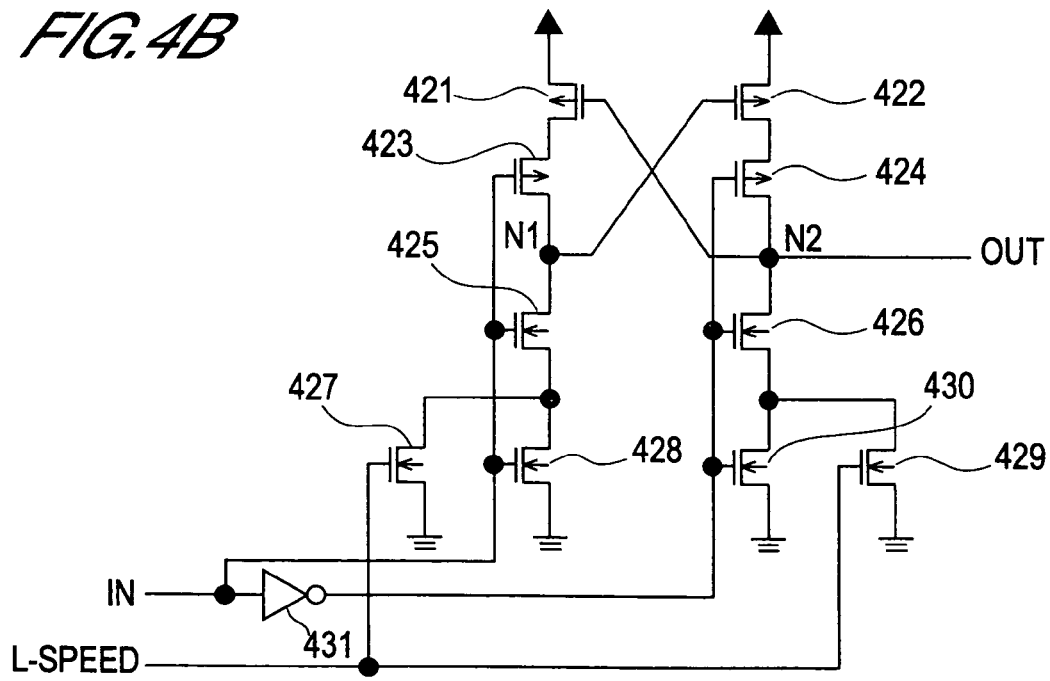

The level shift circuit in FIG. 4B is comprised of the pMOS transistors 421–424, the nMOS transistors 425–430, and the inverter 431.

In the pMOS transistor 421, the source is connected to the power supply line, and the gate is connected to the node N2. In order to recharge the node N1 at high-speed, it is preferable that the current capability of the pMOS transistor 421 is sufficiently high.

In the pMOS transistor 422, the source is connected to the power supply line, and the gate is connected to the node N1. In order to recharge the node N2 at high-speed, it is preferable that the current capability of the pMOS transistor 422 is sufficiently high.

In the pMOS transistor 423, the source is connected to the drain of the pMOS transistor 421, the drain is connected to the node N1, and the input signal IN is input from the gate. The pMOS transistor 423 strongly turns ON when the gate potential is zero volts, weakly turns ON when the gate potential is 1.5 volts, and turns OFF when the gate potential is 3 volts.

In the pMOS transistor 424, the source is connected to the drain of the pMOS transistor 422, the drain is connected to the node N2, and the gate is connected to the output terminal of the inverter 431. The pMOS transistor 424 strongly turns ON when the gate potential is zero volts, weakly turns ON when the gate potential is 1.5 volts, and turns OFF when the gate potential is 3 volts.

In the nMOS transistor 425, the drain is connected to the node N1, and the input signal IN is input from the gate.

In the nMOS transistor 426, the drain is connected to the node N2, and the gate is connected to the output terminal of the inverter 431.

In the nMOS transistor 427, the source is connected to the ground line, the drain is connected to the source of the nMOS transistor 425, and the control signal L-SPEED is input from the gate.

In the nMOS transistor 428, the source is connected to the ground line, the drain is connected to the source of the MOS transistor 425, and the input signal IN is input from the gate.

In the nMOS transistor 429, the source is connected to the ground line, the drain is connected to the source of the nMOS transistor 426, and the control signal L-SPEED is input from the gate.

In the nMOS transistor 430, the source is connected to the ground line, the drain is connected to the source of the nMOS transistor 426, and the gate is connected to the output terminal of the inverter 431.

The inverter 431 inputs the input signal IN from the input terminal, inverts this signal IN, and outputs it.

In the level shift circuit in FIG. 4B as well, the potential supplied from the power supply line is 3 volts. The high level potential of the input signal IN and the high level potential of the output of the inverter 431 is 1.5 volts or 3 volts.

Initially operation of the level shift circuit when the high level potential of the input signal IN and the inverter 431 is 1.5 volts will be described. In this case, the control signal L-SPEED is set to high level. By this, the nMOS transistors 427 and 429 turn ON.

When the input signal IN is at low level, the output of the inverter 431 is at high level (1.5 volts). Therefore the nMOS transistors 425 and 428 are OFF, and the nMOS transistors 426 and 430 are ON. The pMOS transistor 423 strongly turns ON, and the pMOS transistor 424 weakly turns ON. Since the nMOS transistors 426 and 430 are ON, the potential of the node N2 is at low level, and the pMOS transistor 421 is ON, so the potential of the node N1 is at high level. As a result, the pMOS transistor 422 is OFF.

Then the input signal IN changes to high level (1.5 volts), which changes the output of the inverter 431 to low level. By this, the nMOS transistors 425 and 428 turn ON, the nMOS transistors 426 and 430 turn OFF, the pMOS transistor 423 weakly turns ON, and the pMOS transistor 424 strongly turns ON. In this level shift circuit, the nMOS transistors 427 and 428 are disposed in parallel with the source of the nMOS transistor 425, so the capability of emitting the charges stored in the node N1 to the ground line is very high. Therefore even if a pMOS transistor 423 with high current capability is in use, the potential of the node N1 drops to lower level than the ON/OFF threshold level of the pMOS transistor 412. When the potential of the node N1 drops to lower level than the ON/OFF threshold level of the pMOS transistor 422, the pMOS transistor 422 turns ON, and the potential of the node N2 rises to high level (3 volts).

Then the input signal IN changes to low level, which changes the output of the inverter 431 to high level. Therefore the nMOS transistor 425 and 428 turn OFF, the nMOS transistors 426 and 430 turn ON, the pMOS transistor 423 strongly turns ON, and the pMOS transistor 424 weakly turns ON. In this level shift circuit, the nMOS transistors 429 and 430 are connected in parallel with the source of the nMOS transistor 426, so the capability of emitting the charges stored in the node N2 to the ground line is very high. Therefore even if a pMOS transistor 422 with high current capability is in use, the potential of the node N2 drops to lower level than the ON/OFF threshold level of the pMOS transistor 421. By this, the pMOS transistor 421 turns ON. Then the potential of the node N1 becomes high level, and the pMOS transistor 422 turns OFF. As a result, the potential of the node N2 drops to low level.

When the control signal L-SPEED is set to high level in this way, the level shift circuit operates normally, even if a pMOS transistor 421 and 422 with high current capability is in use. In other words, the level shift circuit in accordance with the present embodiment can use the pMOS transistors 421 and 422 with high current capability, and can increase the speed of the rise operation and the fall operation of the output signal OUT. Power consumption, however, is high, since the through current increases when the control signal L-SPEED is set to high level.

Now operation of the level shift circuit when the high level potential of the input signal IN and the inverter 431 is 3 volts will be described. In this case, the control signal L-SPEED is set to low level, so the nMOS transistor 427 and 429 turn OFF.

When the input signal IN is at low level, the output of the inverter 431 is at high level (3 volts). Therefore the nMOS transistors 425 and 428 are OFF, and the nMOS transistors 426 and 430 are ON. The pMOS transistor 423 strongly turns ON, and the pMOS transistor 424 turns OFF. Since the nMOS transistors 426 and 430 are ON, the potential of the node N2 is at low level, and the pMOS transistor 421 is ON, so the potential of the node N1 is at high level. As a result, the pMOS transistor 422 is OFF. Since the nMOS transistors 427 and 429 are OFF, this has no influence on the general operation of the level shift circuit.

Then the input signal IN changes to high level (3 volts), which changes the output of the inverter 431 to low level. Therefore the nMOS transistors 425 and 428 turn ON, the nMOS transistors 426 and 430 turn OFF, the pMOS transistor 423 turns OFF, and the pMOS transistor 424 strongly turns ON. By this, the potential of the node N1 becomes zero volts, and the pMOS transistor 422 turns ON. As a result, the potential of the node N2 rises to high level (3 volts).

Then the input signal IN changes to low level, which changes the output of the inverter 431 to high level. Therefore the nMOS transistors 425 and 428 turn OFF, the nMOS transistors 426 and 430 turn ON, the pMOS transistor 423 strongly turns ON, and the pMOS transistor 424 turns OFF. Therefore the potential of the node N2 becomes low level. Then the pMOS transistor 421 turns ON. By this, the potential of the node N1 becomes high level, and the pMOS transistor 422 turns OFF.

When the level shift amount is low or zero in this way, the pMOS transistors 423 and 424 can be turned OFF, and the potential of the nodes N1 and N2 can be decreased to zero volts without using the nMOS transistors 427–430. As a result, the level shift circuit can accurately operate at high-speed, and power consumption is also low.

Fifth Embodiment

Figure 5A:
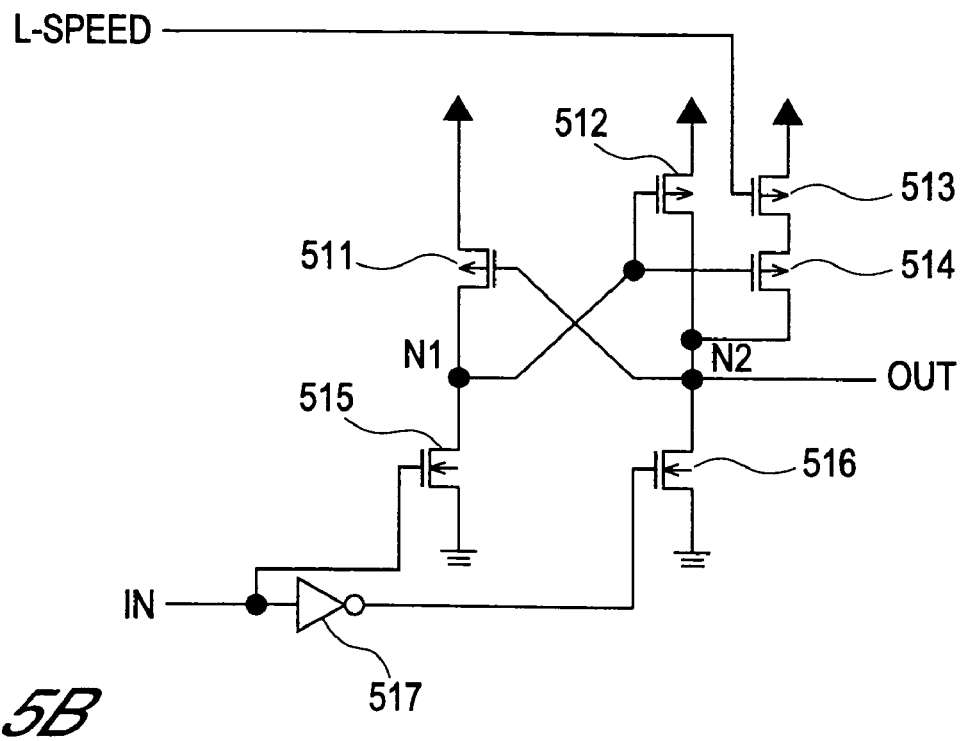
FIG. 5A and FIG. 5B are circuit diagrams depicting the configuration of the level shift circuit according to the fifth embodiment.

FIG. 5A is a circuit diagram depicting the configuration of key components of the level shift circuit according to the present embodiment. As shown in FIG. 5A, this level shift circuit is comprised of the pMOS transistors 511–514, the nMOS transistors 515 and 516, and the inverter 517.

In the pMOS transistor 511, the source is connected to the power supply line, the drain is connected to the node N1, and the gate is connected to the node N2.

In the pMOS transistor 512, the source is connected to the power supply line, the drain is connected to the node N2, and the gate is connected to the node N1.

In the pMOS transistor 513, the source is connected to the power supply line, and the control signal L-SPEED is input from the gate.

In the pMOS transistor 514, the source is connected to the drain of the pMOS transistor 513, the drain is connected to the node N2, and the gate is connected to the node N1.

In the nMOS transistor 515, the source is connected to the ground line, the drain is connected to the node N1, and the input signal IN is input from the gate.

In the nMOS transistor 516, the source is connected to the ground line, the drain is connected to the node N2, and the gate is connected to the output terminal of the inverter 517.

The inverter 517 inputs the input signal IN from the input terminal, inverts this signal IN, and outputs it.

In the present embodiment, the power supply potential is 3 volts. The high level potential of the input signal IN and the high level potential of the output of the inverter 517 is 1.5 volts or 3 volts.

Operation of the level shift circuit shown in FIG. 5A will now be described.

Initially operation of the level shift circuit when the high level potential of the input signal IN and the inverter 517 is 1.5 volts will be described. In this case, the control signal L-SPEED is set to high level. By this, the pMOS transistor 513 turns OFF.

When the input signal IN is at low level, the output of the inverter 517 is maintained at high level (1.5 volts). Therefore the nMOS transistor 515 is OFF, and the nMOS transistor 516 is ON. Since the nMOS transistor 516 is ON, the potential of the node N2 is maintained at low level. This means that the pMOS transistor 511 is ON, so the potential of the node N1 is at high level. Therefore the pMOS transistor 512 is OFF. Since the nMOS transistor 513 is OFF, the ON/OFF of the nMOS transistor 514 has no influence on the general operation of the level shift circuit.

Then the input signal IN changes to high level (1.5 volts), which changes the output of the inverter 517 to low level. Therefore the nMOS transistor 515 turns ON, and the nMOS transistor 516 turns OFF. At this time, the potential of the node N2 is maintained at zero volts. This means that the pMOS transistor 511 is maintained in the ON state. Then the potential of the node N1 drops to lower level than the ON/OFF threshold level of the pMOS transistor 512, and the pMOS transistor 512 turns ON. By this, the potential of the node N2 rises to high level (3 volts). As a result, the pMOS transistor 511 turns OFF, and the potential of the node N1 drops to low level.

Then the input signal IN changes to low level, which changes the output of the inverter 517 to high level. Therefore the nMOS transistor 515 turns OFF, and the nMOS transistor 516 turns ON. At this time, the potential of the node N1 is maintained at low level, and the pMOS transistor 512 is maintained in the ON state. By this, both the pMOS transistor 512 and the nMOS transistor 514 become ON state. Then the potential of the node N2 drops to lower level than the ON/OFF threshold level of the pMOS transistor 511, and the pMOS transistor 511 turns ON. By this, the potential of the node N1 becomes high level, and the pMOS transistor 512 turns OFF. As a result, the potential of the node N2 drops to low level.

According to the present embodiment, when the control signal L-SPEED is set to high level in this way, the speed of the rise operation of the output signal OUT is not increased since the pMOS transistors 513 and 514 are not in use. However, the level shift circuit can be operated normally even if the level shift amount is high, and power consumption is low since the through current is low.

Now operation of the level shift circuit when the high level potential of the input signal IN and the inverter 517 is 3 volts will be described. In this case, the control signal L-SPEED is set to low level, so the nMOS transistor 513 turns ON.

In this level shift circuit, the output of the inverter 517 is maintained at high level (3 volts) when the input signal IN is at low level. Therefore the nMOS transistor 515 is OFF, and the nMOS transistor 516 is ON. Since the nMOS transistor 516 is ON, the potential of the node N2 is maintained at low level. This means that the pMOS transistor 511 is ON, so the potential of the node N1 is at high level. Therefore the pMOS transistors 512 and 514 are OFF.

Then the input signal IN changes to high level (3 volts), which changes the output of the inverter 517 to low level. Therefore the nMOS transistor 515 turns ON, and the nMOS transistor 516 turns OFF. At this time, the potential of the node N2 is maintained at zero volts. This means that the pMOS transistor 511 is maintained in the ON state. In other words, both the pMOS transistor 511 and the nMOS transistor 515 are ON. Then the potential of the node N1 drops to lower level than the ON/OFF threshold level of the pMOS transistor 512. By this, the pMOS transistors 512 and 514 turn ON, and the potential of the node N2 rises to high level (3 volts). According to the present embodiment, the node N2 is recharged by the two pMOS transistors 512 and 514, so the potential of the node N2 rises at high-speed. When the potential of the node N2 becomes high level, the pMOS transistor 511 turns OFF, and the potential of the node N1 drops to low level.

Then the input signal IN changes to low level, which changes the output of the inverter 517 to high level. Therefore the nMOS transistor 515 turns OFF, and the nMOS transistor 516 turns ON. At this time, the potential of the node N1 is maintained at low level, therefore the pMOS transistors 512 and 514 are maintained in the ON state. By this, the pMOS transistors 512 and 514, and the nMOS transistor 516 are in ON state. Since the gate potential here is 3 volts, the current capability of the nMOS transistor 516 is sufficiently high. Therefore the potential of the node N2 drops to lower level than the ON/OFF threshold level of the pMOS transistor 511. By this, the pMOS transistor 511 turns ON. Then the potential of the node N1 becomes high level, and the pMOS transistors 512 and 514 turn OFF. As a result, the potential of the node N2 drops to low level.

When the control signal L-SPEED is set to low level in this way, the level shift amount cannot be increased very much, but the recharging capability to the node N2 can be increased, therefore the speed of the rise operation of the output signal OUT can be increased.

Now a variant form of the level shift circuit in accordance with the present invention will be described with reference to FIG. 5B.

Figure 5B:
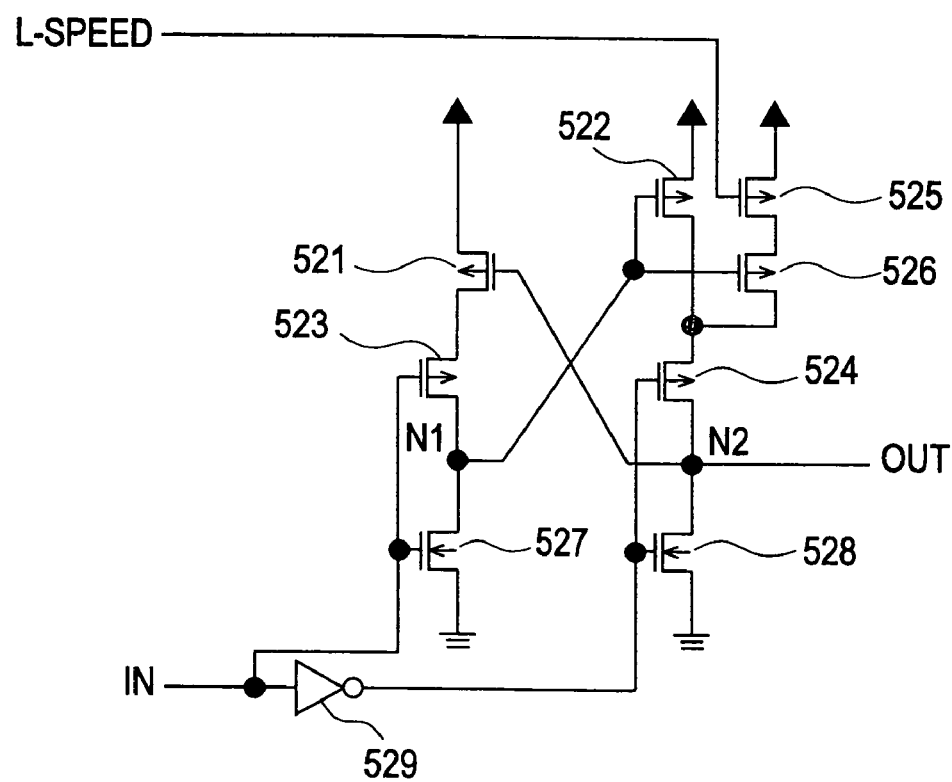

The level shift circuit in FIG. 5B is comprised of the pMOS transistors 521–526, the nMOS transistors 527 and 528, and the inverter 529.

In the pMOS transistor 521, the source is connected to the power supply line, and the gate is connected to the node N2.

In the pMOS transistor 522, the source is connected to the power supply line, and the gate is connected to the node N1.

In the pMOS transistor 523, the source is connected to the drain of the pMOS transistor 521, the drain is connected to the node N1, and the input signal IN is input from the gate. This pMOS transistor 523 strongly turns ON when the gate potential is zero volts, weakly turns ON when the gate potential is 1.5 volts, and turns OFF when the gate potential is 3 volts.

In the pMOS transistor 524, the source is connected to the drain of the pMOS transistor 522, the drain is connected to the node N2, and the gate is connected to the output terminal of the inverter 529. The pMOS transistor 524 strongly turns ON when the gate potential is zero volts, weakly turns ON when the gate potential is 1.5 volts, and turns OFF when the gate potential is 3 volts.

In the pMOS transistor 525, the source is connected to the power supply line, and the control signal L-SPEED is input from the gate.

In the pMOS transistor 526, the source is connected to the drain of the pMOS transistor 525, the drain is connected to the source of the pMOS transistor 524, and the gate is connected to the node N1.

In the nMOS transistor 527, the source is connected to the ground line, the drain is connected to the node N1, and the input signal IN is input from the gate.

In the nMOS transistor 528, the source is connected to the ground line, the drain is connected to the node N2, and the gate is connected to the output terminal of the inverter 529.

The inverter 529 inputs the input signal IN from the input terminal, inverts this signal IN, and outputs it.

In the level shift circuit in FIG. 5B as well, the power supply potential is 3 volts. The high level potential of the input signal IN and the high level potential of the inverter 529 is 1.5 volts or 3 volts.

Initially operation of the level shift circuit when the high level potential of the input signal IN and the inverter 529 is 1.5 volts will be described. In this case, the control signal L-SPEED is set to high level. By this, the nMOS transistor 525 turns OFF.

When the input signal IN is at low level, the output of the inverter 529 is at high level (1.5 volts). Therefore the nMOS transistor 527 is OFF, and the nMOS transistor 528 is ON. The pMOS transistor 523 strongly turns ON, and the pMOS transistor 524 weakly turns ON. Since the nMOS transistor 528 is ON, the potential of the node N2 is at low level, and the pMOS transistor 521 is ON, so the potential of the node N1 is at high level. Therefore the pMOS transistor 522 is OFF.

Then the input signal IN changes to high level (1.5 volts), which changes the output of the inverter 529 to low level. By this, the nMOS transistor 527 turns ON, the nMOS transistor 528 turns OFF, the pMOS transistor 523 weakly turns ON, and the pMOS transistor 524 strongly turns ON. When the potential of the node N1 drops to lower level than the ON/OFF threshold level of the pMOS transistor 522, the pMOS transistor 522 turns ON. Therefore the potential of the node N2 rises to high level (3 volts). Since the pMOS transistor 525 is OFF, the ON/OFF of the pMOS transistor 526 has no influence on the general operation of the level shift circuit.

Then the input signal IN changes to low level, which changes the output of the inverter 529 to high level. Therefore the nMOS transistor 527 turns OFF, the nMOS transistor 528 turns ON, the pMOS transistor 523 strongly turns ON, and the pMOS transistor 524 weakly turns ON. By this, the pMOS transistors 522 and 524, and the nMOS transistor 528 turn ON. And the potential of the node N2 drops to lower level than the ON/OFF threshold level of the pMOS transistor 521. By this, the pMOS transistor 521 turns ON. Then the potential of the node N1 becomes high level, and the pMOS transistor 522 turns OFF. As a result, the potential of the node N2 drops to low level.

When the control signal L-SPEED is set to high level in this way, the speed of the rise operation of the output signal OUT is not increased since the pMOS transistors 525 and 526 are not in use. However, the level shift circuit can be operated normally even if the level shift amount is high, and power consumption is low since the through current is low.

Now operation of the level shift circuit when the high level potential of the input signal IN and the inverter 529 is 3 volts will be described. In this case, the control signal L-SPEED is set to low level, so the nMOS transistor 525 turns ON.

When the input signal IN is at low level, the output of the inverter 529 is at high level (3 volts). Therefore the nMOS transistor 527 is OFF, and the nMOS transistor 528 is ON. The pMOS transistor 523 strongly turns ON, and the pMOS transistor 524 is OFF. Since the nMOS transistor 528 is ON, the potential of the node N2 is low level. Therefore the pMOS transistor 521 is ON, and the potential of the node N1 is at high level. As a result, the pMOS transistors 522 and 526 are OFF.

Then the input signal IN changes to high level (3 volts), which changes the output of the inverter 529 to low level. Therefore the nMOS transistor 527 turns ON, the nMOS transistor 528 turns OFF, the pMOS transistor 523 turns OFF, and the pMOS transistor 524 strongly turns ON. By this, the potential of the node N1 becomes zero volts, and the pMOS transistors 522 and 526 turn ON. Then the potential of the node N2 rises to high level (3 volts). According to the present embodiment, the node N2 is recharged by the two pMOS transistors 522 and 526, so the potential of the node N2 rises at high-speed. When the potential of the node N2 becomes high level, the pMOS transistor 521 turns OFF.

Then the input signal IN changes to low level, which changes the output of the inverter 529 to high level. Therefore the nMOS transistor 527 turns OFF, the nMOS transistor 528 turns ON, the pMOS transistor 523 strongly turns ON, and the pMOS transistor 524 turns OFF. By this, the potential of the node N2 becomes zero volts. Then the pMOS transistor 521 turns ON. By this, the potential of the node N1 becomes high level, and the pMOS transistor 522 turns OFF.

When the control signal L-SPEED is set to low level in this way, the level shift amount cannot be increased very much, but the recharging capability of the node N2 can be increased, therefore the speed of the rise operation of the output signal OUT can be increased.

Sixth Embodiment

Figure 6A:
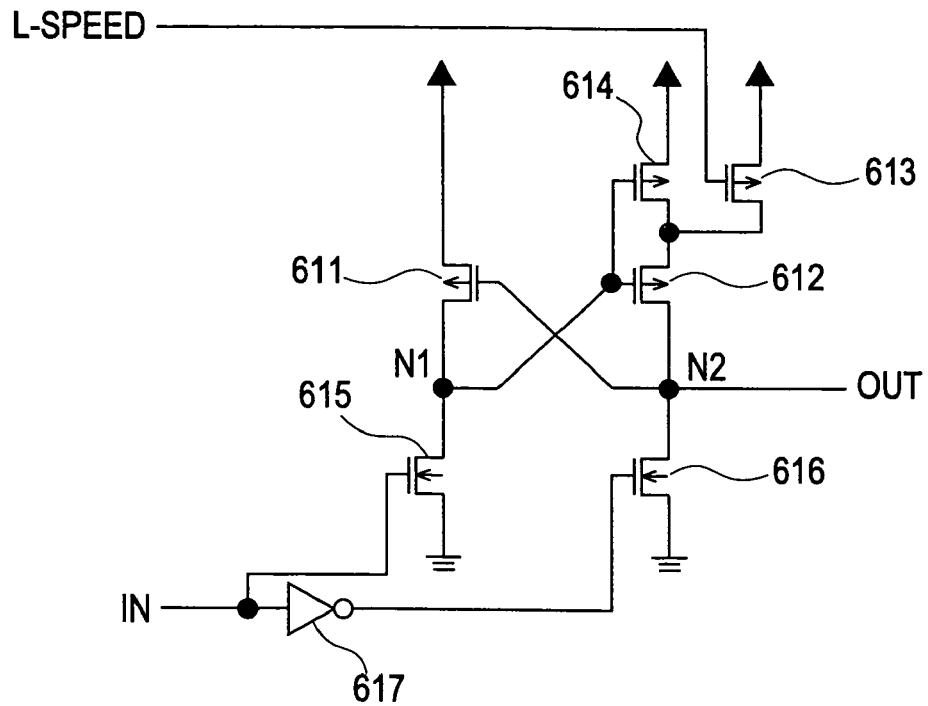
FIG. 6A and FIG. 6B are circuit diagrams depicting the configuration of the level shift circuit according to the sixth embodiment.

FIG. 6A is a circuit diagram depicting the configuration of key components of the level shift circuit according to the present embodiment. As shown in FIG. 6A, this level shift circuit is comprised of the pMOS transistors 611–614, the nMOS transistors 615 and 616, and the inverter 617.

In the pMOS transistor 611, the source is connected to the power supply line, the drain is connected to the node N1, and the gate is connected to the node N2.

In the pMOS transistor 612, the drain is connected to the node N2, and the gate is connected to the node N1.

In the pMOS transistor 613, the source is connected to the power supply line, the drain is connected to the source of the pMOS transistor 612, and the control signal L-SPEED is input from the gate.

In the pMOS transistor 614, the source is connected to the power supply line, the drain is connected to the source of the pMOS transistor 612, and the gate is connected to the node N1.

In the nMOS transistor 615, the source is connected to the ground line, the drain is connected to the node N1, and the input signal IN is input from the gate.

In the nMOS transistor 616, the source is connected to the ground line, the drain is connected to the node N2, and the gate is connected to the output terminal of the inverter 617.

The inverter 617 inputs the input signal IN from the input terminal, inverts this signal IN, and outputs it.

According to the present embodiment, the power supply potential is 3 volts. The high level potential of the input signal IN and the high level potential of the output of the inverter 617 is 1.5 volts or 3 volts.

Operation of the level shift circuit shown in FIG. 6A will now be described.

Initially operation of the level shift circuit when the high level potential of the input signal IN and the inverter 617 is 1.5 volts will be described. In this case, the control signal L-SPEED is set to high level. By this, the pMOS transistor 613 turns OFF.

When the input signal IN is at low level, the output of the inverter 617 is maintained at high level (1.5 volts). Therefore the nMOS transistor 615 is OFF, and the nMOS transistor 616 is ON. Since the nMOS transistor 616 is ON, the potential of the node N2 is maintained at low level. This means that the pMOS transistor 611 is ON, and the potential of the node N1 is at high level. Therefore the pMOS transistors 612 and 614 are OFF. Since the nMOS transistor 613 is OFF, this has no influence on the general operation of the level shift circuit.

Then the input signal IN changes to high level (1.5 volts), which changes the output of the inverter 617 to low level. Therefore the nMOS transistor 615 turns ON, and the nMOS transistor 616 turns OFF. At this time, the potential of the node N2 is maintained at zero volts. This means that the pMOS transistor 611 is maintained in the ON state. When the potential of the node N1 drops to lower level than the ON/OFF threshold level of the pMOS transistor 612, the pMOS transistors 612 and 614 turn ON, and the potential of the node N2 rises to high level (3 volts). By this, the pMOS transistor 611 turns OFF, and the potential of the node N1 drops to low level.

Then the input signal IN changes to low level, which changes the output of the inverter 617 to high level. Therefore the nMOS transistor 615 turns OFF, and the nMOS transistor 616 turns ON. At this time, the potential of the node N1 is maintained at low level, and the pMOS transistors 612 and 614 are maintained in the ON state. By this, both the pMOS transistor 612 and the nMOS transistor 614 become ON state. When the potential of the node N2 drops to lower level than the ON/OFF threshold level of the pMOS transistor 611, the pMOS transistor 611 turns ON. By this, the potential of the node N1 becomes high level, and the pMOS transistors 612 and 614 turn OFF. As a result, the potential of the node N2 drops to low level.

When the control signal L-SPEED is set to high level in this way, the speed of the rise operation of the output signal OUT is not increased since the pMOS transistor 613 is not in use. However, the level shift circuit can be operated normally even if the level shift amount is high, and power consumption is low since the through current is low.

Now the operation of the level shift circuit when the high level potential of the input signal IN and the inverter 617 is 3 volts will be described. In this case, the control signal L-SPEED is set to low level, so the pMOS transistor 613 turns ON.

In this level shift circuit, the output of the inverter 617 is maintained at high level (3 volts) when the input signal IN is at low level. Therefore the nMOS transistor 615 is OFF, and the nMOS transistor 616 is ON. Since the nMOS transistor 616 is ON, the potential of the node N2 is maintained at low level. This means that the pMOS transistor 611 is ON, so the potential of the node N1 is at high level. Therefore the pMOS transistors 612 and 614 are OFF.

Then the input signal IN changes to high level (3 volts), which changes the output of the inverter 617 to low level. Therefore the nMOS transistor 615 turns ON, and the nMOS transistor 616 turns OFF. At this time, the potential of the node N2 is maintained at zero volts. This means that the pMOS transistor 611 is maintained in ON state. In other words, both the pMOS transistor 611 and the nMOS transistor 615 are in the ON state. Then the potential of the node N1 drops to lower level than the ON/OFF threshold level of the pMOS transistor 612. By this, the pMOS transistors 612 and 614 turn ON, and the potential of the node N2 rises to high level (3 volts). According to the present embodiment, the potential of the node N2, that is, the output signal OUT, rises at high-speed since the current is supplied from two pMOS transistors 613 and 614 to the source of the pMOS transistor 612. When the potential of the node N2 becomes high level, the pMOS transistor 611 turns OFF, and the potential of the node N1 drops to low level.

Then the input signal IN changes to low level, which changes the output of the inverter 617 to high level. Therefore the nMOS transistor 615 turns OFF, and the nMOS transistor 616 turns ON. At this time, the potential of the node N1 is maintained at low level, therefore the pMOS transistors 612 and 614 are maintained in the ON state. By this, the pMOS transistors 612, 613 and 614 and the nMOS transistor 616 turn ON. Since the gate potential is 3 volts, the current capability of the nMOS transistor 616 is sufficiently high. Therefore the potential of the node N2 drops to lower level than the ON/OFF-threshold level of the pMOS transistor 611. The pMOS transistor 611 is thereby turned ON. By this, the potential of the node N1 becomes high level, and the pMOS transistors 612 and 614 turn OFF. As a result, the potential of the node N2 drops to low level.

When the control signal L-SPEED is set to low level in this way, the level shift amount cannot be increased very much, but the recharging capability to the node N2 can be increased. Therefore the speed of the rise operation of the output signal OUT can be increased.

Now a variant form of the level shift circuit in accordance to the present invention will be described with reference to FIG. 6B.

Figure 6B:
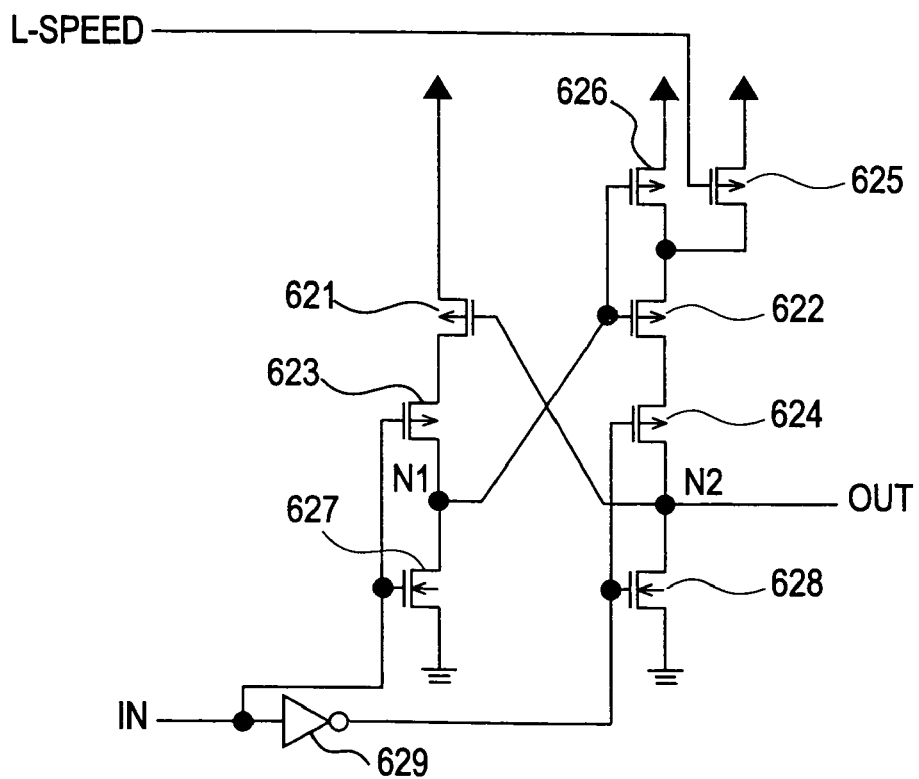

The level shift circuit in FIG. 6B is comprised of the pMOS transistors 621–626, the nMOS transistors 627 and 628, and the inverter 629.

In the pMOS transistor 621, the source is connected to the power supply line, and the gate is connected to the node N2.

In the pMOS transistor 622, the gate is connected to the node N1.

In the pMOS transistor 623, the source is connected to the drain of the pMOS transistor 621, the drain is connected to the node N1, and the input signal IN is input from the gate. The pMOS transistor 623 strongly turns ON when the gate potential is zero volts, weakly turns ON when the gate potential is 1.5 volts, and turns OFF when the gate potential is 3 volts.

In the pMOS transistor 624, the source is connected to the drain of the pMOS transistor 622, the drain is connected to the node N2, and the gate is connected to the output terminal of the inverter 629. The pMOS transistor 624 strongly turns ON when the gate potential is zero volts, weakly turns ON when the gate potential is 1.5 volts, and turns OFF when the gate potential is 3 volts.

In the pMOS transistor 625, the source is connected to the power supply line, the drain is connected to the source of the pMOS transistor 622, and the control signal L-SPEED is input from the gate.

In the pMOS transistor 626, the source is connected to the power supply line, the drain is connected to the source of the pMOS transistor 622, and the gate is connected to the node N1.

In the nMOS transistor 627, the source is connected to the ground line, the drain is connected to the node N1, and the input signal IN is input from the gate.

In the nMOS transistor 628, the source is connected to the ground line, the drain is connected to the node N2, and the gate is connected to the output terminal of the inverter 629.

The inverter 629 inputs the input signal IN from the input terminal, inverts this signal IN, and outputs it.

In the level shift circuit in FIG. 6B as well, the power supply potential is 3 volts. The high level potential of the input signal IN and the high level potential of the inverter 629 is 1.5 volts or 3 volts.

Initially operation of the level shift circuit when the high level potential of the input signal IN and the inverter 629 is 1.5 volts will be described. In this case, the control signal L-SPEED is set to high level. By this, the nMOS transistor 625 turns OFF.

When the input signal IN is at low level, the output of the inverter 629 is at high level (1.5 volts). Therefore the nMOS transistor 627 is OFF, and the nMOS transistor 628 is ON. The pMOS transistor 623 strongly turns ON, and the pMOS transistor 624 weakly turns ON. Since the nMOS transistor 628 is ON, the potential of the node N2 is at low level, and the pMOS transistor 621 is ON, so the potential of the node N1 is at high level. Therefore the pMOS transistors 622 and 626 are OFF.

Then the input signal IN changes to high level (1.5 volts), which changes the output of the inverter 629 to low level. By this, the nMOS transistor 627 turns ON, the nMOS transistor 628 turns OFF, the pMOS transistor 623 weakly turns ON, and the pMOS transistor 624 strongly turns ON. When the potential of the node N1 drops to lower level than the ON/OFF threshold level of the pMOS transistor 622, the pMOS transistors 622 and 626 turn ON. When the pMOS transistors 622 and 626 turn ON, the potential of the node N2 rises to high level (3 volts). Since the pMOS transistor 625 is OFF, this has no influence on the general operation of the level shift circuit.

Then the input signal IN changes to low level, which changes the output of the inverter 629 to high level. Therefore the nMOS transistor 627 turns OFF, the nMOS transistor 628 turns ON, the pMOS transistor 623 strongly turns ON, and the pMOS transistor 624 weakly turns ON. By this, the pMOS transistors 622, 624 and 626 and the nMOS transistor 628 turn ON. Then the potential of the node N2 drops to lower level than the ON/OFF threshold level of the pMOS transistor 621. By this, the pMOS transistor 621 turns ON. As a result, the potential of the node N1 becomes high level, and the pMOS transistor 622 turns OFF. Therefore the potential of the node N2 drops to low level.

When the control signal L-SPEED is set to high level in this way, the speed of the rise operation of the output signal OUT is not increased since the pMOS transistor 625 is not in use. However, the level shift circuit can operate normally even if the level shift amount is high, and power consumption is low since the through current is low.

Now operation of the level shift circuit when the high level potential of the input signal IN and the inverter 627 is 3 volts will be described. In this case, the control signal L-SPEED is set to low level, so the nMOS transistor 625 turns ON.

When the input signal IN is at low level, the output of the inverter 629 is at high level (3 volts). Therefore the nMOS transistor 627 is OFF, and the nMOS transistor 628 is ON. The pMOS transistor 623 strongly turns ON, and the pMOS transistor 624 is OFF. Since the nMOS transistor 628 is ON, the potential of the node N2 is low level, the pMOS transistor 621 is ON. Therefore the potential of the node N1 is at high level. As a result, the pMOS transistors 622 and 626 are OFF.

Then the input signal IN changes to high level (3 volts), which changes the output of the inverter 629 to low level. Therefore the nMOS transistor 627 turns ON, the nMOS transistor 628 turns OFF, the pMOS transistor 623 turns OFF, and the pMOS transistor 624 strongly turns ON. By this, the potential of the node N1 becomes zero volts, and the pMOS transistors 622 and 626 turn ON. As a result, the potential of the node N2 rises to high level (3 volts). According to the present embodiment, the potential of the node N2 rises at high-speed since current is supplied to the source of the pMOS transistor 622 by the two pMOS transistors 625 and 626. When the potential of the node N2 becomes high level, the pMOS transistor 621 turns OFF.

Then the input signal IN changes to low level, which changes the output of the inverter 629 to high level. Therefore the nMOS transistor 627 turns OFF, the nMOS transistor 628 turns ON, the pMOS transistor 623 strongly turns ON, and the pMOS transistor 624 turns OFF. By this, the potential of the node N2 becomes zero volts. Then the pMOS transistor 621 turns ON. By this, the potential of the node N1 becomes high level, and the pMOS transistor 622 turns OFF.

When the control signal L-SPEED is set to low level in this way, the level shift amount cannot be increased very much, but the recharging capability of the node N2 can be increased, therefore the speed of the rise operation of the output signal OUT can be increased.

Seventh Embodiment

Figure 7A:
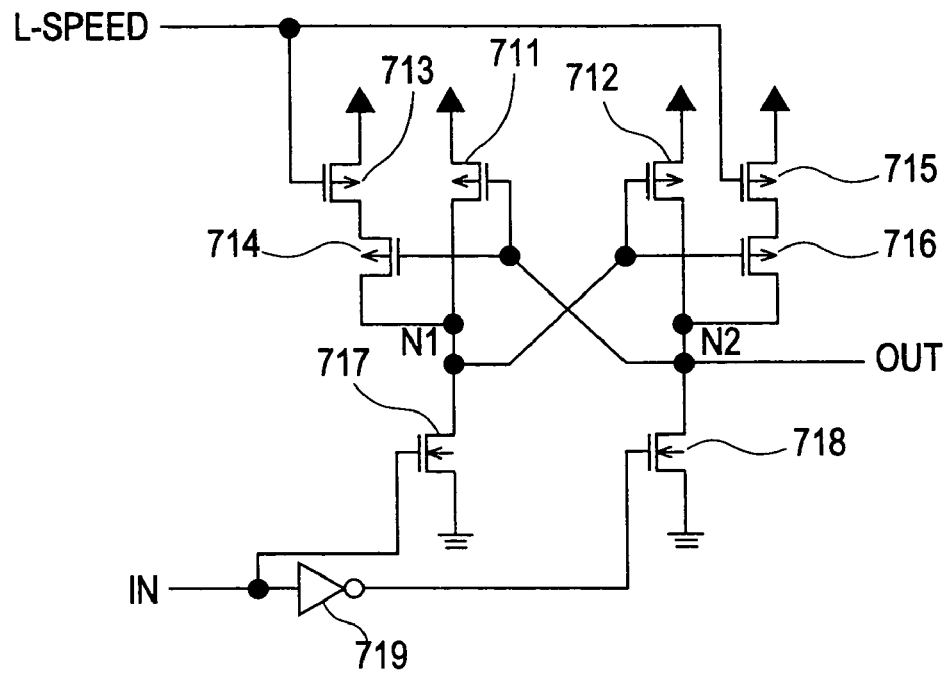
FIG. 7A and FIG. 7B are circuit diagrams depicting the configuration of the level shift circuit according to the seventh embodiment.

FIG. 7A is a current diagram depicting the configuration of key components of the level shift circuit according to the present embodiment. As shown in FIG. 7A, this level shift circuit is comprised of the pMOS transistors 711–716, the nMOS transistors 717 and 718, and the inverter 719.

In the pMOS transistor 711, the source is connected to the power supply line, the drain is connected to the node N1, and the gate is connected to the node N2.

In the pMOS transistor 712, the source is connected to the power supply line, the drain is connected to the node N2, and the gate is connected to the node N1.

In the pMOS transistor 713, the source is connected to the power supply line, and the control signal L-SPEED is input from the gate.

In the pMOS transistor 714, the source is connected to the drain of the pMOS transistor 713, the drain is connected to the node N1, and the gate is connected to the node N2.

In the pMOS transistor 715, the source is connected to the power supply line, and the control signal L-SPEED is input from the gate.

In the pMOS transistor 716, the source is connected to the drain of the pMOS transistor 715, the drain is connected to the node N2, and the gate is connected to the node N1.

In the nMOS transistor 717, the source is connected to the ground line, the drain is connected to the node N1, and the input signal IN is input from the gate.

In the nMOS transistor 718, the source is connected to the ground line, the drain is connected to the node N2, and the gate is connected to the output terminal of the inverter 719.

The inverter 719 inputs the input signal IN from the input terminal, inverts this signal IN, and outputs it.

According to the present invention, the power supply potential is 3 volts. The high level potential of the input signal IN and the high level potential of the output of the inverter 719 is 1.5 volts or 3 volts.

Operation of the level shift circuit shown in FIG. 7A will now be described.

Initially operation of the level shift circuit when the high level potential of the input signal IN and the inverter 719 is 1.5 volts will be described. In this case, the control signal L-SPEED is set to high level. By this, the pMOS transistors 713 and 715 turn OFF.

When the input signal IN is at low level, the output of the inverter 719 is maintained at high level (1.5 volts). Therefore the nMOS transistor 717 is OFF, and the nMOS transistor 718 is ON. Since the nMOS transistor 718 is ON, the potential of the node N2 is maintained at low level. This means that the pMOS transistor 711 is ON, and the potential of the node N1 is at high level. Therefore the pMOS transistor 712 is OFF. Since the nMOS transistors 713 and 715 are OFF, the ON/OFF of the nMOS transistors 714 and 716 have no influence on the general operation of the level shift circuit.

Then the input signal IN changes to high level (1.5 volts), which changes the output of the inverter 719 to low level. Therefore the nMOS transistor 717 turns ON, and the nMOS transistor 718 turns OFF. At this time, the potential of the node N2 is maintained at zero volts. This means that the pMOS transistor 711 is maintained in the ON state. When the potential of the node N1 drops to lower level than the ON/OFF threshold level of the pMOS transistor 712, the pMOS transistor 712 turns ON, and the potential of the node N2 rises to high level (3 volts). By this, the pMOS transistor 711 turns OFF, and the potential of the node N1 drops to low level.

Then the input signal IN changes to low level, which changes the output of the inverter 719 to high level. Therefore the nMOS transistor 717 turns OFF, and the MOS transistor 718 turns ON. At this time, the potential of the node N1 is maintained at low level, and the pMOS transistor 712 is maintained in the ON state. By this, both the pMOS transistor 712 and the nMOS transistor 718 become ON state. When the potential of the node N2 drops to lower level than the ON/OFF threshold level of the pMOS transistor 711, the pMOS transistor 711 turns ON. By this, the potential of the node N1 becomes high level, and the pMOS transistor 712 turns OFF. As a result, the potential of the node N2 drops to low level.

When the control signal L-SPEED is set to high level in this way, the speed of the rise operation and the fall operation of the output signal OUT is not increased, since the pMOS transistor 713–716 are not in use. However, the level shift circuit can operate normally even if the level shift amount is high, and power consumption is low since the through current is low.

Now operation of the level shift circuit when the high level potential of the input signal IN and the inverter 719 is 3 volts will be described. In this case, the control signal L-SPEED is set to low level, so the nMOS transistors 713 and 715 turn ON.

In this level shift circuit, the output of the inverter 719 is maintained at high level (3 volts) when the input signal IN is at low level. Therefore the nMOS transistor 717 is OFF, and the nMOS transistor 718 is ON. Since the nMOS transistor 718 is ON, the potential of the node N2 is maintained at low level. This means that the pMOS transistors 711 and 714 are ON, so the potential of the node N1 is at high level. And this also means that the pMOS transistors 712 and 716 are OFF.

Then the input signal IN changes to high level (3 volts), which changes the output of the inverter 719 to low level. Therefore the nMOS transistor 717 turns ON, and the nMOS transistor 718 turns OFF. At this time, the potential of the node N2 is maintained at zero volts. This means that the pMOS transistors 711 and 714 are maintained in the ON state. In other words, the pMOS transistors 711 and 714 and the nMOS transistor 717 are in the ON state. Since the gate potential is 3 volts here, the current capability of the nMOS transistor 717 is sufficiently high. Because of this, the potential of the node N1 drops to lower level than the ON/OFF threshold level of the pMOS transistor 712. By this, the pMOS transistors 712 and 716 turn ON, and the potential of the node N2 rises to high level (3 volts). According to the present embodiment, the potential of the node N2 rises at high-speed, since the node N2 is recharged by the two pMOS transistors 712 and 716. When the potential of the node N2 becomes high level, the pMOS transistors 711 and 714 turn OFF. Therefore the potential of the node N1 drops to low level.

Then the input signal IN changes to low level, which changes the output of the inverter 719 to high level. Therefore the nMOS transistor 717 turns OFF, and the nMOS transistor 718 turns ON. At this time, the potential of the node N1 is maintained at low level, and the pMOS transistors 712 and 716 are maintained in the ON state. By this, the pMOS transistors 712 and 716 and the nMOS transistor 718 turn ON. Since the gate potential is 3 volts here, the current capability of the nMOS transistor 718 is sufficiently high. Therefore the potential of the node N2 drops to lower level than the ON/OFF threshold level of the pMOS transistor 711. Therefore the pMOS transistor 711 and 714 turns ON. By this, the potential of the node N1 becomes high level, and the pMOS transistors 712 and 716 turn OFF. As a result, the potential of the node N2 drops to low level. According to the present embodiment, the potential of the node N2, which is the output signal OUT, falls at high-speed, since the node N1 is recharged by the two pMOS transistors 711 and 714.

When the control signal L-SPEED is set to low level in this way, the level shift amount cannot be increased very much, but the recharging capability to the nodes N1 and N2 can be increased, therefore the speed of the rise operation and the fall operation of the output signal OUT can be increased.

Now a variant form of the level shift circuit in accordance with the present invention will be described with reference to FIG. 7B.

Figure 7B:
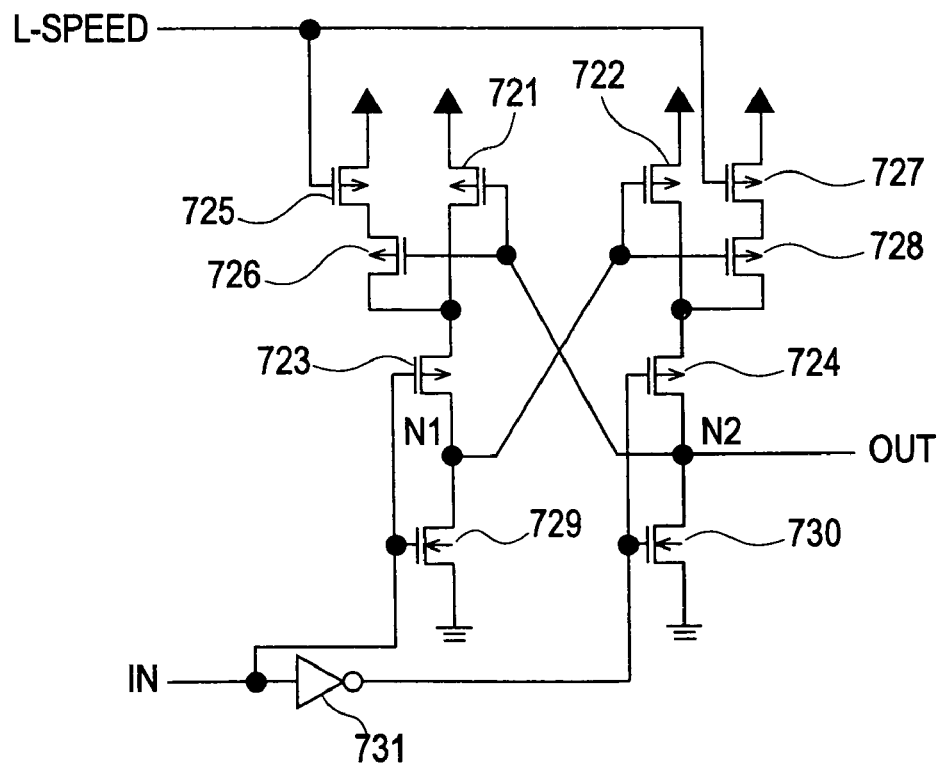

The level shift circuit in FIG. 7B is comprised of the pMOS transistors 721–728, the nMOS transistors 729 and 730, and the inverter 731.

In the pMOS transistor 721, the source is connected to the power supply line, and the gate is connected to the node N2.

In the pMOS transistor 722, the source is connected to the power supply line, and the gate is connected to the node N1.

In the pMOS transistor 723, the source is connected to the drain of the pMOS transistor 721, the drain is connected to the node N1, and the input signal IN is input from the gate. This pMOS transistor 723 strongly turns ON when the gate potential is zero volts, weakly turns ON when the gate potential is 1.5 volts, and turns OFF when the gate potential is 3 volts.

In the pMOS transistor 724, the source is connected to the drain of the pMOS transistor 722, the drain is connected to the node N2, and the gate is connected to the output terminal of the inverter 731. This pMOS transistor 724 strongly turns ON when the gate potential is zero volts, weakly turns ON when the gate potential is 1.5 volts, and turns OFF when the gate potential is 3 volts.

In the pMOS transistor 725, the source is connected to the power supply line, and the control signal L-SPEED is input from the gate.

In the pMOS transistor 726, the source is connected to the drain of the pMOS transistor 725, the drain is connected to the source of the pMOS transistor 723, and the gate is connected to the node N2.

In the pMOS transistor 727, the source is connected to the power supply line, and the control signal L-SPEED is input from the gate.

In the pMOS transistor 728, the source is connected to the drain of the pMOS transistor 727, the drain is connected to the source of the pMOS transistor 724, and the gate is connected to the node N1.

In the nMOS transistor 729, the source is connected to the ground line, the drain is connected to the node N1, and the input signal IN is input from the gate.

In the nMOS transistor 730, the source is connected to the ground line, the drain is connected to the node N2, and the gate is connected to the output terminal of the inverter 731.

The inverter 731 inputs the input signal IN from the input terminal, inverts this signal IN, and outputs it.

In the level shift circuit in FIG. 7B as well, the power supply potential is 3 volts. The high level potential of the input signal IN and the high level potential of the inverter 731 is 1.5 volts or 3 volts.

Initially operation of the level shift circuit when the high level potential of the input signal IN and the inverter 731 is 1.5 volts will be described. In this case, the control signal L-SPEED is set to high level. By this, the nMOS transistors 725 and 727 turn OFF.

When the input signal IN is at low level, the output of the inverter 731 is at high level (1.5 volts). Therefore the nMOS transistor 729 is OFF, and the nMOS transistor 730 is ON. The pMOS transistor 723 strongly turns ON, and the pMOS transistor 724 weakly turns ON. Since the nMOS transistor 730 is ON, the potential of the node N2 is at low level, and the pMOS transistor 721 is ON, so the potential of the node N1 is at high level. Therefore the pMOS transistor 722 is OFF. Since the pMOS transistors 725 and 727 are OFF, the ON/OFF of the pMOS transistors 726 and 728 have no influence on the general operation of the level shift circuit.

Then the input signal IN changes to high level (1.5 volts), which changes the output of the inverter 731 to low level. By this, the nMOS transistor 729 turns ON, the nMOS transistor 730 turns OFF, the pMOS transistor 723 weakly turns ON, and the pMOS transistor 724 strongly turns ON. By this, the pMOS transistors 721 and 723, and the nMOS transistor 729 turn ON. According to the present embodiment, the potential of the node N1 drops to lower level than the ON/OFF threshold level of the pMOS transistor 722 since the current capability of the pMOS transistor 721 is low. By this, the pMOS transistor 722 turns ON, therefore the potential of the node N2 rises to high level (3 volts).

Then the input signal IN changes to low level, which changes the output of the inverter 731 to high level. Therefore the nMOS transistor 729 turns OFF, the nMOS transistor 730 turns ON, the pMOS transistor 723 strongly turns ON, and the pMOS transistor 724 weakly turns ON. By this, the pMOS transistors 722 and 724, and the nMOS transistor 730 turn ON. According to the present embodiment, the potential of the node N2 drops to lower level than the ON/OFF threshold level of the pMOS transistor 721, since the current capability of the pMOS transistor 722 is low. By this, the pMOS transistor 721 turns ON. Therefore the potential of the node N1 becomes high level, and the pMOS transistor 722 turns OFF. As a result, the potential of the node N2 drops to low level.

When the control signal L-SPEED is set to high level in this way, the speed of the operation of the output signal OUT is not increased, since the pMOS transistor 726 and 728 are not in use. However, the level shift circuit can operate normally even if the level shift amount is high, and power consumption is low since the through current is low.

Now operation of the level shift circuit when the high level potential of the input signal IN and the inverter 727 is 3 volts will be described. In this case, the control signal L-SPEED is set to low level, so the nMOS transistors 725 and 727 turn ON.

When the input signal IN is at low level, the output of the inverter 731 is at high level (3 volts). Therefore the nMOS transistor 729 is OFF, and the nMOS transistor 730 is ON. Also the pMOS transistor 723 strongly turns ON and the pMOS transistor 724 is OFF. Since the nMOS transistor 730 is ON, the potential of the node N2 is at low level, therefore the pMOS transistors 721 and 726 are ON. So the potential of the node N1 is at high level, and as a result, the pMOS transistors 722 and 728 are OFF.

Then the input signal IN changes to high level (3 volts), which changes the output of the inverter 731 to low level. Therefore the nMOS transistor 729 turns ON, the nMOS transistor 730 turns OFF, the pMOS transistor 723 turns OFF, and the pMOS transistor 724 strongly turns ON. Since the potential of the node N1 becomes zero volts, the pMOS transistors 722 and 728 turn ON. As a result, the potential of the node N2 rises to high level (3 volts). According to the present embodiment, the potential of the node N2, that is, the output signal OUT, rises at high-speed, since the node N2 is recharged by the two pMOS transistors 722 and 728. When the potential of the node N2 becomes high level, the pMOS transistors 721 and 726 turn OFF.

Then the input signal IN changes to low level, which changes the output of the inverter 731 to high level. Therefore the nMOS transistor 729 turns OFF, the nMOS transistor 730 turns ON, the pMOS transistor 723 strongly turns ON, and the pMOS transistor 724 turns OFF. By this, the potential of the node N2 becomes zero volts. Then the pMOS transistors 721 and 726 turn ON. By this, the potential of the node N1 becomes high level, and the pMOS transistors 722 and 728 turn OFF.

When the control signal L-SPEED is set to low level in this way, the level shift amount cannot be increased very much, but the recharging capability to the nodes N1 and N2 can be increased, therefore the speed of the rise operation and the fall operation of the output signal OUT can be increased.

Eighth Embodiment

Figure 8A:
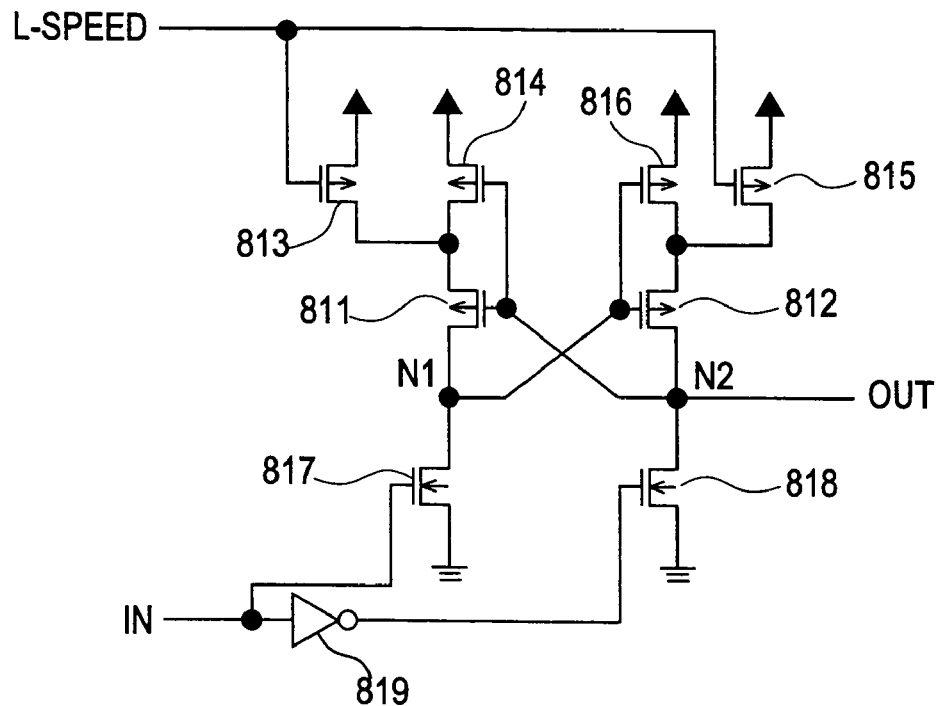
FIG. 8A and FIG. 8B are circuit diagrams depicting the configuration of the level shift circuit according to the eighth embodiment.

FIG. 8A is a circuit diagram depicting the configuration of key components of the level shift circuit according to the present embodiment. As shown in FIG. 8A, this level shift circuit is comprised of the pMOS transistors 811–816, the nMOS transistor 817 and 818, and the inverter 819.

In the pMOS transistor 811, the drain is connected to the node N1, and the gate is connected to the node N2.

In the pMOS transistor 812, the drain is connected to the node N2, and the gate is connected to the node N1.

In the pMOS transistor 813, the source is connected to the power supply line, the drain is connected to the source of the pMOS transistor 811, and the control signal L-SPEED is input from the gate.

In the pMOS transistor 814, the source is connected to the power supply line, the drain is connected to the source of the pMOS transistor 811, and the gate is connected to the node N2.

In the pMOS transistor 815, the source is connected to the power supply line, the drain is connected to the source of the pMOS transistor 812, and the control signal L-SPEED is input from the gate.

In the pMOS transistor 816, the source is connected to the power supply line, the drain is connected to the source of the pMOS transistor 812, and the gate is connected to the node N1.

In the nMOS transistor 817, the source is connected to the ground line, the drain is connected to the node N1, and the input signal IN is input from the gate.

In the nMOS transistor 818, the source is connected to the ground line, the drain is connected to the node N2, and the gate is connected to the output terminal of the inverter 819.

The inverter 819 inputs the input signal IN from the input terminal, inverts this signal IN, and outputs it.

According to the present embodiment, the power supply potential is 3 volts. The high level potential of the input signal IN and the high level potential of the output of the inverter 819 is 1.5 volts or 3 volts.

Operation of the level shift circuit shown in FIG. 8A will now be described.

Initially operation of the level shift circuit when the high level potential of the input signal IN and the inverter 819 is 1.5 volts will be described. In this case, the control signal L-SPEED is set to high level. By this, the pMOS transistors 813 and 815 turn OFF.

When the input signal IN is at low level, the output of the inverter 819 is maintained at high level (1.5 volts). Therefore the nMOS transistor 817 is OFF, and the nMOS transistor 818 is ON. Since the nMOS transistor 818 is ON, the potential of the node N2 is maintained at low level. This means that the pMOS transistors 811 and 814 are ON, and the potential of the node N1 is at high level. Therefore the pMOS transistors 812 and 816 are OFF. Since the pMOS transistors 813 and 815 are OFF, this has no influence on the general operation of the level shift circuit.

Then the input signal IN changes to high level (1.5 volts), which changes the output of the inverter 819 to low level. Therefore the nMOS transistor 817 turns ON, and the nMOS transistor 818 turns OFF. At this time, the potential of the node N2 is maintained at zero volts. This means that the pMOS transistors 811 and 814 are maintained in the ON state. According to the present embodiment, the current capability of the pMOS transistors 811 and 814 is sufficiently low, so the potential of the node N1 drops to lower level than the ON/OFF threshold level of the pMOS transistors 812 and 816. By this, the pMOS transistors 812 and 816 turn ON, and the potential of the node N2 rises to high level (3 volts). By this, the pMOS transistors 811 and 814 turn OFF, and the potential of the node N1 drops to low level.

Then the input signal IN changes to low level, which changes the output of the inverter 819 to high level. Therefore the nMOS transistor 817 turns OFF, and the nMOS transistor 818 turns ON. At this time, the potential of the node N1 is maintained at low level, and the pMOS transistor 812 is maintained in the ON state. By this, the pMOS transistors 812 and 816, and the nMOS transistor 818 turn ON. According to the present embodiment, the current capability of the pMOS transistors 812 and 816 is sufficiently low, so the potential of the node N2 drops to lower level than the ON/OFF threshold level of the pMOS transistors 811 and 814. Therefore the pMOS transistors 811 and 814 turn ON. By this, the potential of the node N1 becomes high level, and the pMOS transistors 812 and 816 turn OFF. As a result, the potential of the node N2 drops to low level.

When the control signal L-SPEED is set to high level in this way, the speed of the rise operation of the output signal OUT is not increased since the pMOS transistor 813 is not in use, and the speed of the fall operation of the output signal OUT is not increased since the pMOS transistor 815 is not in use. However, the level shift circuit can operate normally even if the level shift amount is high, and power consumption is low since the through current is low.

Now operation of this level shift circuit when the high level potential of the input signal IN and the inverter 819 is 3 volts will be described. In this case, the control signal L-SPEED is set to low level, so the pMOS transistors 813 and 815 turn ON.

In this level shift circuit, the output of the inverter 819 is maintained at high level (3 volts) when the input signal IN is at low level. Therefore the nMOS transistor 817 is OFF, and the nMOS transistor 818 is ON. Since the nMOS transistor 818 is ON, the potential of the node N2 is maintained at low level. This means that the pMOS transistors 811 and 814 are ON, so the potential of the node N1 is at high level. As a result, the pMOS transistors 812 and 816 are OFF.

Then the input signal IN changes to high level (3 volts), which changes the output of the inverter 819 to low level. Therefore the nMOS transistor 817 turns ON, and the nMOS transistor 818 turns OFF. At this time, the potential of the node N2 is maintained at zero volts. This means that the pMOS transistors 811 and 814 are maintained in the ON state. In other words, the pMOS transistors 811 and 814, and the nMOS transistor 817 are in the ON state. Since the gate potential is 3 volts here, the current capability of the nMOS transistor 817 is sufficiently high. Because of this, the potential of the node N1 drops to lower level than the ON/OFF threshold level of the pMOS transistor 812. By this, the pMOS transistors 812 and 816 turn ON, and the potential of the node N2 rises to high level (3 volts). According to the present embodiment, the potential of the node N2 rises at high-speed since the current is supplied to the source of the pMOS transistor 812 by the two pMOS transistors 815 and 816. When the potential of the node N2 becomes high level, the pMOS transistors 811 and 814 turn OFF, therefore the potential of the node N1 drops to low level.

Then the input signal IN changes to low level, which changes the output of the inverter 819 to high level. Therefore the nMOS transistor 817 turns OFF, and the nMOS transistor 818 turns ON. At this time, the potential of the node N1 is maintained at low level, and the pMOS transistors 812 and 816 are maintained in the ON state. By this, the pMOS transistors 812 and 816, and the nMOS transistor 818 turn ON. Since the gate potential is 3 volts here, the current capability of the nMOS transistor 818 is sufficiently high. Therefore the potential of the node N2 drops to lower level than the ON/OFF threshold level of the pMOS transistor 811. Therefore the pMOS transistors 811 and 814 turn ON. By this, the potential of the node N1 becomes high level, and the pMOS transistors 812 and 816 turn OFF. As a result, the potential of the node N2 drops to low level. According to the present embodiment, the potential of the node N2 drops at high-speed, since the node N1 is recharged by the two pMOS transistors 811 and 814.

When the control signal L-SPEED is set to low level in this way, the level shift amount cannot be increased very much, but the recharging capability to the nodes N1 and N2 can be increased, therefore the speed of the rise operation and the fall operation of the output signal OUT can be increased.

Now a variant form of the level shift circuit in accordance to the present invention will be described with reference to FIG. 8B.

Figure 8B:
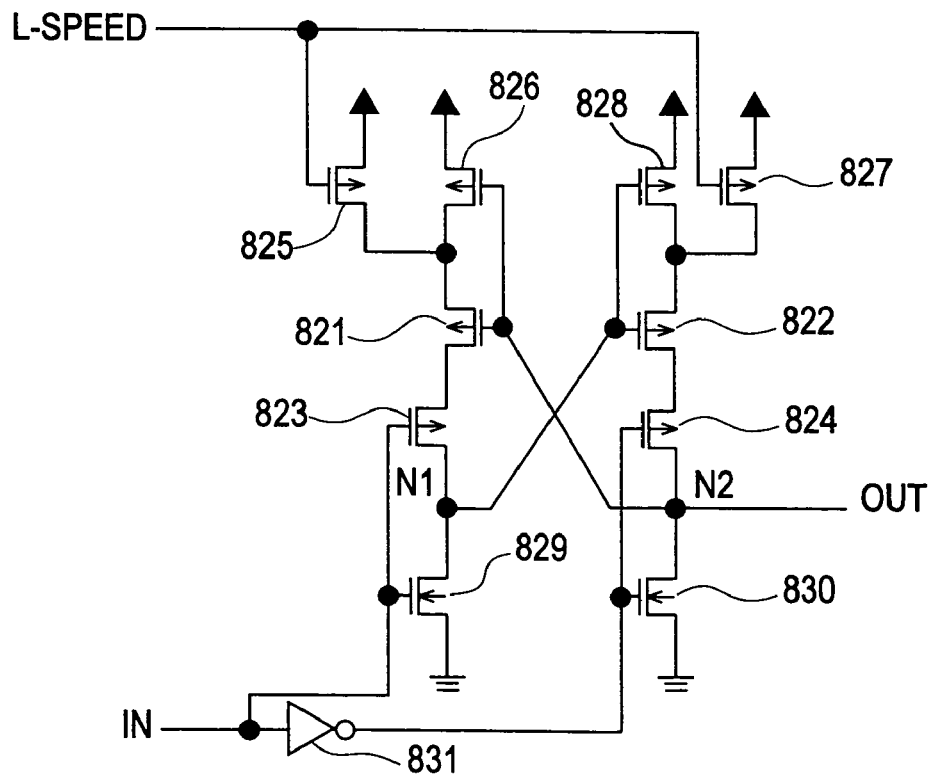

The level shift circuit in FIG. 8B is comprised of the pMOS transistors 821–828, the nMOS transistors 829 and 830, and the inverter 831.

In the pMOS transistor 821, the gate is connected to the node N2.

In the pMOS transistor 822, the gate is connected to the node N1.

In the pMOS transistor 823, the source is connected to the drain of the pMOS transistor 821, the drain is connected to the node N1, and the input signal IN is input from the gate. This pMOS transistor 823 strongly turns ON when the gate potential is zero volts, weakly turns ON when the gate potential is 1.5 volts, and turns OFF when the gate potential is 3 volts.

In the pMOS transistor 824, the source is connected to the drain of the pMOS transistor 822, the drain is connected to the node N2, and the gate is connected to the output terminal of the inverter 831. This pMOS transistor 824 strongly turns ON when the gate potential is zero volts, weakly turns ON when the gate potential is 1.5 volts, and turns OFF when the gate potential is 3 volts.

In the pMOS transistor 825, the source is connected to the power supply line, the drain is connected to the source of the pMOS transistor 821, and the control signal L-SPEED is input from the gate.

In the pMOS transistor 826, the source is connected to the power supply line, the drain is connected to the source of the pMOS transistor 821, and the gate is connected to the node N2.

In the pMOS transistor 827, the source is connected to the power supply line, the drain is connected to the source of the pMOS transistor 822, and the control signal L-SPEED is input from the gate.

In the pMOS transistor 828, the source is connected to the power supply line, the drain is connected to the source of the pMOS transistor 822, and the gate is connected to the node N1.

In the nMOS transistor 829, the source is connected to the ground line, the drain is connected to the node N1, and the input signal IN is input from the gate.

In the nMOS transistor 830, the source is connected to the ground line, the drain is connected to the node N2, and the gate is connected to the output terminal of the inverter 831.

The inverter 831 inputs the input signal IN from the input terminal, inverts this signal IN, and outputs it.

In the level shift circuit in FIG. 8B as well, the power supply potential is 3 volts. Therefore the high level potential of the output signal OUT is 3 volts. The high level potential of the input signal IN and the high level potential of the inverter 831 is 1.5 volts or 3 volts.

Initially operation of this level shift circuit when the high level potential of the input signal IN and the inverter 831 is 1.5 volts will be described. In this case, the control signal L-SPEED is set to high level. By this, the nMOS transistors 825 and 827 turn OFF.

When the input signal IN is at low level, the output of the inverter 831 is at high level (1.5 volts). Therefore the nMOS transistor 829 is OFF, and the nMOS transistor 830 is ON. The pMOS transistor 823 strongly turns ON, and the pMOS transistor 824 weakly turns ON. Since the nMOS transistor 830 is ON, the potential of the node N2 is at low level, and the pMOS transistors 821 and 826 are ON, so the potential of the node N1 is at high level. Therefore the pMOS transistors 822 and 828 are OFF. Since the pMOS transistors 825 and 827 are OFF, this has no influence on the general operation of the level shift circuit.

Then the input signal IN changes to high level (1.5 volts), which changes the output of the inverter 831 to low level. By this, the nMOS transistor 829 turns ON, the nMOS transistor 830 turns OFF, the pMOS transistor 823 weakly turns ON, and the pMOS transistor 824 strongly turns ON. By this, the pMOS transistors 821, 823 and 826, and the nMOS transistor 829 turn ON. Then the potential of the node N1 drops to lower level than the ON/OFF threshold level of the pMOS transistors 822 and 828. By this, the pMOS transistors 822 and 828 turn ON, and the potential of the node N2 rises to high level (3 volts).

Then the input signal IN changes to low level, which changes the output of the inverter 831 to high level. Therefore the nMOS transistor 829 turns OFF, the nMOS transistor 830 turns ON, the pMOS transistor 823 strongly turns ON, and the pMOS transistor 824 weakly turns ON. By this, the pMOS transistors 822, 824 and 828, and the nMOS transistor 830 turn ON. Then the potential of the node N2 drops to lower level than the ON/OFF threshold level of the pMOS transistor 821. By this, the pMOS transistor 821 turns ON. Therefore the potential of the node N1 becomes high level, and the pMOS transistor 822 turns OFF. As a result, the potential of the node N2 drops to low level.

When the control signal L-SPEED is set to high level in this way, the speed of the output signal OUT is not increased, since the pMOS transistors 825 and 827 are not in use. However, the level shift circuit can operate normally even if the level shift amount is high, and power consumption is low since the through current is low.

Now operation of the level shift circuit when the high level potential of the input signal IN and the inverter 827 is 3 volts will be described. In this case, the control signal L-SPEED is set to low level, so the nMOS transistors 825 and 827 turn ON.

When the input signal IN is at low level, the output of the inverter 831 is at high level (3 volts). Therefore the nMOS transistor 829 is OFF, and the nMOS transistor 830 is ON. Also the pMOS transistor 823 strongly turns ON, and the pMOS transistor 824 is OFF. Since the nMOS transistor 830 is ON, the potential of the node N2 is at low level, therefore the pMOS transistors 821 and 826 are ON, so the potential of the node N1 is at high level. As a result, the pMOS transistors 822 and 828 are OFF.

Then the input signal IN changes to high level (3 volts), which changes the output of the inverter 831 to low level. Therefore the nMOS transistor 829 turns ON, the nMOS transistor 830 turns OFF, the pMOS transistor 823 turns OFF, and the pMOS transistor 824 strongly turns ON. Since the potential of the node N1 becomes zero volts, the pMOS transistors 822 and 828 turn ON. As a result, the potential of the node N2 rises to high level (3 volts). According to the present embodiment, the potential of the node N2 rises at high-speed, since current is supplied to the pMOS transistor 822 from the two pMOS transistors 827 and 828. When the potential of the node N2 becomes high level, the pMOS transistors 821 and 826 turn OFF.

Then the input signal IN changes to low level, which changes the output of the inverter 831 to high level. Therefore the nMOS transistor 829 turns OFF, the nMOS transistor 830 turns ON, the pMOS transistor 823 strongly turns ON, and the pMOS transistor 824 turns OFF. By this, the potential of the node N2 becomes zero volts. Then the pMOS transistors 821 and 826 turn ON. By this, the potential of the node N1 becomes high level, and the pMOS transistors 822 and 828 turn OFF.

When the control signal L-SPEED is set to low level in this way, the level shift amount cannot be increased very much, but the recharging capability of the nodes N1 and N2 can be increased, therefore the speed of the rise operation and the fall operation of the output signal OUT can be increased.

Ninth Embodiment

Figure 9A:
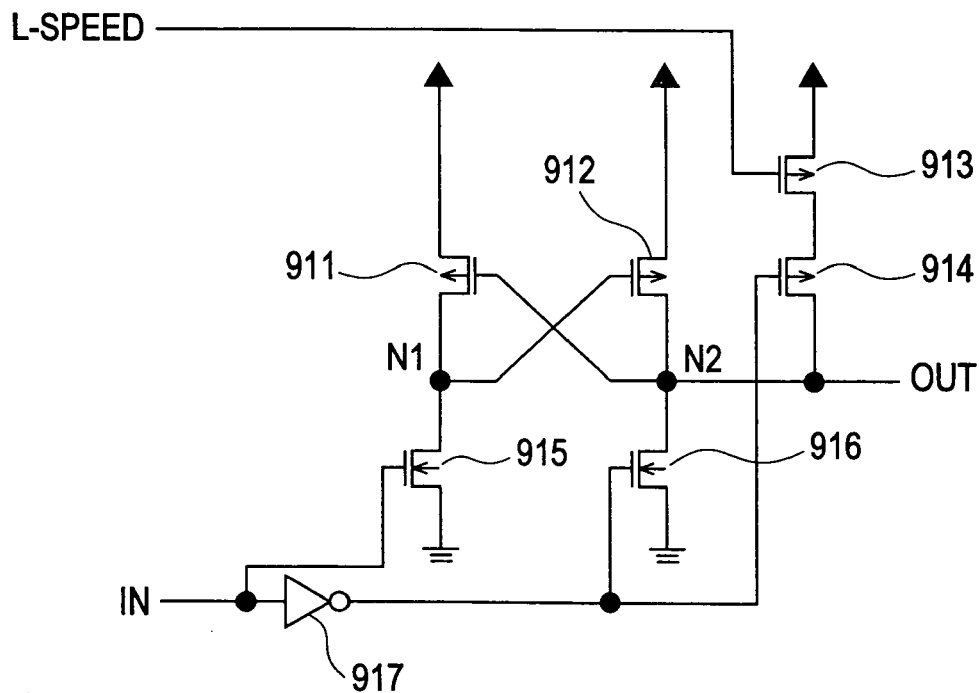
FIG. 9A and FIG. 9B are circuit diagrams depicting the configuration of the level shift circuit according to the ninth embodiment.

FIG. 9A is a circuit diagram depicting the configuration of key components of the level shift circuit in accordance with the present embodiment. As shown in FIG. 9A, this level shift circuit is comprised of the pMOS transistors 911–914, the nMOS transistors 915 and 916, and the inverter 917.

In the pMOS transistor 911, the source is connected to the power supply line, the drain is connected to the node N1, and the gate is connected to the node N2.

In the pMOS transistor 912, the source is connected to the power supply line, the drain is connected to the node N2, and the gate is connected to the node N1.

In the pMOS transistor 913, the source is connected to the power supply line, and the control signal L-SPEED is input from the gate.

In the pMOS transistor 914, the source is connected to the drain of the pMOS transistor 913, the drain is connected to the node N2, and the gate is connected to the output terminal of the inverter 917.

In the nMOS transistor 915, the source is connected to the ground line, the drain is connected to the node N1, and the input signal IN is input from the gate.

In the nMOS transistor 916, the source is connected to the ground line, the drain is connected to the node N2, and the gate is connected to the output terminal of the inverter 917.

The inverter 917 inputs the input signal IN from the input terminal, inverts this signal IN, and outputs it.

According to the present embodiment, the power supply potential is 3 volts. The high level potential of the input signal IN and the high level potential of the output of the inverter 917 is 1.5 volts or 3 volts.

Operation of the level shift circuit shown in FIG. 9A will now be described.

Initially operation of the level shift circuit when the high level potential of the input signal IN and the inverter 917 is 1.5 volts will be described. In this case, the control signal L-SPEED is set to high level (3 volts). By this the pMOS transistor 913 turns OFF.

When the input signal IN is at low level, the output of the inverter 917 is maintained at high level (1.5 volts). Therefore the nMOS transistor 915 is OFF, and the nMOS transistor 916 is ON. Since the nMOS transistor 916 is ON, the potential of the node N2 is maintained at low level. This means that the pMOS transistor 911 is ON, and the potential of the node N1 is at high level. Therefore the pMOS transistor 912 is OFF. Since the nMOS transistor 913 is OFF, the ON/OFF of the nMOS transistor 914 has no influence on the general operation of the level shift circuit.

Then the input signal IN changes to high level (1.5 volts), which changes the output of the inverter 917 to low level. Therefore the MOS transistor 915 turns ON, and the nMOS transistor 916 turns OFF. At this time, the potential of the node N2 is maintained at zero volts. This means that the pMOS transistor 911 is maintained in the ON state. When the potential of the node N1 drops to lower level than the ON/OFF threshold level of the pMOS transistor 912, the pMOS transistor 912 turns ON, and the potential of the node N2 rises to high level (3 volts). By this, the pMOS transistor 911 turns OFF, and the potential of the node N1 drops to low level.

Then the input signal IN changes to low level, which changes the output of the inverter 917 to high level. Therefore the nMOS transistor 915 turns OFF, and the nMOS transistor 916 turns ON. At this time, the potential of the node N1 is maintained at low level, and the pMOS transistor 912 is maintained in the ON state. By this, both the pMOS transistor 912 and the nMOS transistor 916 turn ON. When the potential of the node N2 drops to lower level than the ON/OFF threshold level of the pMOS transistor 911, the pMOS transistor 911 turns ON. By this, the potential of the node N1 becomes high level, and the pMOS transistor 912 turns OFF. As a result, the potential of the node N2 drops to low level.

When the control signal L-SPEED is set to high level in this way, the speed of the rise operation of the output signal OUT is not increased, since the pMOS transistors 913 and 914 are not in use. However, the level shift circuit can operate normally even if the level shift amount is high.

Now operation of this level shift circuit when the high level potential of the input signal IN and the inverter 917 is 3 volts will be described. In this case the control signal L-SPEED is set to low level, so the nMOS transistor 913 turns ON.

In this level shift circuit, the output of the inverter 917 is maintained at high level (3 volts) when the input signal IN is at low level. Therefore the nMOS transistor 915 is OFF, the nMOS transistor 916 is ON, and the pMOS transistor 914 is OFF. Since the nMOS transistor 916 is ON and the nMOS transistor 914 is OFF, the potential of the node N2 is maintained at low level. This means that the pMOS transistor 911 is ON, so the potential of the node N1 is at high level. By this the pMOS transistor 912 turns OFF.

Then the input signal IN changes to high level (3 volts), which changes the output of the inverter 917 to low level. Therefore the nMOS transistor 915 and the pMOS transistor 914 turn ON, and the nMOS transistor 916 turns OFF. Since the pMOS transistor 914 turns ON and the nMOS transistor 916 turns OFF, the potential of the node N2 becomes high level. In other words, according to the present embodiment, the pMOS transistor 914 turns ON as soon as the nMOS transistor 916 turns OFF, so the node N2 changes to high level at high-speed. Then the pMOS transistor 911 turns OFF, and the node N1 becomes low level. By this, the pMOS transistor 912 turns ON.

Then the input signal IN changes to low level, which changes the output of the inverter 917 to high level. Therefore the nMOS transistor 915 and the pMOS transistor 914 turn OFF, and the nMOS transistor 916 turns ON. By this, the potential of the node N2 becomes low level. At this time, the pMOS transistor 912 is ON, but the current capability is sufficiently low, so the node N2 drops lower level than the ON/OFF threshold level of the pMOS transistor 911. By this, the pMOS transistor 911 turns ON. Therefore the potential of the node N1 becomes high level, and the pMOS transistor 912 turns OFF. As a result, the potential of the node N2 drops to low level.

When the control signal L-SPEED is set to low level in this way, the level shift amount cannot be increased very much, but the recharging capability of the node N2 can be increased, therefore the speed of the rise operation of the output signal OUT can be increased.

Now a variant form of the level shift circuit in accordance with the present embodiment will be described with reference to FIG. 9B.

Figure 9B:
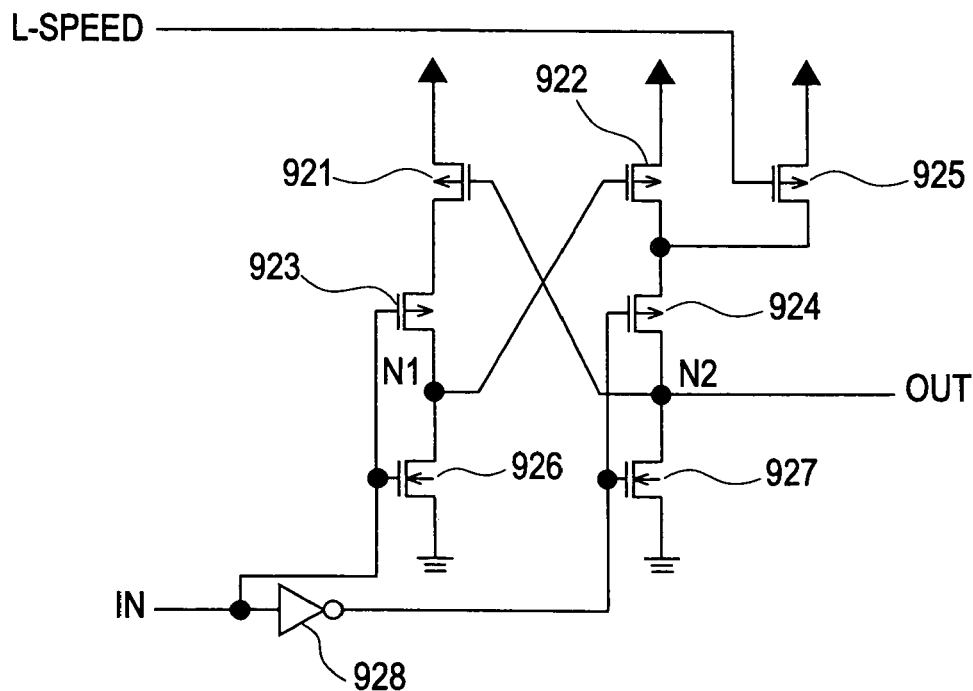

The level shift circuit in FIG. 9B is comprised of the pMOS transistors 921–925, the nMOS transistors 926 and 927, and the inverter 928.

In the pMOS transistor 921, the source is connected to the power supply line, and the gate is connected to the node N2.

In the pMOS transistor 922, the source is connected to the power supply line, and the gate is connected to the node N1.

In the pMOS transistor 923, the source is connected to the drain of the pMOS transistor 921, the drain is connected to the node N1, and the input signal IN is input from the gate. This pMOS transistor 923 strongly turns ON when the gate potential is zero volts, weakly turns ON when the gate potential is 1.5 volts, and turns OFF when the gate potential is 3 volts.

In the pMOS transistor 924, the source is connected to the drain of the pMOS transistor 922, the drain is connected to the node N2, and the gate is connected to the output terminal of the inverter 928. This pMOS transistor 924 strongly turns ON when the gate potential is zero volts, weakly turns ON when the gate potential is 1.5 volts, and turns OFF when the gate potential is 3 volts.

In the pMOS transistor 925, the source is connected to the power supply line, the drain is connected to the source of the pMOS transistor 924, and the control signal L-SPEED is input from the gate.

In the nMOS transistor 926, the source is connected to the ground line, the drain is connected to the node N1, and the input signal IN is input from the gate.

In the nMOS transistor 927, the source is connected to the ground line, the drain is connected to the node N2, and the gate is connected to the output terminal of the inverter 928.

The inverter 928 inputs the input signal IN from the input terminal, inverts this signal IN, and outputs it.

Just like the level shift circuit in FIG. 9A, another pMOS transistor may be disposed between the drain of the pMOS transistor 925 and the node N2, where the gate of this pMOS transistor is connected to the output terminal of the inverter 928. In this case as well, the operation of the level shift circuit is almost the same as the case of the circuit in FIG. 9A (mentioned later). However, connecting the drain of the pMOS transistor 925 to the source of the pMOS transistor 924 requires less number of transistors of the level shift circuit, as shown in FIG. 9B.

In the level shift circuit in FIG. 9B as well, the power supply potential is 3 volts. The high level potential of the input signal IN and the high level potential of the output of the inverter 928 is 1.5 volts or 3 volts.

Initially operation of this level shift circuit when the high level potential of the input signal IN and the inverter 928 is 1.5 volts will be described. In this case, the control signal L-SPEED is set to high level. By this, the nMOS transistor 925 turns OFF.

When the input signal IN is at low level, the output of the inverter 928 is at high level (1.5 volts). Therefore the nMOS transistor 926 is OFF, and the nMOS transistor 927 is ON. The pMOS transistor 923 strongly turns ON, and the pMOS transistor 924 weakly turns ON. Since the nMOS transistor 927 is ON, the potential of the node N2 is at low level. By this, the pMOS transistor 921 turns ON, so the potential of the node N1 is at high level. As a result, the pMOS transistor 922 is OFF.

Then the input signal IN changes to the high level (1.5 volts), which changes the output of the inverter 928 to low level. By this, the nMOS transistor 926 turns ON, the nMOS transistor 927 turns OFF, the pMOS transistor 923 weakly turns ON, and the pMOS transistor 924 strongly turns ON. When the potential of the node N1 drops to lower level than the ON/OFF threshold level of the pMOS transistor 922, the pMOS transistor 922 turns ON. As the pMOS transistor 922 turns ON, the potential of the node N2 rises to high level (3 volts). Since the pMOS transistor 925 is OFF, this has no influence on the general operation of the level shift circuit.

Then the input signal IN changes to low level, which changes the output of the inverter 928 to high level. Therefore the nMOS transistor 926 turns OFF, the nMOS transistor 927 turns ON, the pMOS transistor 923 strongly turns ON, and the pMOS transistor 924 weakly turns ON. By this, the pMOS transistors 922 and 924, and the nMOS transistor 927 turn ON. Then the potential of the node N2 drops to lower level than the ON/OFF threshold level of the pMOS transistor 921. By this, the pMOS transistor 921 turns ON. Therefore the potential of the node N1 becomes high level, and the pMOS transistor 922 turns OFF. As a result, the potential of the node N2 drops to low level.

When the control signal L-SPEED is set to high level in this way, the speed of the rise operation of the output signal OUT is not increased, since the pMOS transistor 925 is not in use. However, the level shift circuit can operate normally even if the level shift amount is high.

Now operation of this level shift circuit when the high level potential of the input signal IN and the inverter 927 is 3 volts will be described. In this case, the control signal L-SPEED is set to low level, so the nMOS transistor 925 turns ON.

When the input signal IN is at low level, the output of the inverter 928 becomes high level (3 volts). Therefore the nMOS transistor 926 is OFF, and the nMOS transistor 927 is ON. The pMOS transistor 923 strongly turns ON, and the pMOS transistor 924 turns OFF. Since the nMOS transistor 927 is ON, the potential of the node N2 is at low level. By this, the pMOS transistor 921 turns ON, and the potential of the node N1 is at high level. As a result, the pMOS transistor 922 is OFF.

Then the input signal IN changes to high level (3 volts), which changes the output of the inverter 928 to low level. Therefore the nMOS transistor 926 turns ON, the pMOS transistor 923 turns OFF, and the pMOS transistor 922 turns ON. Also the pMOS transistor 924 strongly turns ON. So current is supplied from the pMOS transistors 922 and 925 to the node N2 via the pMOS transistor 924. The output of the inverter 928 becomes low level, so the nMOS transistor 927 turns OFF. Therefore the potential of the node N2 changes to high level at high-speed. As a result, the pMOS transistor 921 turns OFF.

Then the input signal IN changes to low level, which changes the output of the inverter 928 to high level. Therefore the nMOS transistor 926 turns OFF, the nMOS transistor 927 turns ON, the pMOS transistor 923 strongly turns ON, and the pMOS transistor 924 turns OFF. By this, the potential of the node N2 drops to low level. Then the pMOS transistor 921 turns ON, and the potential of the node N1 becomes high level. As a result, the pMOS transistor 922 turns OFF.

When the control signal L-SPEED is set to low level in this way, the level shift amount cannot be increased very much, but the recharging capability of the node N2 can be increased, therefore the speed of the rise operation of the output signal OUT can be increased.

Tenth Embodiment

Figure 10A:
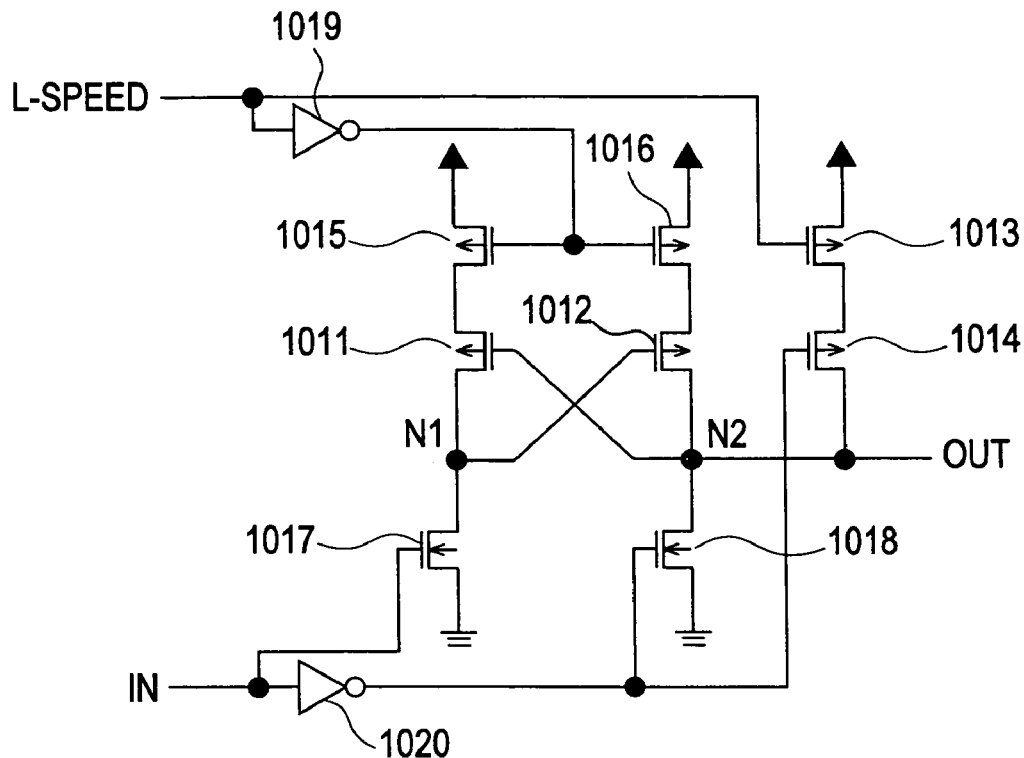
FIG. 10A and FIG. 10B are circuit diagrams depicting the configuration of the level shift circuit according to the tenth embodiment.

FIG. 10A is a circuit diagram depicting key components of the level shift circuit in accordance with the present embodiment. As shown in FIG. 10A, this level shift circuit is comprised of the pMOS transistors 1011–1016, the nMOS transistors 1017 and 1018, and the inverters 1019 and 1020.

In the pMOS transistor 1011, the drain is connected to the node N1, and the gate is connected to the node N2.

In the pMOS transistor 1012, the drain is connected to the node N2, and the gate is connected to the node N1.

In the pMOS transistor 1013, the source is connected to the power supply line, and the control signal L-SPEED is input from the gate.

In the pMOS transistor 1014, the source is connected to the drain of the pMOS transistor 1013, the drain is connected to the node N2, and the gate is connected to the output terminal of the inverter 1020.

In the pMOS transistor 1015, the source is connected to the power supply line, the drain is connected to the source of the pMOS transistor 1011, and the gate is connected to the output terminal of the inverter 1019.

In the pMOS transistor 1016, the source is connected to the power supply line, the drain is connected to the source of the pMOS transistor 1012, and the gate is connected to the output terminal of the inverter 1019.

In the nMOS transistor 1017, the source is connected to the ground line, the drain is connected to the node N1, and the input signal IN is input from the gate.

In the nMOS transistor 1018, the source is connected to the ground line, the drain is connected to the node N2, and the gate is connected to the output terminal of the inverter 1020.

The inverter 1019 inputs the control signal L-SPEED from the input terminal, inverts this control signal L-SPEED, and outputs it.

The inverter 1020 inputs the input signal IN from the input terminal, inverts this signal IN, and outputs it.

According to the present embodiment, the power supply voltage is 3 volts. The high level potential of the input signal IN and the high level potential of the output of the inverter 1020 is 1.5 volts or 3 volts.

Operation of the level shift circuit shown in FIG. 10A will now be described.

Initially operation of the level shift circuit when the high level potential of the input signal IN and the inverter 1020 is 1.5 volts will be described. In this case, the control signal L-SPEED is set to high level (3 volts). By this, the pMOS transistor 1013 turns OFF, and the pMOS transistors 1015 and 1016 turn ON.

When the input signal IN is at low level, the output of the inverter 1020 is maintained at high level (1.5 volts). Therefore the nMOS transistor 1017 is OFF, and the nMOS transistor 1018 is ON. Since the nMOS transistor 1018 is ON, the potential of the node N2 is maintained at low level. This means that the pMOS transistor 1011 is ON, and the potential of the node N1 is at high level. Therefore the pMOS transistor 1012 is OFF. Since the nMOS transistor 1013 is OFF, the ON/OFF of the nMOS transistor 1014 has no influence on the general operation of the level shift circuit.

Then the input signal IN changes to high level (1.5 volts), which changes the output of the inverter 1020 to low level. Therefore the nMOS transistor 1017 turns ON, and the nMOS transistor 1018 turns OFF. At this time, the potential of the node N2 is maintained at zero volts. This means that the pMOS transistor 1011 is maintained in the ON state. Then the potential of the node N1 drops to lower level than the ON/OFF threshold level of the pMOS transistor 1012. Therefore the pMOS transistor 1012 turns ON, and the potential of the node N2 rises to high level (3 volts). By this, the pMOS transistor 1011 turns OFF, and the potential of the node N1 drops to low level.

Then the input signal IN changes to low level, which changes the output of the inverter 1020 to high level. Therefore the nMOS transistor 1017 turns OFF, and the nMOS transistor 1018 turns ON. At this time, the potential of the node N1 is maintained at low level, and the pMOS transistor 1012 is maintained in the ON state. Then the potential of the node N2 drops to lower level than the ON/OFF threshold level of the pMOS transistor 1011. By this, the pMOS transistor 1011 turns ON. Then the potential of the node N1 becomes high level, and the pMOS transistor 1012 turns OFF. As a result, the potential of the node N2 drops to low level.

When the control signal L-SPEED is set to high level in this way, the speed of the rise operation of the output signal OUT is not increased, since the pMOS transistors 1013 and 1014 are not in use. However, the level shift circuit can operate normally even if the level shift amount is high.

Now operation of this level shift circuit when the high level potential of the input signal IN and the inverter 1020 is 3 volts will be described. In this case, the control signal L-SPEED is set to low level, so the nMOS transistor 1013 turns ON, and the pMOS transistors 1015 and 1016 turn OFF.

In this level shift circuit, the output of the inverter 1020 is maintained at high level (3 volts) when the input signal IN is at low level. Therefore the nMOS transistor 1018 is ON, and the pMOS transistor 1014 is OFF. So the potential of the node N2 is maintained at low level. Since the pMOS transistors 1015 and 1016 are OFF, the ON/OFF of the pMOS transistors 1011 and 1012, and the nMOS transistor 1017 has no influence on the general operation of the level shift circuit.

Then the input signal IN changes to high level (3 volts), which changes the output of the inverter 1020 to low level. Since the pMOS transistor 1014 turns ON and the nMOS transistor 1018 turns OFF, the potential of the node N2 becomes high level. In other words, according to the present embodiment, the pMOS transistor 1014 turns ON as soon as the nMOS transistor 1018 turns OFF, so the potential of the node N2 changes to high level at high-speed.

Then the input signal IN changes to low level, which changes the output of the inverter 1020 to high level. Therefore the pMOS transistor 1014 turns OFF, and the nMOS transistor 1018 turns ON. By this, the potential of the node N2 becomes low level. In other words, according to the present embodiment, the nMOS transistor 1018 turns ON as soon as the pMOS transistor 1014 turns OFF, so the potential of the node N2 changes to low level at high-speed.

When the control signal L-SPEED is set to low level in this way, the level shift amount cannot be increased very much, but the speed of the rise operation and the fall operation of the node N2 can be increased.

Now a variant form of the level shift circuit in accordance with the present embodiment will be described with reference to FIG. 10B.

Figure 10B:
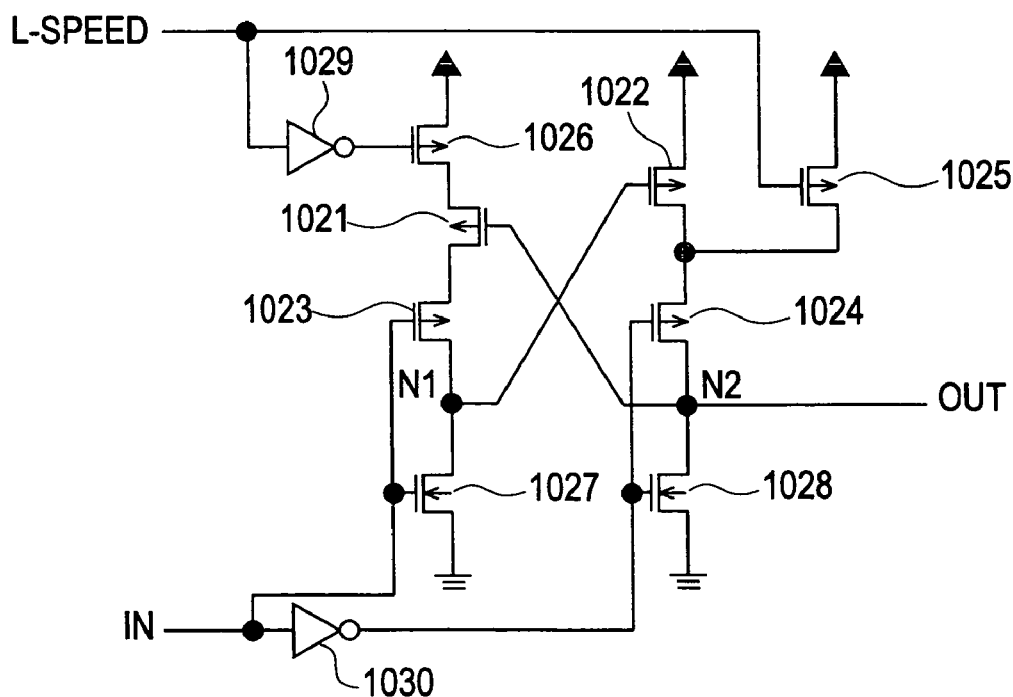

The level shift circuit in FIG. 10B is comprised of the pMOS transistors 1021–1026, the nMOS transistors 1027 and 1028, and the inverters 1029 and 1030.

In the pMOS transistor 1021, the gate is connected to the node N2.

In the pMOS transistor 1022, the source is connected to the power supply line, and the gate is connected to the node N1.

In the pMOS transistor 1023, the source is connected to the drain of the pMOS transistor 1021, the drain is connected to the node N1, and the input signal IN is input from the gate. This pMOS transistor 1023 strongly turns ON when the gate potential is zero volts, weakly turns ON when the gate potential is 1.5 volts, and turns OFF when the gate potential is 3 volts.

In the pMOS transistor 1024, the source is connected to the drain of pMOS transistor 1022, the drain is connected to the node N2, and the gate is connected to the output terminal of the inverter 1030. This pMOS transistor 1024 strongly turns ON when the gate potential is zero volts, weakly turns ON when the gate potential is 1.5 volts, and turns OFF when the gate potential is 3 volts.

In the pMOS transistor 1025, the source is connected to the power supply line, the drain is connected to the source of the pMOS transistor 1024, and the control signal L-SPEED is input from the gate.

In the pMOS transistor 1026, the source is connected to the power supply line, the drain is connected to the source of the pMOS transistor 1021, and the gate is connected to the output terminal of the inverter 1029.

In the nMOS transistor 1027, the source is connected to the ground line, the drain is connected to the node N1, and the input signal IN is input from the gate.

In the nMOS transistor 1028, the source is connected to the ground line, the drain is connected to the node N2, and the gate is connected to the output terminal of the inverter 1030.

The inverter 1029 inputs the control signal L-SPEED from the input terminal, inverts this signal L-SPEED, and outputs it.

The inverter 1030 inputs the input signal IN from the input terminal, inverts this signal IN, and outputs it.

In the level shift circuit in FIG. 10B, another pMOS transistor may be disposed between the drain of the pMOS transistor 1025 and the node N2, where the gate of this pMOS transistor is connected to the output terminal of the inverter 1030, just like the pMOS transistor 1014 of the level shift circuit in FIG. 10A. Additionally, another pMOS transistor may be disposed between the pMOS transistor 1021 and the power supply line, where the gate of this pMOS transistor is connected to the output terminal of the inverter 1029, just like the pMOS transistor 1016. Even if these transistors are added, operation of the level shift circuit is almost the same as operation of the circuit in FIG. 10A (described later). However, the level shift circuit shown in FIG. 10B requires less number of transistors than the circuit having these transistors.

In the level shift circuit in FIG. 10B as well, the power supply potential is 3 volts. The high level potential of the output signal OUT is 3 volts. And the high level potential of the input signal IN and the high level potential of the output of the inverter 1030 is 1.5 volts or 3 volts.

Initially operation of this level shift circuit when the high level potential of the input signal IN and the inverter 1030 is 1.5 volts will be described. In this case, the control signal L-SPEED is set to high level. By this, the pMOS transistor 1025 turns OFF, and the pMOS transistor 1026 turns ON.

When the input signal IN is at low level, the output of the inverter 1030 is at high level (1.5 volts). Therefore the nMOS transistor 1027 is OFF, and the nMOS transistor 1028 is ON. The pMOS transistor 1023 strongly turns ON, and the pMOS transistor 1024 weakly turns ON. Since the nMOS transistor 1028 is ON, the potential of the node N2 is at low level. By this, the pMOS transistor 1021 turns ON, so the potential of the node N1 is at high level. As a result, the pMOS transistor 1022 is OFF.

Then the input signal IN changes to high level (1.5 volts), which changes the output of the inverter 1030 to low level. By this, the nMOS transistor 1027 turns ON, the nMOS transistor 1028 turns OFF, the pMOS transistor 1023 weakly turns ON, and the pMOS transistor 1024 strongly turns ON. When the potential of the node N1 drops to lower level than the ON/OFF threshold level of the pMOS transistor 1022, the pMOS transistor 1022 turns ON. By this, the potential of the node N2 rises to high level (3 volts). Since the pMOS transistor 1025 is OFF, this has no influence on the general operation of the level shift circuit.

Then the input signal IN changes to low level, which changes the output of the inverter 1030 to high level. Therefore the nMOS transistor 1027 turns OFF, the nMOS transistor 1028 turns ON, the pMOS transistor 1023 strongly turns ON, and the pMOS transistor 1024 weakly turns ON. Then the potential of the node N2 drops to lower level than the ON/OFF threshold level of the pMOS transistor 1021. By this, the pMOS transistor 1021 turns ON. Therefore the potential of the node N1 becomes high level, and the pMOS transistor 1022 turns OFF. As a result, the potential of the node N2 drops to low level.

When the control signal L-SPEED is set to high level in this way, the speed of the rise operation of the output signal OUT is not increased, since the pMOS transistor 1025 is not in use. However, the level shift circuit can operate normally even if the level shift amount is high.

Now operation of this level shift circuit when the high level potential of the input signal IN and the inverter 1030 is 3 volts will be described. In this case, the control signal L-SPEED is set to low level, so the pMOS transistor 1025 turns ON, and the pMOS transistor 1026 turns OFF.

When the input signal IN is at low level, the output of the inverter 1030 becomes high level (3 volts). Therefore the nMOS transistor 1028 is ON, and the pMOS transistor 1024 is OFF. This means that the potential of the node N2 is at low level. Since the nMOS transistor 1027 is OFF and the pMOS transistor 1026 is OFF, the potential of the node N1 is undefined. As a result, the ON/OFF of the pMOS transistor 1022 is also undefined.

Then the input signal IN changes to high level (3 volts), which changes the output of the inverter 1030 to low level. Therefore the nMOS transistor 1027 turns ON, the nMOS transistor 1028 turns OFF, the pMOS transistor 1024 strongly turns ON, and the pMOS transistor 1025 turns ON. Since the nMOS transistor 1028 turns OFF and the pMOS transistor 1025 turns ON, the potential of the node N2 becomes high level. Also the nMOS transistor 1027 turns ON, so the node N1 becomes low level. Therefore the pMOS transistor 1022 turns ON. According to the present embodiment, the pMOS transistor 1024 turns ON as soon as the nMOS transistor 1028 turns OFF, so the potential of the node N2 changes to high level at high-speed.

Then the input signal IN changes to low level, which changes the output of the inverter 1030 to high level. Therefore the nMOS transistor 1027 turns OFF, the nMOS transistor 1028 turns ON, the pMOS transistor 1024 turns OFF. Since the nMOS transistor 1028 turns ON and the pMOS transistor 1024 turns OFF, the potential of the node N2 becomes low level. Also the node N1 is maintained at low level even if the nMOS transistor 1027 turns OFF, because the pMOS transistor 1026 is in OFF state. So the pMOS transistor 1022 remains OFF. According to the embodiment, the pMOS transistor 1024 turns OFF as soon as the nMOS transistor 1028 turns ON, so the potential of the node N2 changes to low level at high-speed.

When the control signal L-SPEED is set to low level in this way, the level shift amount cannot be increased very much, but the speed of the rise operation and the fall operation of the output signal OUT can be increased.

Eleventh Embodiment

Figure 11A:
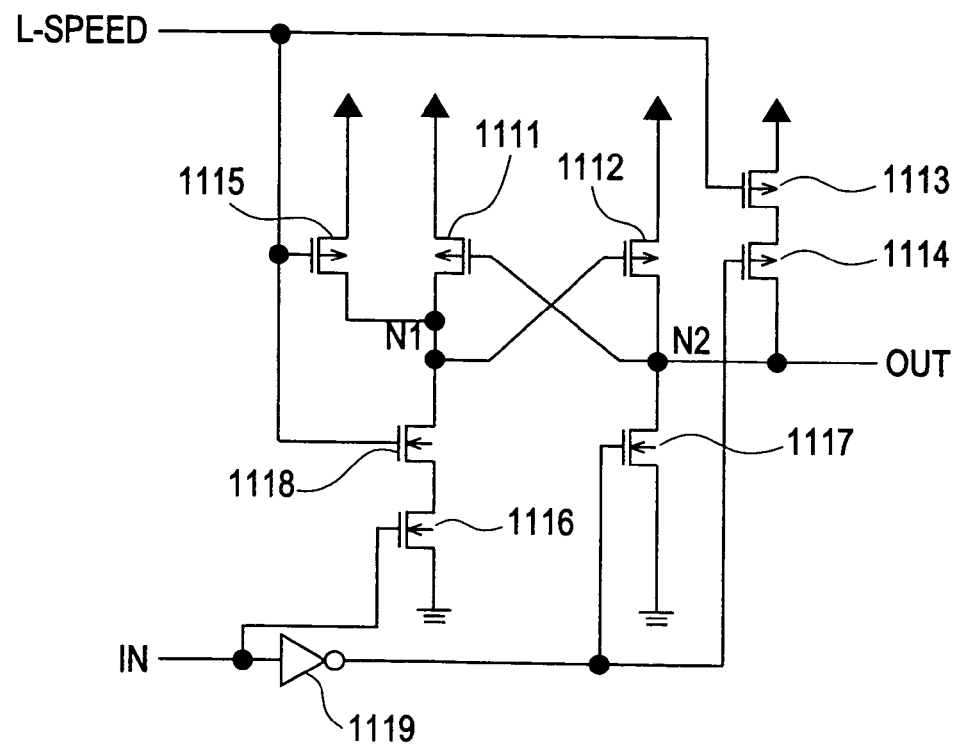
FIG. 11A and FIG. 11B are circuit diagrams depicting the configuration of the level shift circuit according to the eleventh embodiment.

FIG. 11A is a circuit diagram depicting key components of the level shift circuit in accordance with the present embodiment. As shown in FIG. 11A, this level shift circuit is comprised of the pMOS transistors 1111–1115, the nMOS transistors 1116 and 1117, and the inverter 1119.

In the pMOS transistor 1111, the source is connected to the power supply line, the drain is connected to the node N1, and the gate is connected to the node N2.

In the pMOS transistor 1112, the source is connected to the power supply line, the drain is connected to the node N2, and the gate is connected to the node N1.

In the pMOS transistor 1113, the source is connected to the power supply line, and the control signal L-SPEED is input from the gate.

In the pMOS transistor 1114, the source is connected to the drain of the pMOS transistor 1113, and drain is connected to the node N2, and the gate is connected to the output terminal of the inverter 1119.

In the pMOS transistor 1115, the source is connected to the power supply line, the drain is connected to the node N1, and the control signal L-SPEED is input from the gate.

In the nMOS transistor 1116, the source is connected to the ground line, and the input signal IN is input from the gate.

In the nMOS transistor 1117, the source is connected to the ground line, the drain is connected to the node N2, and the gate is connected to the output terminal of the inverter 1119.

In the nMOS transistor 1118, the source is connected to the drain of the nMOS transistor 1116, the drain is connected to the node N1, and the control signal L-SPEED is input from the gate.

The inverter 1119 inputs the input signal IN from the input terminal, inverts this input signal IN, and outputs it.

According to the present embodiment, the power supply voltage is 3 volts. Therefore the high level potential of the output signal OUT, that is, the high level potential of the node N2, is 3 volts. The high level potential of the input signal IN and the high level potential of the output of the inverter 1119 is 1.5 volts or 3 volts.

Operation of the level shift circuit shown in FIG. 11A will now be described.

Initially operation of the level shift circuit when the high level potential of the input signal IN and the inverter 1119 is 1.5 volts will be described. In this case, the control signal L-SPEED is set to high level (3 volts). By this, the pMOS transistors 1113 and 1115 turn OFF, and the nMOS transistor 1118 turns ON.

When the input signal IN is at low level, the output of the inverter 1119 is maintained at high level (1.5 volts). Therefore the nMOS transistor 1116 is OFF, and the nMOS transistor 1117 is ON. Since the nMOS transistor 1117 is ON, the potential of the node N2 is maintained at low level. This means that the pMOS transistor 1111 is ON, and the potential of the node N1 is at high level. Therefore the pMOS transistor 1112 is OFF. Since the nMOS transistor 1113 is OFF, the ON/OFF of the nMOS transistor 1114 has no influence on the general operation of the level shift circuit.

Then the input signal IN changes to high level (1.5 volts), which changes the output of the inverter 1119 to low level. Therefore the nMOS transistor 1116 turns ON, and the nMOS transistor 1117 turns OFF. At this time, the potential of the node N2 is maintained at zero volts. This means that the pMOS transistor 1111 is maintained in the ON state. Then the potential of the node N1 drops to lower level than the ON/OFF threshold level of the pMOS transistor 1112. Therefore the pMOS transistor 1112 turns ON, and the potential of the node N2 rises to high level (3 volts). By this, the pMOS transistor 1111 turns OFF, and the potential of the node N1 drops to low level.

Then the input signal IN changes to low level, which changes the output of the inverter 1119 to high level. Therefore the nMOS transistor 1116 turns OFF, and the nMOS transistor 1117 turns ON. At this time, the potential of the node N1 is maintained at low level, and the pMOS transistor 1112 is maintained in the ON state. Then the potential of the node N2 drops to lower level than the ON/OFF threshold level of the pMOS transistor 1111. By this, the pMOS transistor 1111 turns ON. Then the potential of the node N1 becomes high level, and the pMOS transistor 1112 turns OFF. As a result, the potential of the node N2 drops to low level.

When the control signal L-SPEED is set to high level in this way, the speed of the operation of the output signal OUT is not increased, since the pMOS transistors 1113, 1114 and 1115 are not in use. However, the level shift circuit can operate normally even if the level shift amount is high.

Now operation of this level shift circuit when the high level potential of the input signal IN and the inverter 1119 is 3 volts will be described. In this case, the control signal L-SPEED is set to low level, so the nMOS transistors 1113 and 1115 turn ON, and the pMOS transistor 1118 turns OFF.

In this level shift circuit, the output of the inverter 1119 is maintained at high level (3 volts) when the input signal IN is at low level. Therefore the nMOS transistor 1117 is ON, and the pMOS transistor 1114 is OFF. So the potential of the node N2 is maintained at low level. Since the pMOS transistor 1118 is OFF, the ON/OFF of the nMOS transistor 1116 has no influence on the general operation of the level shift circuit. Also the pMOS transistor 1115 is fixed to the ON state, so the potential of the node N1 is fixed to high level. As a result, the pMOS transistor 1112 is fixed to the OFF state.

Then the input signal IN changes to high level (3 volts), which changes the output of the inverter 1119 to low level. Since the pMOS transistor 1114 turns ON and the nMOS transistor 1117 turns OFF, the potential of the node N2 becomes high level. In other words, according to the present embodiment, the pMOS transistor 1114 turns ON as soon as the nMOS transistor 1117 turns OFF, so the potential of the node N2 changes to high level at high-speed.

Then the input signal IN changes to low level, which changes the output of the inverter 1119 to high level. Therefore the pMOS transistor 1114 turns OFF, and the nMOS transistor 1117 turns ON. By this, the potential of the node N2 becomes low level. In other words, according to the present embodiment, the nMOS transistor 1117 turns ON as soon as the pMOS transistor 1114 turns OFF, so the potential of the node N2 changes to low level at high-speed.

When the control signal L-SPEED is set to low level in this way, the level shift amount cannot be increased very much, but the speed of the rise operation and the fall operation of the node N2 can be increased.

Now a variant form of the level shift circuit in accordance with the present embodiment will be described with reference to FIG. 11B.

Figure 11B:
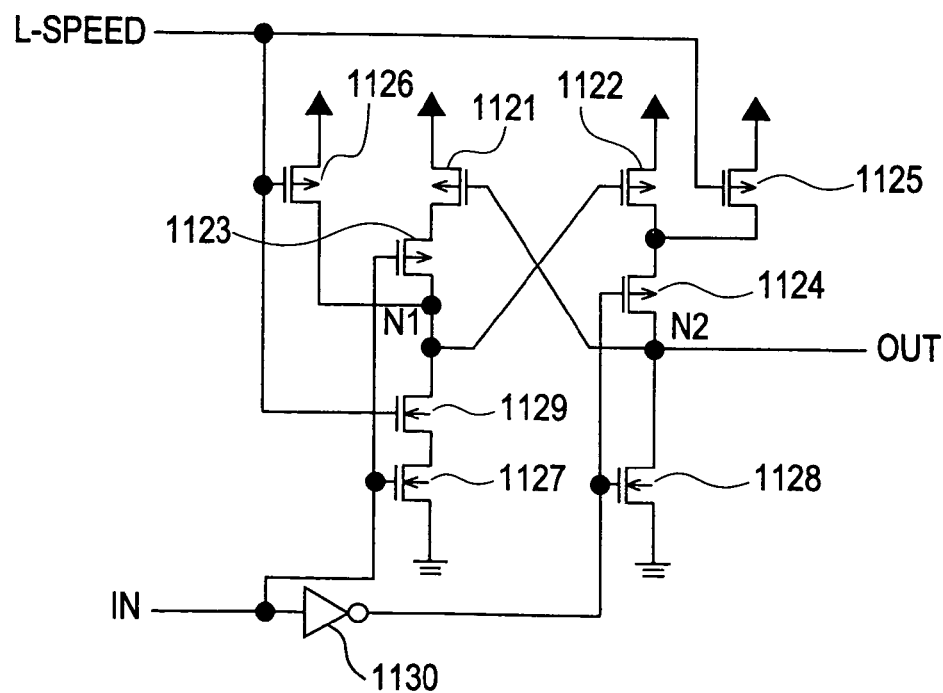

The level shift circuit in FIG. 11B is comprised of the pMOS transistors 1121–1126, the nMOS transistors 1127–1129, and the inverter 1130.

In the pMOS transistor 1121, the source is connected to the power supply line, and the gate is connected to the node N2.

In the pMOS transistor 1122, the source is connected to the power supply line, and the gate is connected to the node N1.

In the pMOS transistor 1123, the source is connected to the drain of the pMOS transistor 1121, the drain is connected to the node N1, and the input signal IN is input from the gate. The pMOS transistor 1123 strongly turns ON when the gate potential is zero volts, weakly turns ON when the gate potential is 1.5 volts, and turns OFF when the gate potential is 3 volts.

In the pMOS transistor 1124, the source is connected to the drain of the pMOS transistor 1122, the drain is connected to the node N2, and the gate is connected to the output terminal of the inverter 1130. This pMOS transistor 1124 strongly turns ON when the gate potential is zero volts, weakly turns ON when the gate potential is 1.5 volts, and turns OFF when the gate potential is 3 volts.

In the pMOS transistor 1125, the source is connected to the power supply line, the drain is connected to the source of the pMOS transistor 1124, and the control signal L-SPEED is input from the gate.

In the pMOS transistor 1126, the source is connected to the power supply line, the drain is connected to the node N1, and the control signal L-SPEED is input from the gate.

In the nMOS transistor 1127, the source is connected to the ground line, and the input signal IN is input from the gate.

In the nMOS transistor 1128, the source is connected to the ground line, the drain is connected to the node N2, and the gate is connected to the output terminal of the inverter 1130.

In the nMOS transistor 1129, the source is connected to the drain of the nMOS transistor 1127, the drain is connected to the node N1, and the control signal L-SPEED is input from the gate.

The inverter 1130 inputs the input signal IN from the input terminal, inverts this signal IN, and outputs it.

In the level shift circuit in FIG. 11B, another pMOS transistor may be disposed between the drain of the pMOS transistor 1125 and the node N2, where the gate of this pMOS transistor is connected to the output terminal of the inverter 1130, just like the level shift circuit in FIG. 11A. Even if such a transistor is added, the operation of the level shift circuit is almost the same as the operation of the circuit in FIG. 11A (described later). However, the level shift circuit shown in FIG. 11B requires less number of transistors than the circuit having these transistors.

In the level shift circuit in FIG. 11B as well, the power supply potential is 3 volts. The high level potential of the input signal IN and the high level potential of the output of the inverter 1130 is 1.5 volts or 3 volts.

Initially operation of this level shift circuit when the high level potential of the input signal IN and the inverter 1130 is 1.5 volts will be described. In this case, the control signal L-SPEED is set to high level. By this, the pMOS transistors 1125 and 1126 turn OFF, and the nMOS transistor 1129 turns ON.

When the input signal IN is at low level, the output of the inverter 1130 is at high level (1.5 volts). Therefore the nMOS transistor 1127 is OFF, and the nMOS transistor 1128 is ON. The pMOS transistor 1123 strongly turns ON, and the pMOS transistor 1124 weakly turns ON. Since the nMOS transistor 1128 is ON, the potential of the node N2 is at low level. By this, the pMOS transistor 1121 turns ON, so the potential of the node N1 is at high level. As a result, the pMOS transistor 1122 is OFF.

Then the input signal IN changes to high level (1.5 volts), which changes the output of the inverter 1130 to low level. By this, the nMOS transistor 1127 turns ON, the nMOS transistor 1128 turns OFF, the pMOS transistor 1123 weakly turns ON, and the pMOS transistor 1124 strongly turns ON. When the potential of the node N1 drops to lower level than the ON/OFF threshold level of the pMOS transistor 1122, the pMOS transistor 1122 turns ON. By this, the potential of the node N2 rises to high level (3 volts).

Then the input signal IN changes to low level, which changes the output of the inverter 1130 to high level. Therefore the nMOS transistor 1127 turns OFF, the nMOS transistor 1128 turns ON, the pMOS transistor 1123 strongly turns ON, and the pMOS transistor 1124 weakly turns ON. Then the potential of the node N2 drops to lower level than the ON/OFF threshold level of the pMOS transistor 1121. By this, the pMOS transistor 1121 turns ON. Therefore the potential of the node N1 becomes high level, and the pMOS transistor 1122 turns OFF. As a result, the potential of the node N2 drops to low level.

When the control signal L-SPEED is set to high level in this way, the speed of the rise operation of the output signal OUT is not increased, since the pMOS transistor 1125 is not in use. However, the level shift circuit can operate normally even if the level shift amount is high.

Now operation of this level shift circuit when the high level potential of the input signal IN and the inverter 1127 is 3 volts will be described. In this case, the control signal L-SPEED is set to low level, so the pMOS transistors 1125 and 1126 turn ON, and the pMOS transistor 1129 turns OFF.

When the input signal IN is at low level, the output of the inverter 1130 becomes high level (3 volts). Therefore the nMOS transistor 1128 is ON, and the pMOS transistor 1124 is OFF. This means that the potential of the node N2 is at low level. Since the nMOS transistor 1129 is OFF, the ON/OFF of the nMOS transistor 1127 has no influence on the general operation of the level shift circuit. Also the pMOS transistor 1126 is fixed to the ON state, so the potential of the node N1 is fixed to high level, and the pMOS transistor 1122 is fixed to the OFF state. As a result, the ON/OFF of the pMOS transistors 1121 and 1123 have no influence on the general operation of the level shift circuit.

Then the input signal IN changes to high level, which changes the output of the inverter 1130 to low level. Therefore the nMOS transistor 1128 turns OFF, and the pMOS transistor 1124 strongly turns ON. By this, the potential of the node N2 becomes high level. According to the present embodiment, the pMOS transistor 1124 turns ON as soon as the nMOS transistor 1128 turns OFF, so the potential of the node N2 changes to high level at high-speed.

Then the input signal IN changes to low level, which changes the output of the inverter 1130 to high level. Therefore the nMOS transistor 1128 turns ON, and the pMOS transistor 1124 turns OFF. By this, the potential of the node N2 becomes low level. According to the present invention, the pMOS transistor 1124 turns OFF as soon as the nMOS transistor 1128 turns ON, so the potential of the node N2 changes to low level at high-speed.

When the control signal L-SPEED is set to low level in this way, the level shift amount cannot be increased very much, but the speed of the rise operation and the fall operation of the output signal OUT can be increased.

As described above, according to the present invention, the ratio between the inflow current and the emission current of the first node or the second node can be switched by the control signal. As a result, operation speed can be increased by setting this ratio high, and the voltage shift amount can be increased by setting this ratio low.

What is claimed is:

1. A level shift circuit comprising:
   a first transistor circuit which electrically connects a first node to a first power supply line when a second node is at a second power supply potential, and which does not electrically connect said first node to said first power supply line when said second node is at a first power supply potential;
   a second transistor circuit which electrically connects said second node to said first power supply line when said first node is at said second power supply potential, and which does not electrically connect said second node to said first power supply line when said first node is at said first power supply potential;

a third transistor circuit which electrically connects said first node to a second power supply line when an input signal is at a first input potential, and which does not electrically connect said first node to said second power supply line when said input signal is at a second input potential;

a fourth transistor circuit which electrically connects said second node to said second power supply line when said input signal is at a second input potential, and which does not electrically connect said second node to said second power supply line when said input signal is at said first input potential; and a fifth transistor circuit which switches a value of an inflow current or emission current of said second node or said first node according to a control signal, when said second node or said first node is electrically connected to both of said first power supply line and said second power supply line, wherein said first transistor circuit comprises a first conductive type first transistor one end of which is connected to said first power supply line and a control terminal of which is connected to said second node, and a first conductive type second transistor one end of which is connected to an other end of said first transistor, an other end of which is connected to said first node, and a control terminal of which has said input signal provided thereto, said second transistor circuit comprises a first conductive type third transistor one end of which is connected to said first power supply line and a control terminal of which is connected to said first node, and a first conductive type fourth transistor one end of which is connected to an other end of said third transistor, an other end of which is connected to said second node, and a control terminal of which has an inverted value of said input signal provided thereto, said third transistor circuit comprises a second conductive type fifth transistor one end of which is connected to said second power supply line, an other end of which is connected to said first node, and a control terminal of which has said input signal provided thereto, and said fourth transistor circuit comprises a second conductive type sixth transistor one end of which is connected to said second power supply line, an other end of which is connected to said second node, and a control terminal of which has the inverted value of said input signal provided thereto, wherein said fifth transistor circuit comprises a second conductive type seventh transistor one end of which is connected to said second power supply line and a control terminal of which has said control signal provided thereto, and a second conductive type eighth transistor one end of which is connected to an other end of said seventh transistor, an other end of which is connected to said second node, and a control terminal of which has an inverted value of said input signal provided thereto.

* * * * *